(12) United States Patent
Yu et al.

(10) Patent No.: US 12,087,757 B2
(45) Date of Patent: Sep. 10, 2024

(54) INTEGRATED CIRCUIT PACKAGES

(71) Applicant: Taiwan Semiconductor Manufacturing Co., Ltd., Hsinchu (TW)

(72) Inventors: Chen-Hua Yu, Hsinchu (TW); Chung-Hao Tsai, Huatan Township (TW); Chuei-Tang Wang, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/344,456

(22) Filed: Jun. 29, 2023

(65) Prior Publication Data

US 2023/0352471 A1 Nov. 2, 2023

Related U.S. Application Data

(60) Continuation of application No. 17/818,496, filed on Aug. 9, 2022, now Pat. No. 11,735,576, which is a
(Continued)

(51) Int. Cl.
*H01L 25/04* (2023.01)
*H01L 21/66* (2006.01)
(Continued)

(52) U.S. Cl.
CPC ............. *H01L 25/50* (2013.01); *H01L 22/14* (2013.01); *H01L 23/3192* (2013.01); *H01L 23/49816* (2013.01); *H01L 23/5385* (2013.01); *H01L 24/06* (2013.01); *H01L 24/08* (2013.01); *H01L 24/11* (2013.01); *H01L 24/16* (2013.01); *H01L 24/32* (2013.01); *H01L 24/73* (2013.01); *H01L 24/81* (2013.01); *H01L 25/0652* (2013.01); *H01L 25/18* (2013.01); *H01L 2224/06181* (2013.01); *H01L 2224/08146* (2013.01);
(Continued)

(58) Field of Classification Search
CPC ..... H01L 25/50; H01L 22/14; H01L 23/3192; H01L 25/043
See application file for complete search history.

(56) References Cited

U.S. PATENT DOCUMENTS 6,074,893 A * 6/2000 Nakata ................... H05K 3/207
29/877
8,993,380 B2 3/2015 Hou et al.
(Continued)

FOREIGN PATENT DOCUMENTS

DE 102018116729 B3 8/2019

*Primary Examiner* — Errol V Fernandes
(74) *Attorney, Agent, or Firm* — Slater Matsil, LLP

(57) ABSTRACT

In an embodiment, a method includes: bonding a back side of a first memory device to a front side of a second memory device with dielectric-to-dielectric bonds and with metal-to-metal bonds; after the bonding, forming first conductive bumps through a first dielectric layer at a front side of the first memory device, the first conductive bumps raised from a major surface of the first dielectric layer; testing the first memory device and the second memory device using the first conductive bumps; and after the testing, attaching a logic device to the first conductive bumps with reflowable connectors.

20 Claims, 48 Drawing Sheets

Related U.S. Application Data division of application No. 17/175,081, filed on Feb. 12, 2021, now Pat. No. 11,728,327.

(51) Int. Cl.
*H01L 23/00* (2006.01)
*H01L 23/31* (2006.01)
*H01L 23/498* (2006.01)
*H01L 23/538* (2006.01)
*H01L 25/00* (2006.01)
*H01L 25/065* (2023.01)
*H01L 25/18* (2023.01)

(52) U.S. Cl.
CPC ............... *H01L 2224/16146* (2013.01); *H01L 2224/16227* (2013.01); *H01L 2224/32013* (2013.01); *H01L 2224/32145* (2013.01); *H01L 2224/32225* (2013.01); *H01L 2224/73204* (2013.01); *H01L 2224/80001* (2013.01); *H01L 2224/81815* (2013.01); *H01L 2225/06513* (2013.01); *H01L 2225/06517* (2013.01); *H01L 2225/06541* (2013.01); *H01L 2225/06565* (2013.01); *H01L 2225/06568* (2013.01); *H01L 2924/1431* (2013.01); *H01L 2924/1434* (2013.01); *H01L 2924/182* (2013.01); *H01L 2924/35* (2013.01)

(56) References Cited

U.S. PATENT DOCUMENTS

| | | |
|---|---|---|
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 10,672,674 B2 | 6/2020 | Yu et al. |
| 2006/0012037 A1 | 1/2006 | Raedt et al. |
| 2010/0171208 A1 | 7/2010 | Fujii |
| 2011/0121811 A1 | 5/2011 | Dennard et al. |
| 2012/0135565 A1 | 5/2012 | Yamato |
| 2014/0203429 A1 | 7/2014 | Yu et al. |
| 2016/0013172 A1* | 1/2016 | Lin ........................ H01L 25/50 438/108 |
| 2018/0158749 A1* | 6/2018 | Yu ........................... H01L 24/94 |
| 2019/0035767 A1* | 1/2019 | Yu ........................... H01L 21/56 |
| 2019/0245543 A1 | 8/2019 | Lee et al. |
| 2020/0279861 A1 | 9/2020 | Uryu et al. |
| 2021/0159178 A1* | 5/2021 | Nam ...................... H01L 24/14 |

\* cited by examiner

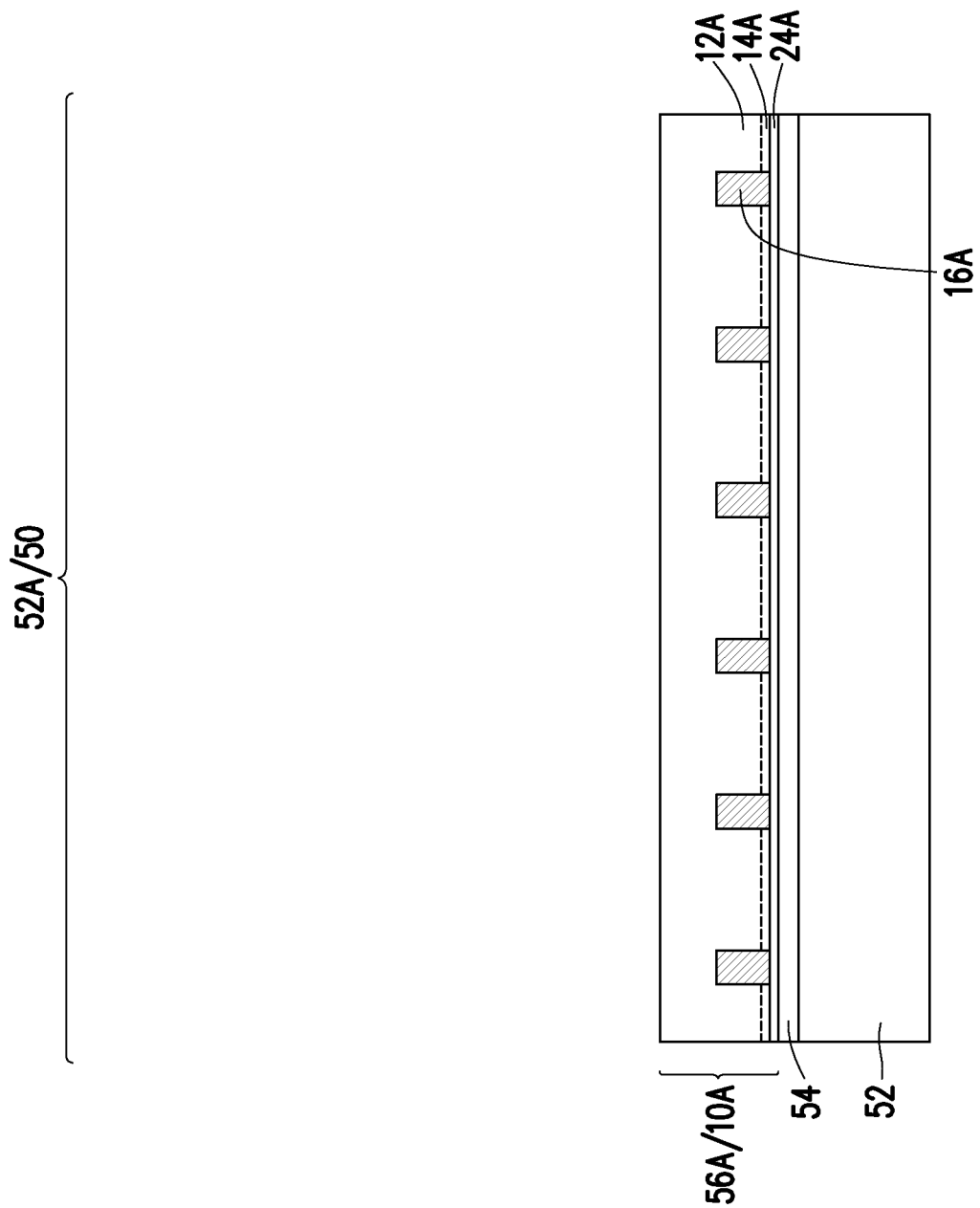

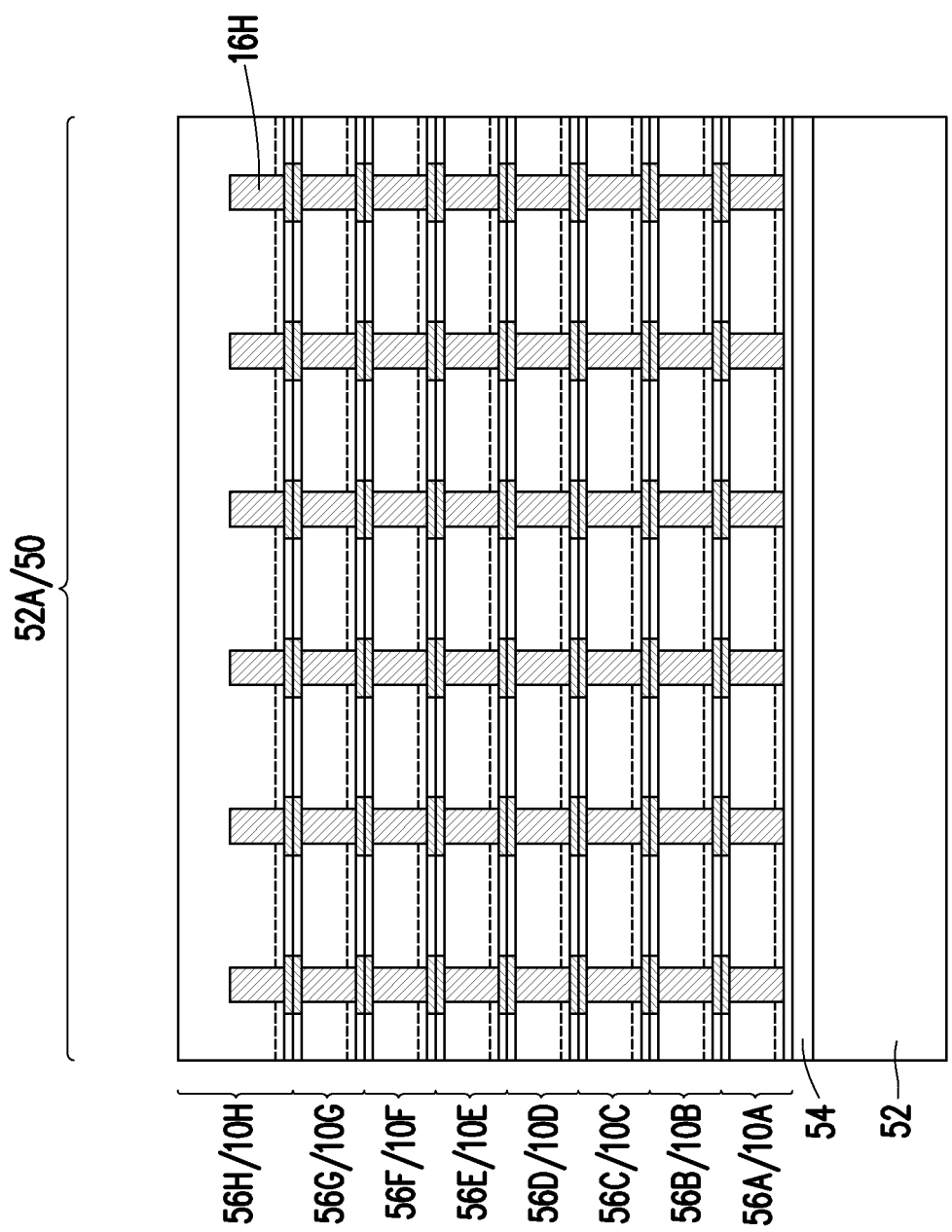

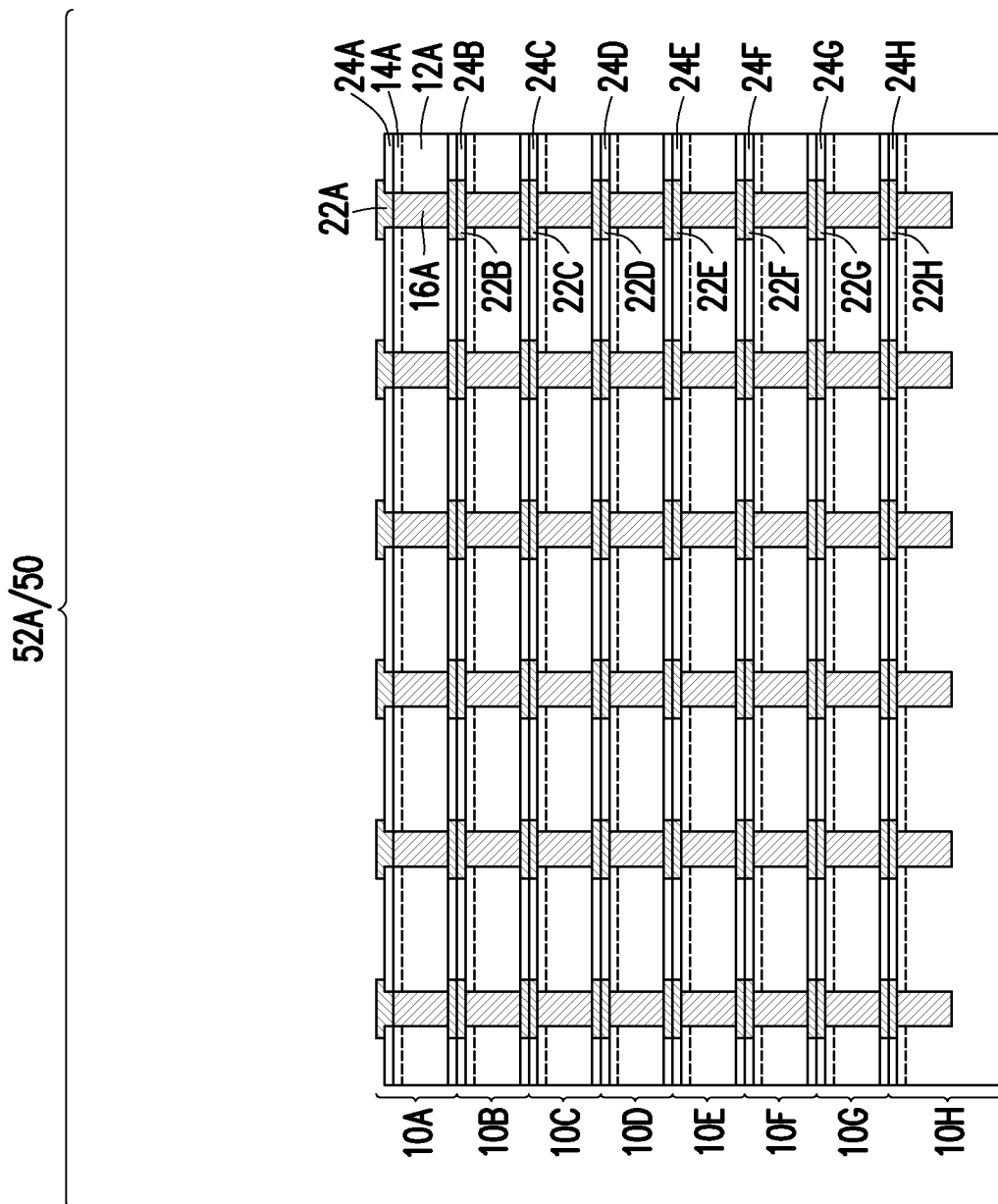

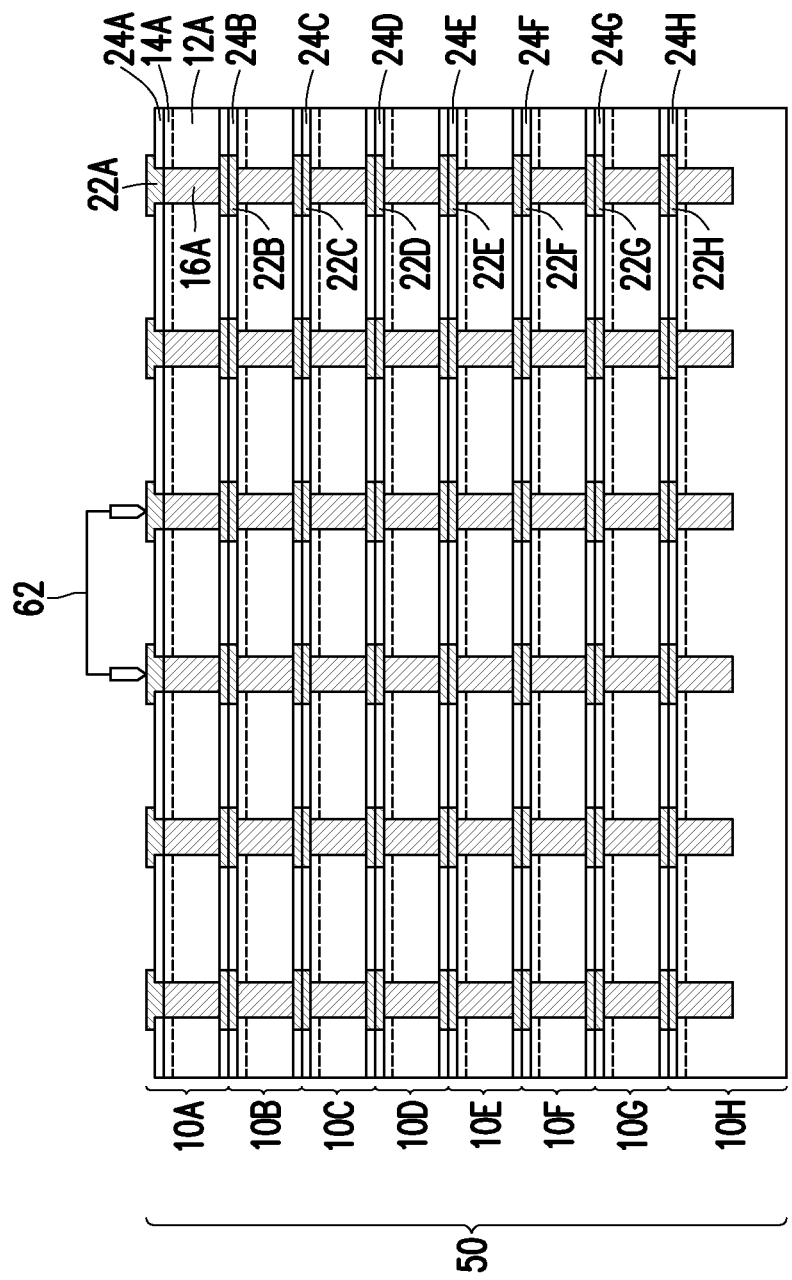

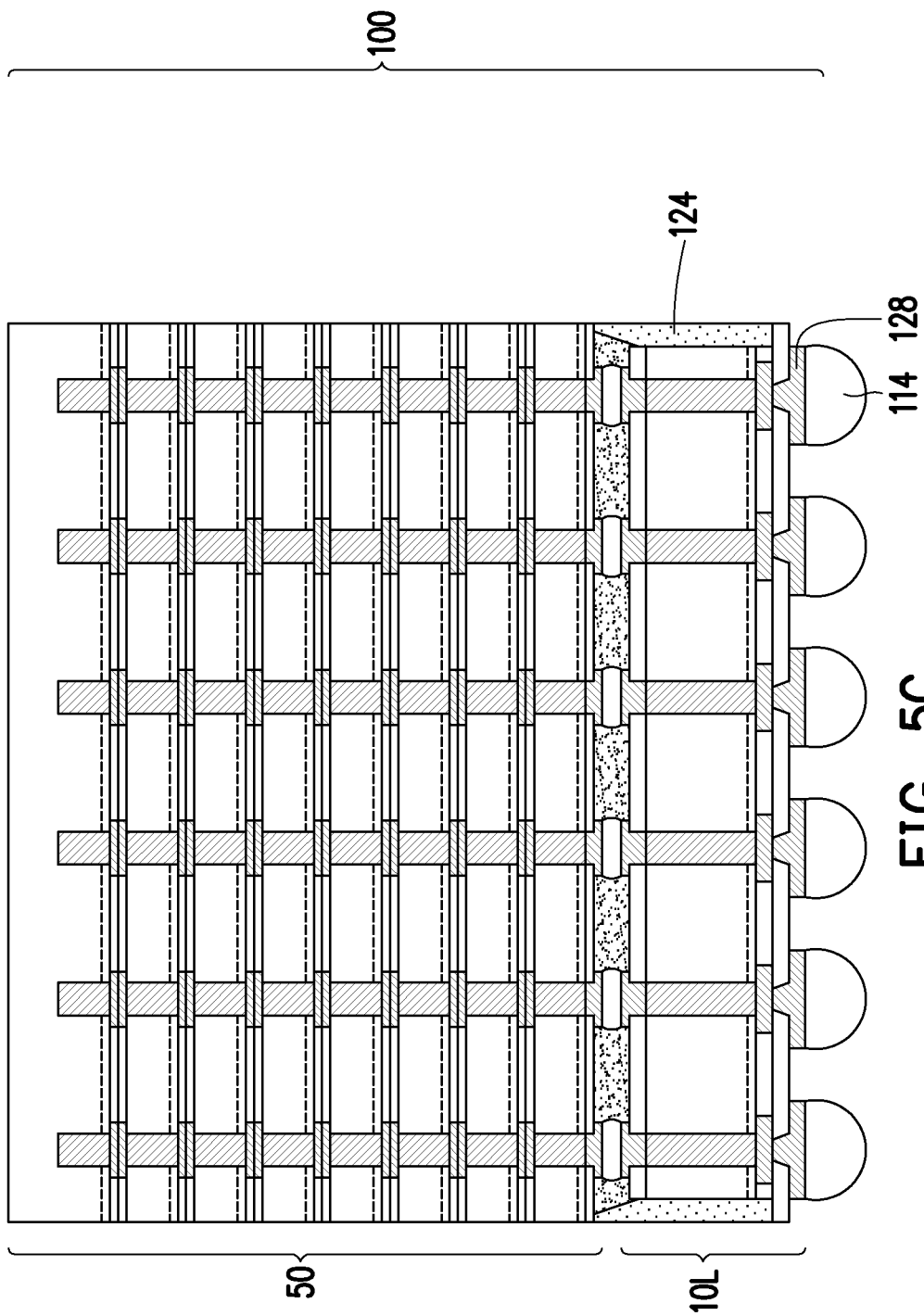

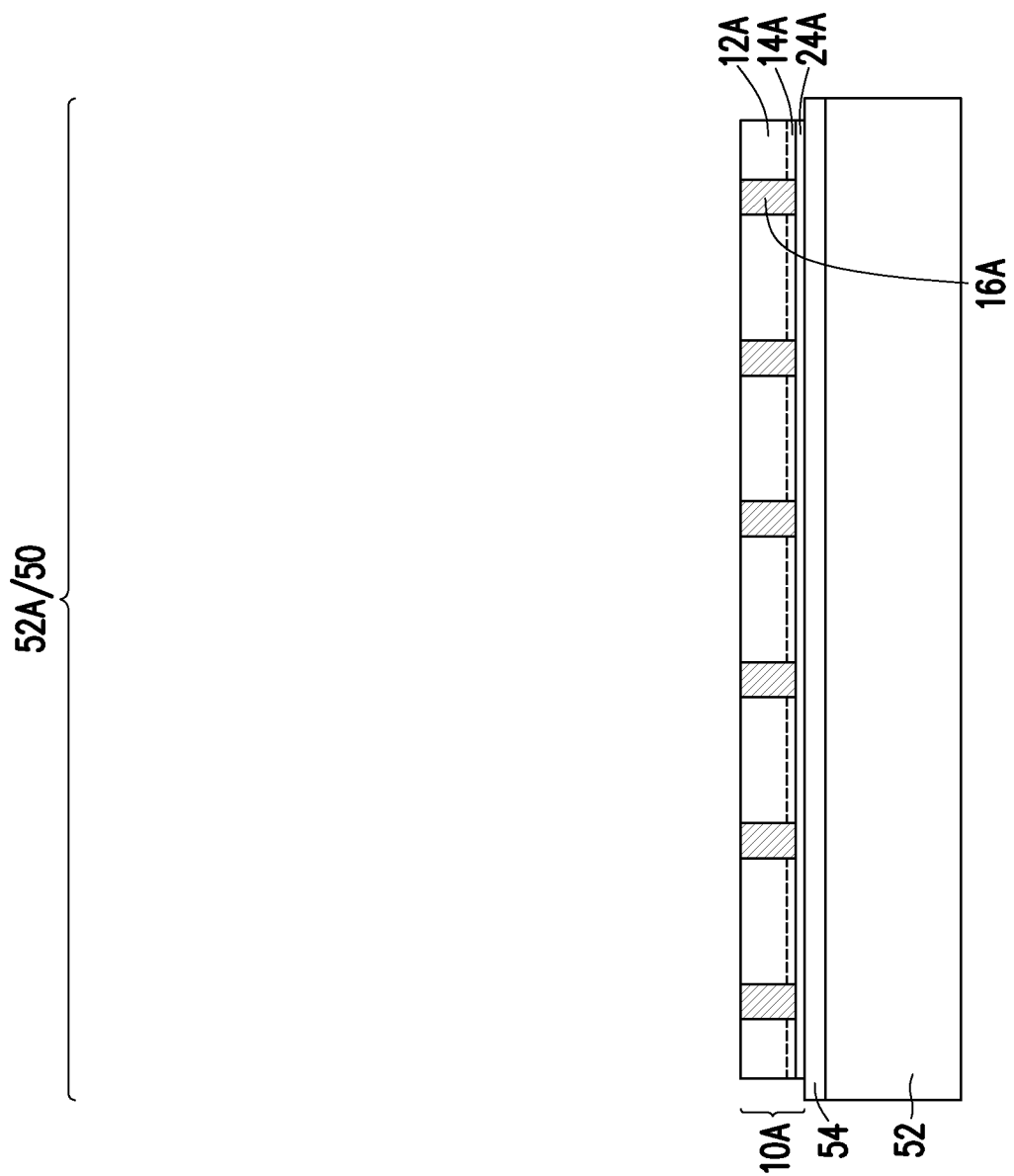

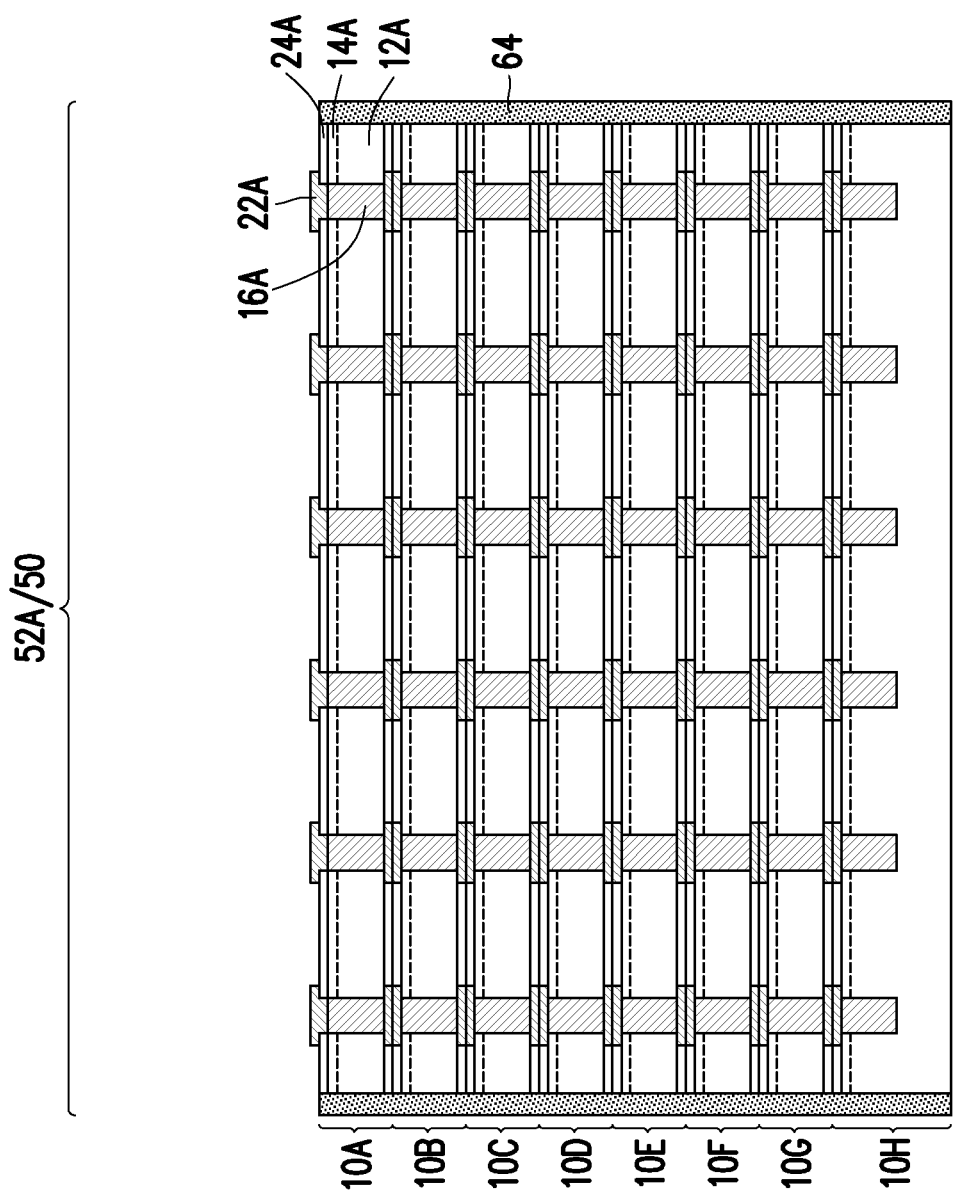

INTEGRATED CIRCUIT PACKAGES

PRIORITY CLAIM AND CROSS-REFERENCE

This application is a continuation of U.S. patent application Ser. No. 17/818,496, filed on Aug. 9, 2022, entitled "Integrated Circuit Package and Method," which is a divisional of U.S. patent application Ser. No. 17/175,081, filed on Feb. 12, 2021, entitled "Integrated Circuit Package and Method," which applications are hereby incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional package that includes multiple chips. Other packages have also been developed to incorporate three-dimensional aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A through 2F are cross-sectional views of intermediate steps during a process for forming a memory cube, in accordance with some embodiments.

FIGS. 5A through 5C are cross-sectional views of intermediate steps during a process for forming a HBM device, in accordance with some other embodiments.

FIGS. 6A through 6F are cross-sectional views of intermediate steps during a process for forming a memory cube, in accordance with some other embodiments.

DETAILED DESCRIPTION

Figure 1:
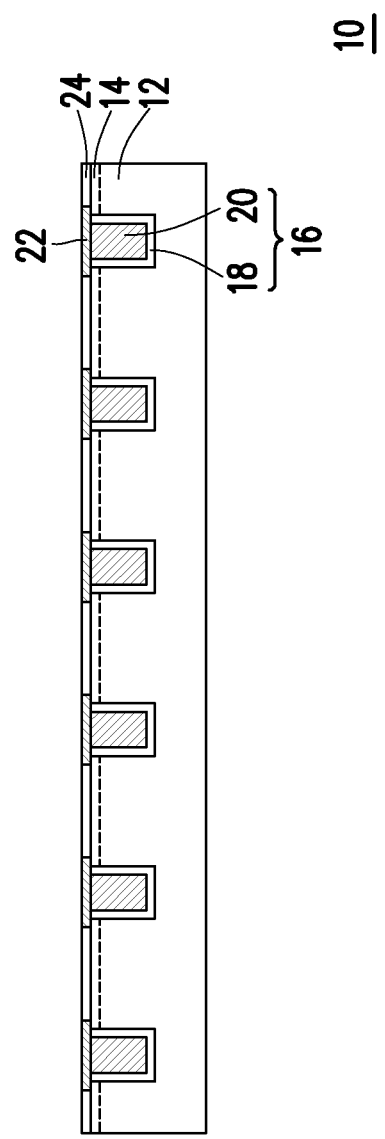
FIG. 1 is a cross-sectional view of an integrated circuit device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory cube is formed by stacking a plurality of memory devices with hybrid bonding. Die connectors, such as conductive bumps, are formed in the top memory device of the memory cube after the hybrid bonding. The memory cube is tested using the die connectors, such that only known good memory cubes are used for further processing. The die connectors may then be used to attach the memory cube to a logic device with reflowable connectors. Processing of known bad memory cubes may thus be avoided, reducing manufacturing costs of the devices.

FIG. 1 is a cross-sectional view of an integrated circuit device 10, in accordance with some embodiments. The integrated circuit device 10 may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or a combination thereof. The integrated circuit device 10 is formed in a wafer (not shown), which includes different device regions. In some embodiments, multiple wafers will be stacked to form a wafer stack, which is singulated in subsequent processing to form multiple die stacks. In some embodiments, a wafer is singulated to form a plurality of integrated circuit devices to, which are stacked in subsequent processing to form multiple die stacks. The integrated circuit device 10 may be processed according to applicable manufacturing processes to form integrated circuits. For example, the integrated circuit device 10 may include a semiconductor substrate 12, an interconnect structure 14, conductive vias 16, die connectors 22, and a dielectric layer 24.

The semiconductor substrate 12 may be silicon, doped or undoped, or an active layer of a semiconductor-on-insulator (SOI) substrate. The semiconductor substrate 12 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 12 has an active surface (e.g., the surface facing upwards in FIG. 1), sometimes called a front side, and an inactive surface (e.g., the surface facing downwards in FIG. 1), sometimes called a back side.

Devices may be formed at the active surface of the semiconductor substrate 12. The devices may be active devices (e.g., transistors, diodes, etc.), capacitors, resistors, etc. The inactive surface may be free from devices. An inter-layer dielectric (ILD) is over the active surface of the semiconductor substrate 12. The ILD surrounds and may cover the devices. The ILD may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

The interconnect structure 14 is over the active surface of the semiconductor substrate 12. The interconnect structure 14 interconnects the devices at the active surface of the semiconductor substrate 12 to form an integrated circuit. The interconnect structure 14 may be formed by, for example, metallization patterns in dielectric layers. The metallization patterns include metal lines and vias formed in one or more dielectric layers. The metallization patterns of the interconnect structure 14 are electrically coupled to the devices at the active surface of the semiconductor substrate 12.

The conductive vias 16 are formed extending into the interconnect structure 14 and/or the semiconductor substrate 12. The conductive vias 16 are electrically coupled to metallization patterns of the interconnect structure 14. As an example to form the conductive vias 16, recesses can be formed in the interconnect structure 14 and/or the semiconductor substrate 12 by, for example, etching, milling, laser techniques, a combination thereof, and/or the like. A thin dielectric material may be formed in the recesses, such as by using an oxidation technique. A barrier layer 18 may be conformally deposited in the openings, such as by CVD, atomic layer deposition (ALD), physical vapor deposition (PVD), thermal oxidation, a combination thereof, and/or the like. The barrier layer 18 may be formed from an oxide, a nitride, or an oxynitride, such as titanium nitride, titanium oxynitride, tantalum nitride, tantalum oxynitride, tungsten nitride, a combination thereof, and/or the like. A conductive material 20 may be deposited over the barrier layer 18 and in the openings. The conductive material 20 may be formed by an electro-chemical plating process, CVD, PVD, a combination thereof, and/or the like. Examples of conductive materials are copper, tungsten, aluminum, silver, gold, a combination thereof, and/or the like. Excess of the conductive material 20 and the barrier layer 18 is removed from the surface of the interconnect structure 14 and/or the semiconductor substrate 12 by, for example, a chemical-mechanical polish (CMP). Remaining portions of the barrier layer 18 and the conductive material 20 form the conductive vias 16.

In the embodiment illustrated, the conductive vias 16 are not yet exposed at the back side of the integrated circuit device 10. Rather, the conductive vias 16 are buried in the semiconductor substrate 12. As will be discussed in greater detail below, the conductive vias 16 will be exposed at the back side of the integrated circuit device 10 in subsequent processing. After exposure, the conductive vias 16 can be referred to as through-silicon vias or through-substrate vias (TSVs).

The die connectors 22 are at a front side of the integrated circuit device 10. The die connectors 22 may be conductive pillars, pads, or the like, to which external connections are made. The die connectors 22 are in and/or on the interconnect structure 14. The die connectors 22 can be formed of a metal, such as copper, aluminum, or the like, and can be formed by, for example, plating, or the like.

The dielectric layer 24 is at the front side of the integrated circuit device 10. The dielectric layer 24 is in and/or on the interconnect structure 14. The dielectric layer 24 laterally encapsulates the die connectors 22, and the dielectric layer 24 is laterally coterminous (within process variations) with sidewalls of the integrated circuit device 10. The dielectric layer 24 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 24 may be formed, for example, by spin coating, lamination, chemical vapor deposition (CVD), or the like. In some embodiments, the dielectric layer 24 is formed after the die connectors 22, and may bury the die connectors 22 such that the top surface of the dielectric layer 24 is above the top surfaces of the die connectors 22. In some embodiments, the die connectors 22 are formed after the dielectric layer 24 is formed, such as by a damascene process, e.g., single damascene, dual damascene, or the like. After formation, the die connectors 22 and the dielectric layer 24 can be planarized using, e.g., a CMP process, an etch back process, the like, or combinations thereof. After planarization, the top surfaces of the die connectors 22 and dielectric layer 24 are coplanar (within process variations) and are exposed at the front side of the integrated circuit device 10. In another embodiment, the die connectors 22 are formed after the dielectric layer 24, such as by a plating process, and are raised connectors (e.g., microbumps) such that the top surfaces of the die connectors 22 extend above the top surface of the dielectric layer 24.

FIGS. 2A through 2F are cross-sectional views of intermediate steps during a process for forming a memory cube 50, in accordance with some embodiments. As will be discussed in greater detail below, FIGS. 2A through 2F illustrate a process in which a memory cube 50 is formed by stacking multiple wafers that include first integrated circuit devices on a carrier substrate 52. The first integrated circuit devices may each have a structure similar to the integrated circuit device 10 discussed above with reference to FIG. 1, and in an embodiment may be memory devices. Stacking of wafers to form a memory cube 50 in one device region 52A of the carrier substrate 52 is illustrated, but it should be appreciated that the carrier substrate 52 may have any number of device regions, and a memory cube 50 may be formed in each device region. The memory cube 50 is formed in a top-down (or reverse) manner by wafer-on-wafer (WoW) stacking, where a wafer for the top layer of the memory cube 50 is provided, and wafers for underlying layers of the memory cube 50 are subsequently stacked on the top wafer. The wafer stack is singulated to form multiple memory cubes 50. The memory cubes 50 are tested after formation to reduce or prevent subsequent processing of known bad memory cubes 50.

Subsequently, the memory cube 50 may be used in the formation of a high bandwidth memory (HBM) device. Specifically, as will be discussed in greater detail below, the memory cube 50 can be further stacked on a second integrated circuit device 10 form a HBM device. The second integrated circuit device may have a structure similar to the integrated circuit device 10 discussed above with reference to FIG. 1, and in an embodiment may be a logic device.

In FIG. 2A, a carrier substrate 52 is provided, and a release layer 54 is formed on the carrier substrate 52. The carrier substrate 52 may be a glass carrier substrate, a ceramic carrier substrate, or the like. The carrier substrate 52 may be a wafer, such that multiple memory cubes 50 can be formed on the carrier substrate 52 simultaneously.

The release layer 54 may be formed of a polymer-based material, which may be removed along with the carrier substrate 52 from the overlying structures that will be formed in subsequent steps. In some embodiments, the release layer 54 is an epoxy-based thermal-release material, which loses its adhesive property when heated, such as a light-to-heat-conversion (LTHC) release coating. In other embodiments, the release layer 54 may be an ultra-violet (UV) glue, which loses its adhesive property when exposed to UV lights. The release layer 54 may be dispensed as a liquid and cured, may be a laminate film laminated onto the carrier substrate 52, or may be the like. The top surface of the release layer 54 may be leveled and may have a high degree of planarity.

A wafer 56A is stacked on the carrier substrate 52. The wafer 56A comprises multiple integrated circuit devices, such as a memory device 10A in the device region 52A. The memory device 10A will be singulated in subsequent processing to be included in the memory cube 50. The memory device 10A includes a semiconductor substrate 12A, an interconnect structure 14A, conductive vias 16A, and a dielectric layer 24A, but does not include die connectors in the dielectric layer 24A at this step of processing. The wafer 56A is stacked face-down on the carrier substrate 52 so that a major surface of the dielectric layer 24A faces/contacts the carrier substrate 52. As will be discussed in greater detail below, the memory cube 50 is attached to another integrated circuit device after singulation. Reflowable connectors are used to attach the memory cube 50 to the other integrated circuit device. In some embodiments, die connectors suitable for use with reflowable connectors, such as microbumps, may be formed in the dielectric layer 24A. The microbumps are formed after wafer stacking is completed, to prevent damage to the microbumps during wafer stacking.

Figure 2B:
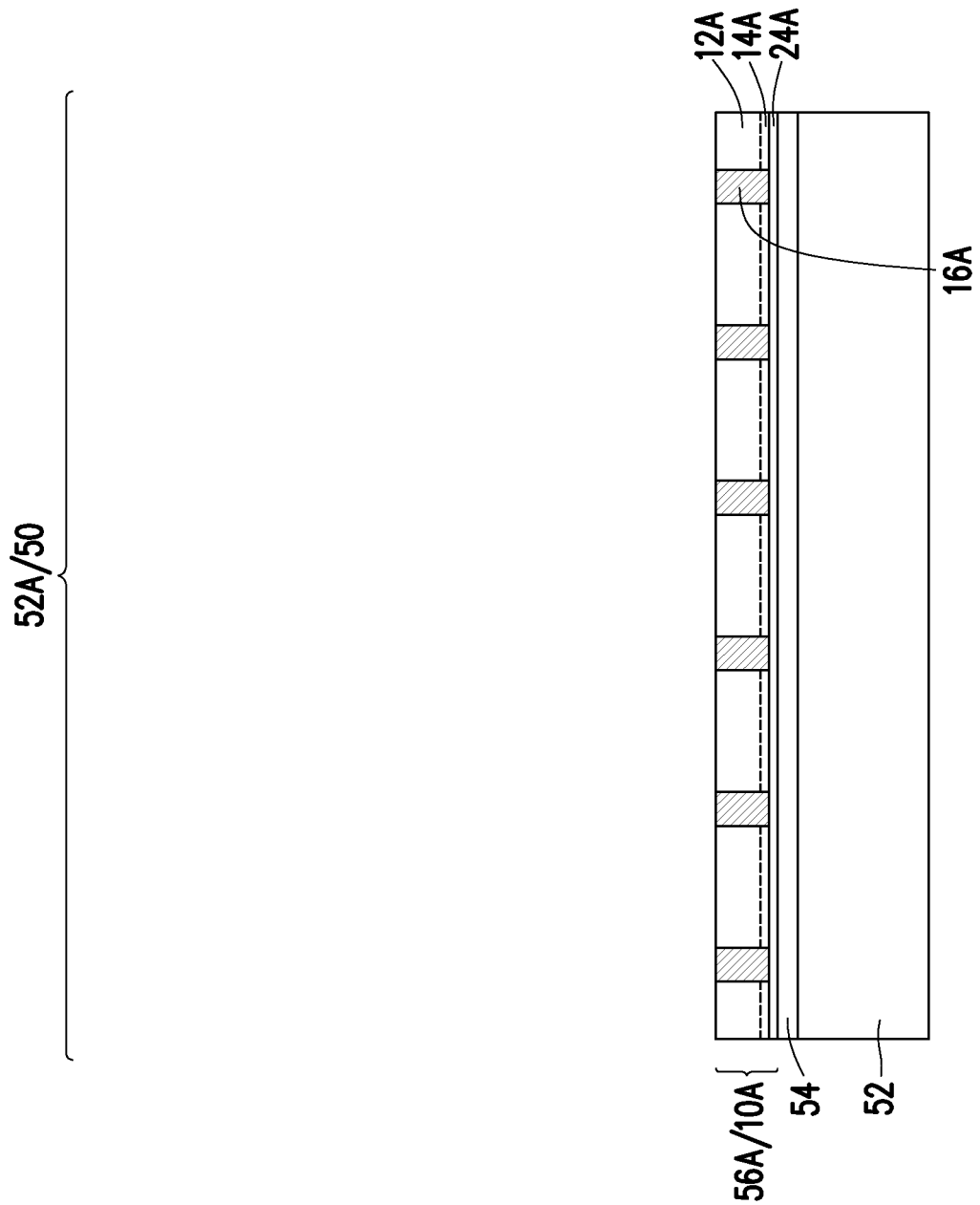

In FIG. 2B, the wafer 56A is thinned. The thinning may be by a CMP process, a grinding process, an etch back process, the like, or combinations thereof, and is performed on the inactive surface of the semiconductor substrate 12A. The thinning exposes the conductive vias 16A. After the thinning, surfaces of the conductive vias 16A and the inactive surface of the semiconductor substrate 12A are coplanar (within process variations). As such, the conductive vias 16A are exposed at the back side of the memory device 10A.

Figure 2C:
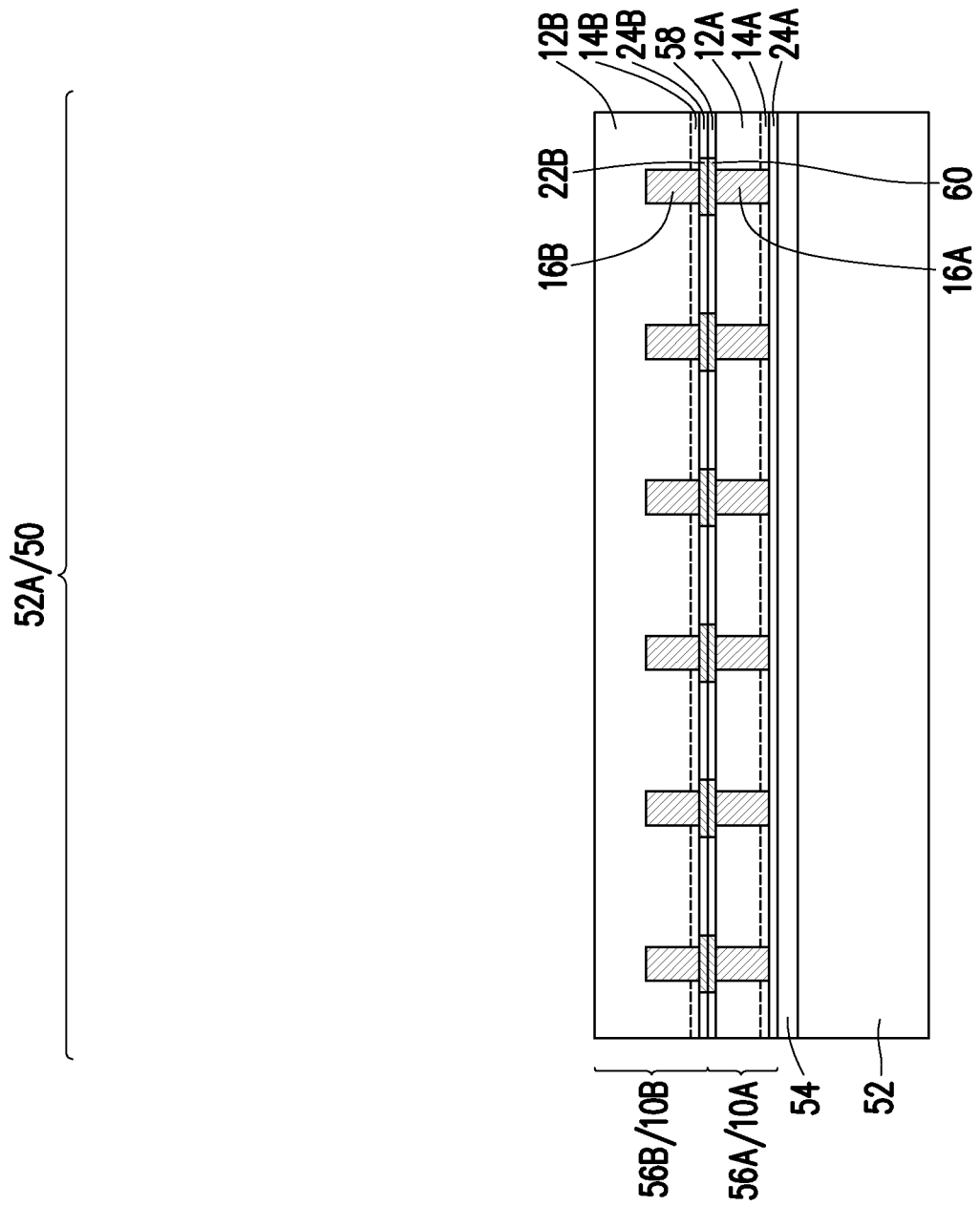

In FIG. 2C, a wafer 56B is stacked over the carrier substrate 52. In particular, the front side of the wafer 56B is attached to the back side of the wafer 56A. The wafer 56B comprises multiple integrated circuit devices, such as a memory device 10B in the device region 52A. The memory device 10B will be singulated in subsequent processing to be included in the memory cube 50. The memory device 10B includes a semiconductor substrate 12B, an interconnect structure 14B, conductive vias 16B, die connectors 22B, and a dielectric layer 24B.

The wafer 56A and the wafer 56B are back-to-face bonded, e.g., are directly bonded in a back-to-face manner by hybrid bonding, such that the back side of the wafer 56A is bonded to the front side of the wafer 56B. Specifically, dielectric-to-dielectric bonds and metal-to-metal bonds are formed between the wafer 56A and the wafer 56B. In the illustrated embodiment, a dielectric layer 58 and die connectors 60 are formed at the back side of the wafer 56A and are used for hybrid bonding.

The dielectric layer 58 is formed at the back side of the wafer 56A, such as on the semiconductor substrate 12A. The dielectric layer 58 is laterally coterminous (within process variations) with sidewalls of the integrated circuit device 10. The dielectric layer 58 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 58 may be formed, for example, by spin coating, lamination, chemical vapor deposition (CVD), or the like. In some embodiments (discussed in greater detail below), the semiconductor substrate 12A is recessed before forming the dielectric layer 58 so that the dielectric layer 58 surrounds the conductive vias 16A.

The die connectors 60 are formed at the back side of the wafer 56A, and are in physical contact with the conductive vias 16A. The die connectors 60 may be conductive pillars, pads, or the like, to which external connections are made. The die connectors 60 can be formed of a metal, such as copper, aluminum, or the like, and can be formed by, for example, plating, or the like. The die connectors 60 are electrically connected to integrated circuits of the memory device 10A by the conductive vias 16A. After formation, the dielectric layer 58 and the die connectors 60 are planarized using, e.g., a CMP process, an etch back process, the like, or combinations thereof. After planarization, the top surfaces of the die connectors 60 and dielectric layer 58 are coplanar (within process variations) and are exposed at the back side of the wafer 56A.

The dielectric layer 58 is bonded to the dielectric layer 24B through dielectric-to-dielectric bonding, without using any adhesive material (e.g., die attach film), and the die connectors 60 are bonded to the die connectors 22B through metal-to-metal bonding, without using any eutectic material (e.g., solder). The bonding may include a pre-bonding and an annealing. During the pre-bonding, a small pressing force is applied to press the wafer 56B against the wafer 56A. The pre-bonding is performed at a low temperature, such as room temperature, such as a temperature in the range of about 15° C. to about 30° C., and after the pre-bonding, the dielectric layer 24B and the dielectric layer 58 are bonded to each other. The bonding strength is then improved in a subsequent annealing step, in which the dielectric layer 24B and the dielectric layer 58 are annealed at a high temperature, such as a temperature in the range of about 140° C. to about 280° C. After the annealing, bonds, such as fusions bonds, are formed bonding the dielectric layer 24B and the dielectric layer 58. For example, the bonds can be covalent bonds between the material of the dielectric layer 58 and the material of the dielectric layer 24B. The die connectors 22B and the die connectors 60 are connected to each other with a one-to-one correspondence. The die connectors 22B and the die connectors 60 may be in physical contact after the pre-bonding, or may expand to be brought into physical contact during the annealing. Further, during the annealing, the material of the die connectors 22B and the die connectors 60 (e.g., copper) intermingles, so that metal-to-metal bonds are also formed. Hence, the resulting bonds between the wafer 56A and the wafer 56B are hybrid bonds that include both dielectric-to-dielectric bonds and metal-to-metal bonds.

In another embodiment, the die connectors 60 are omitted. The dielectric layer 58 is bonded to the dielectric layer 24B through dielectric-to-dielectric bonding, without using any adhesive material (e.g., die attach film), and the conductive vias 16A are bonded to the die connectors 22B through metal-to-metal bonding, without using any eutectic material (e.g., solder).

In yet another embodiment, the dielectric layer 58 and the die connectors 60 are omitted. The semiconductor substrate 12A may be bonded to the dielectric layer 24B through dielectric-to-dielectric bonding, without using any adhesive material (e.g., die attach film), and the conductive vias 16A may be bonded to the die connectors 22B through metal-to-metal bonding, without using any eutectic material (e.g., solder). For example, an oxide, such as a native oxide, a thermal oxide, or the like, may be formed on the inactive surface of the semiconductor substrate 12A, and may be used for the dielectric-to-dielectric bonding.

In FIG. 2D, the steps described above are repeated so that wafers 56C, 56D, 56E, 56F, 56G, 56H are stacked over the carrier substrate 52. The wafers 56C, 56D, 56E, 56F, 56G, 56H each comprise multiple integrated circuit devices, such as, respectively, memory devices 10C, 10D, 10E, 10F, 10G, 10H in the device region 52A. The memory devices 10C, 10D, 10E, 10F, 10G, 10H will be singulated in subsequent processing to be included in the memory cube 50. Each of the wafers 56C, 56D, 56E, 56F, 56G, 56H is directly bonded to, respectively, the wafers 56B, 56C, 56D, 56E, 56F, 56G in a back-to-face manner by hybrid bonding. The last wafer that is stacked, e.g., the wafer 56H, may not be thinned, such that conductive vias 16H of the wafer 56H remain electrically insulated.

In FIG. 2E, a carrier substrate debonding is performed to detach (or "debond") the carrier substrate 52 from the wafer stack, e.g., the wafer 56A. In accordance with some embodiments, the debonding includes projecting a light such as a laser light or an UV light on the release layer 54 so that the release layer 54 decomposes under the heat of the light and the carrier substrate 52 can be removed. Removing the carrier substrate 52 exposes the major surface of the upper memory device (e.g., the memory device 10A) of the memory cube 50. The wafer stack is then flipped over and placed on a tape (not shown).

Die connectors 22A are then formed for the top layer of the memory cube 50, e.g., at a front side of the wafer 56A. The die connectors 22A may be conductive pillars, pads, or the like, to which external connections are made. In some embodiments, the die connectors 22A are conductive bumps, such as microbumps. The die connectors 22A may have substantially vertical sidewalls (within process variations). In the illustrated embodiment, the die connectors 22A are formed through the dielectric layer 24A to couple the metallization patterns of the interconnect structure 14A. As an example to form the die connectors 22A, openings are formed in the dielectric layer 24A, and a seed layer is formed over the dielectric layer 24A and in the opening. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the die connectors 22A. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, such as copper, nickel, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the die connectors 22A.

The die connectors 22A are different from the die connectors 22B, 22C, 22D, 22E, 22F, 22G, 22H. Specifically, the die connectors 22A are bumps (e.g., microbumps) that are raised from the majors surface of the dielectric layer 24A. Conversely, the die connectors 22B, 22C, 22D, 22E, 22F, 22G, 22H are bond pads having top surfaces that are coplanar with (e.g., not raised from) the majors surface of the dielectric layers 24B, 24C, 24D, 24E, 24F, 24G, 24H, respectively. In other words, the top memory device 10A of the memory cube 50 has conductive bumps at the front side of the memory device, and the lower memory devices 10B, 10C, 10D, 10E, 10F, 10G, 10H of the memory cube 50 have bond pads at the respective front sides of the memory devices.

In FIG. 2F, a singulation process is performed along scribe line regions, e.g., between the device region 52A and adjacent device regions. The singulation may be by sawing, laser cutting, or the like. The singulation process can be performed before or after the die connectors 22A are formed. The singulation separates the device region 52A from adjacent device regions. The resulting, singulated memory cube 50 is from the device region 52A. The memory devices of the memory cube 50 are laterally coterminous (within process variations) after singulation.

It should be appreciated that the memory cube 50 may include any number of layers. In the embodiment shown, the memory cube 50 includes eight layers. In another embodiment, the memory cube 50 includes more or less than eight layers, such as two layers, four layers, sixteen layers, thirty two layers, or the like.

After formation of the memory cube 50 is complete (e.g., after formation of the die connectors 22A and singulation of the memory cube 50), the resulting memory cube 50 is tested by use of a probe 62. The probe 62 is physically and electrically connected to the die connectors 22A. The die connectors 22A are used to test the memory cube 50, such that only known good memory cubes are used for further processing. The testing may include testing of the functionality of the memory devices 10A, 10B, 10C, 10D, 10E, 10F, 10G, 10H, or may include testing for known open or short circuits that may be expected based on the design of the memory devices. During the testing, all of the memory devices of the memory cube 50 may be tested in a daisy-chain manner.

FIGS. 3A through 3D are cross-sectional views of intermediate steps during a process for forming a HBM device 100, in accordance with some embodiments. As will be discussed in greater detail below, FIGS. 3A through 3D illustrate a process in which a HBM device 100 is formed by stacking a memory cube 50 on a second integrated circuit device (e.g., a logic device 10L, see FIG. 3A). The second integrated circuit device is a bare die, which can be formed in a wafer 102. Formation of a HBM device 100 in one device region 102A of the wafer 102 is illustrated, but it should be appreciated that the wafer 102 may have any number of device regions, and a HBM device 100 may be formed in each device region.

Subsequently, the HBM device 100 may be used in the formation of an integrated circuit package. Specifically, as will be discussed in greater detail below, the HBM device 100 can be packaged in a three-dimensional integrated circuit (3DIC) package, such as a system-in-package (SiP). Examples of a 3DIC package include a chip-on-wafer (CoW) package, a chip-on-wafer-on-substrate (CoWoS) package, an integrated fan-out (InFO) package, and the like, although it should be appreciated that embodiments may be applied to other 3DIC packages.

Figure 3A:
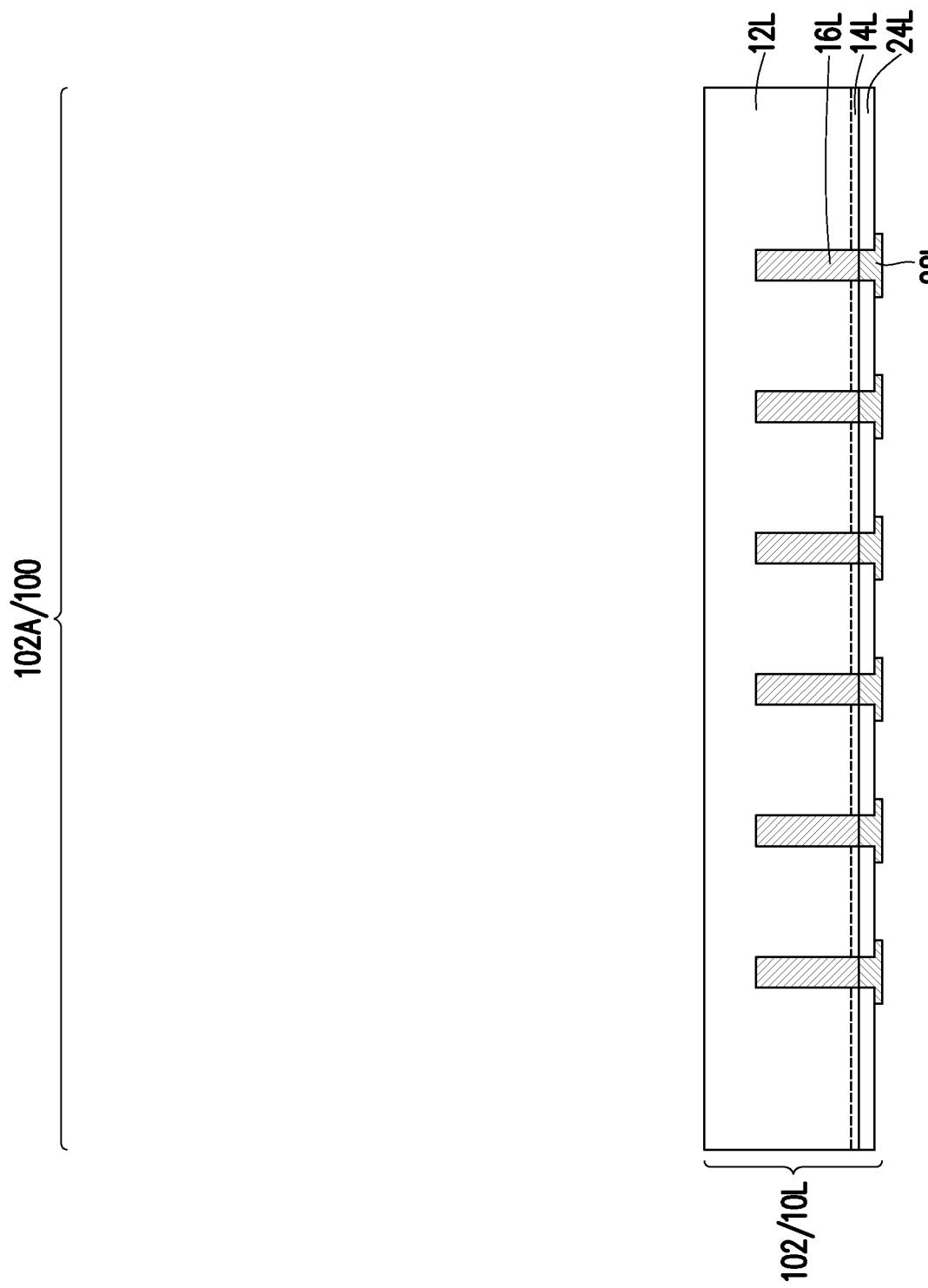
FIGS. 3A through 3F are cross-sectional views of intermediate steps during a process for forming a HBM device, in accordance with some embodiments.

In FIG. 3A the wafer 102 is obtained. The wafer 102 comprises a logic device 10L in the device region 102A. The logic device 10L will be singulated in subsequent processing to be included in the HBM device 100. The logic device 10L can be an interface device, buffer device, controller device, or the like for the memory devices of the memory cube 50. In some embodiments, the logic device 10L provides the input/output (I/O) interface for the HBM device too. The logic device 10L includes a semiconductor substrate 12L, an interconnect structure 14L, conductive vias 16L, die connectors 22L, and a dielectric layer 24L. The die connectors 22L are used for connections to other devices, such as devices in an integrated circuit package in which the HBM device 100 can be implemented. The die connectors 22L may be formed of a similar material and by a similar method as the die connectors 22A described with respect to FIG. 2E. For example, the die connectors 22A may be connectors that are suitable for use with reflowable connectors, such as microbumps, extending through the dielectric layer 24L.

Figure 3B:
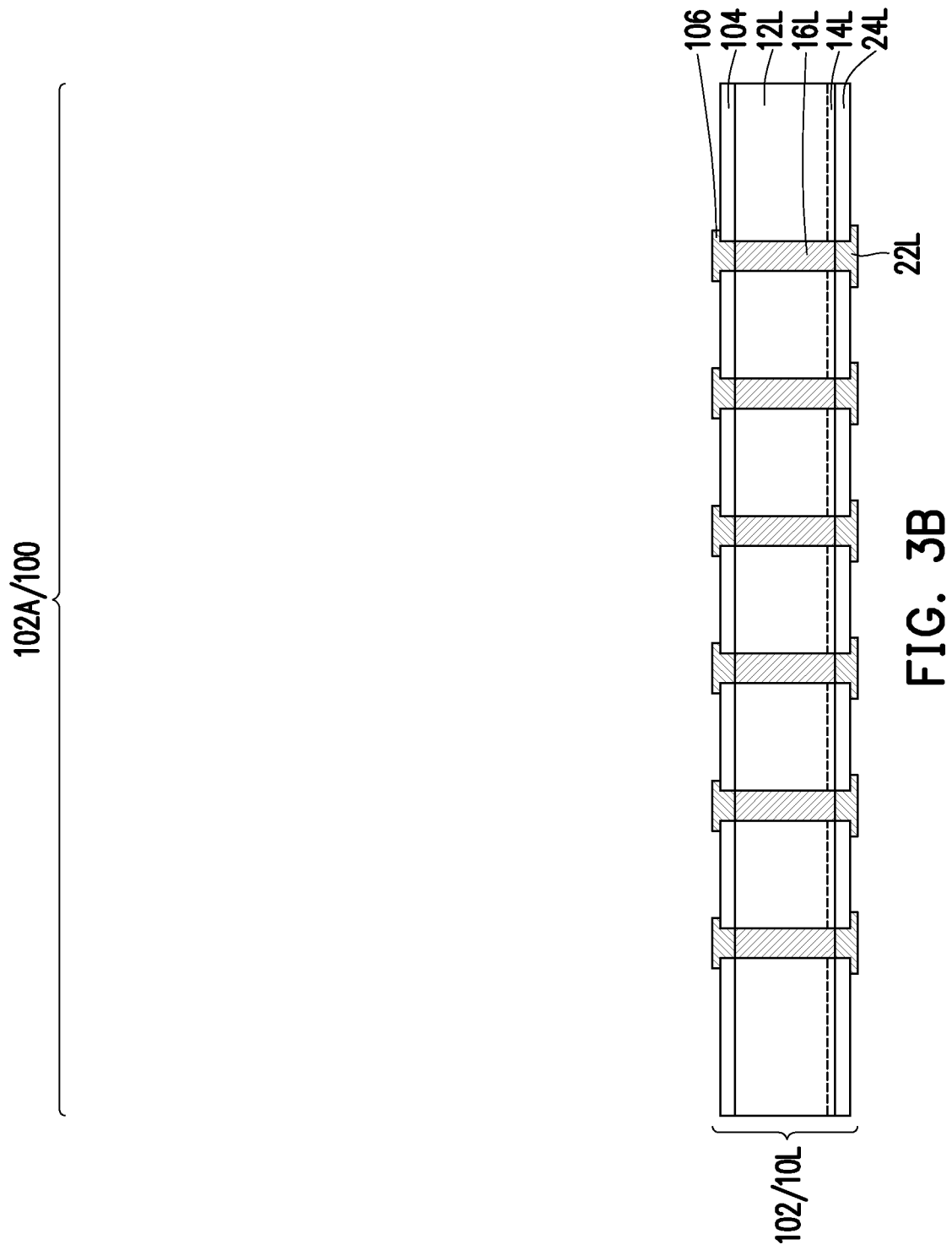

In FIG. 3B, the wafer 102 is thinned. The thinning may be by a CMP process, a grinding process, an etch back process, the like, or combinations thereof, and is performed on the inactive surface of the semiconductor substrate 12L. The thinning exposes the conductive vias 16L. After the thinning, surfaces of the conductive vias 16L and the inactive surface of the semiconductor substrate 12L are coplanar (within process variations). As such, the conductive vias 16L are exposed at the back side of the logic device 10L.

A dielectric layer 104 is then formed over the wafer 102, e.g., at the back side of the logic device 10L. The dielectric layer 104 may be formed of a similar material and by a similar method as the dielectric layer 58 described with respect to FIG. 2C. Die connectors 106 are then formed extending through the dielectric layer 104. The die connectors 106 may be formed of a similar material and by a similar method as the die connectors 22A described with respect to FIG. 2E. For example, the die connectors 106 may be connectors that are suitable for use with reflowable connectors, such as microbumps. The die connectors 106 are physically connected to the conductive vias 16L, and are electrically connected to integrated circuits of the logic device 10L by the conductive vias 16L.

Figure 3C:
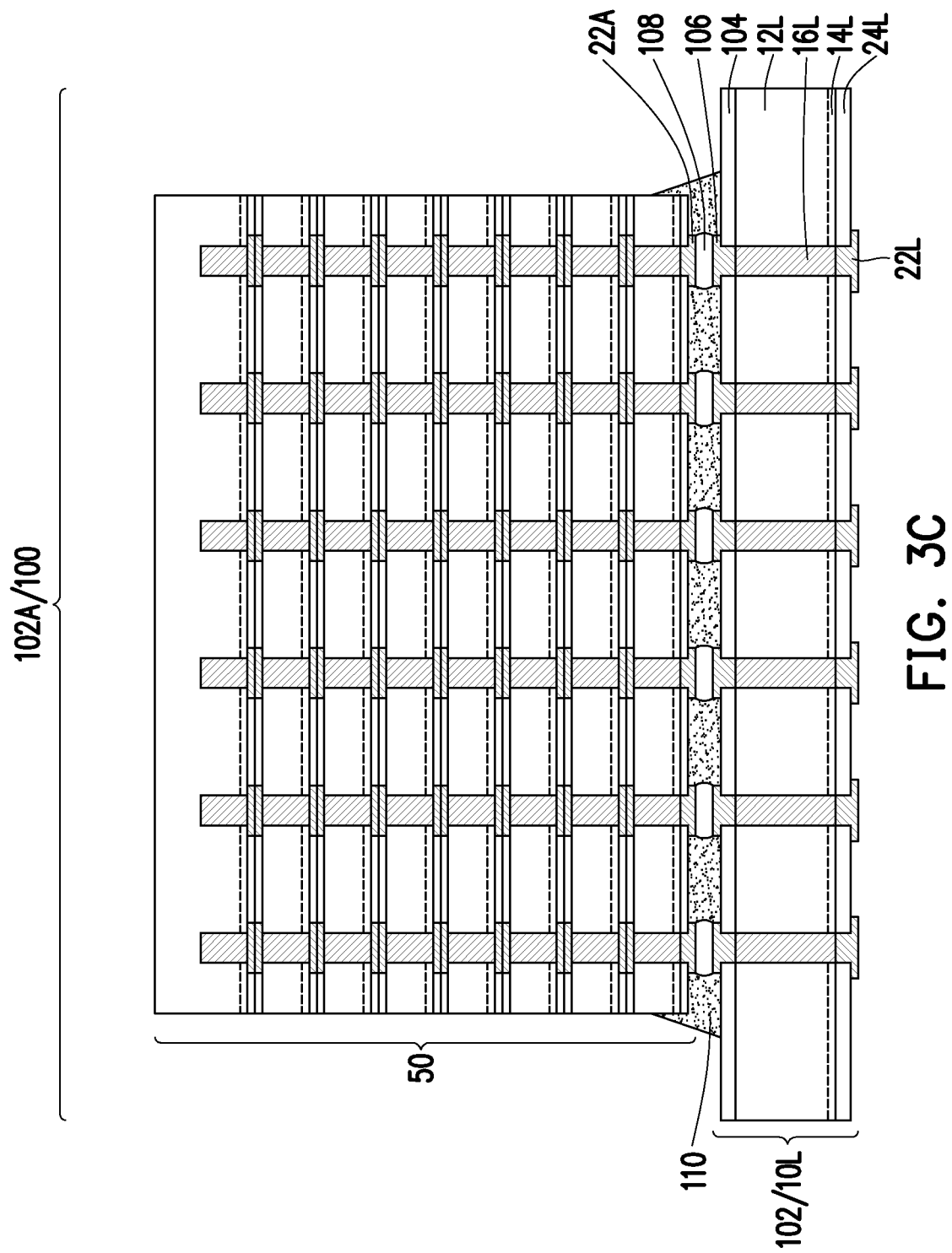

In FIG. 3C, a memory cube 50 is attached to the wafer 102, e.g., to the back side of the logic device 10L. The memory cube 50 is connected to wafer 102 with reflowable connectors 108. The reflowable connectors 108 can be formed on the die connectors 106 and/or the die connectors 22A. The reflowable connectors 108 may be formed of a solder material such as tin, tin-lead, gold, silver, tin-silver, tin-bismuth, copper, copper-tin, copper-tin-silver, copper-nickel-tin-silver, palladium, indium, nickel, nickel-palladium-gold, nickel-gold, the like, or combinations thereof. In some embodiments, the reflowable connectors 108 are formed by initially forming a layer of solder material through evaporation, electroplating, printing, solder transfer, ball placement, or the like. Once a layer of solder material has been formed on the structure, a reflow may be performed in order to shape the material into the desired bump shapes. In some embodiments, the reflowable connectors 108 are formed on the die connectors 106. In such embodiments, the memory cube 50 is connected to wafer 102 by contacting the die connectors 22A to the reflowable connectors 108 and subsequently reflowing the reflowable connectors 108, thus soldering the memory cube 50 to the wafer 102. Solder joints are thus formed between the die connectors 22A and the die connectors 106, thereby connecting the memory cube 50 to the wafer 102.

In some embodiments, an underfill 110 is formed between the memory cube 50 and the wafer 102, surrounding the reflowable connectors 108. The underfill 110 may reduce stress and protect the joints resulting from the reflowing of the reflowable connectors 108. The underfill 110 may be formed by a capillary flow process after the memory cube 50 is attached, or may be formed by a suitable deposition method before the memory cube 50 is attached.

Figure 3D:
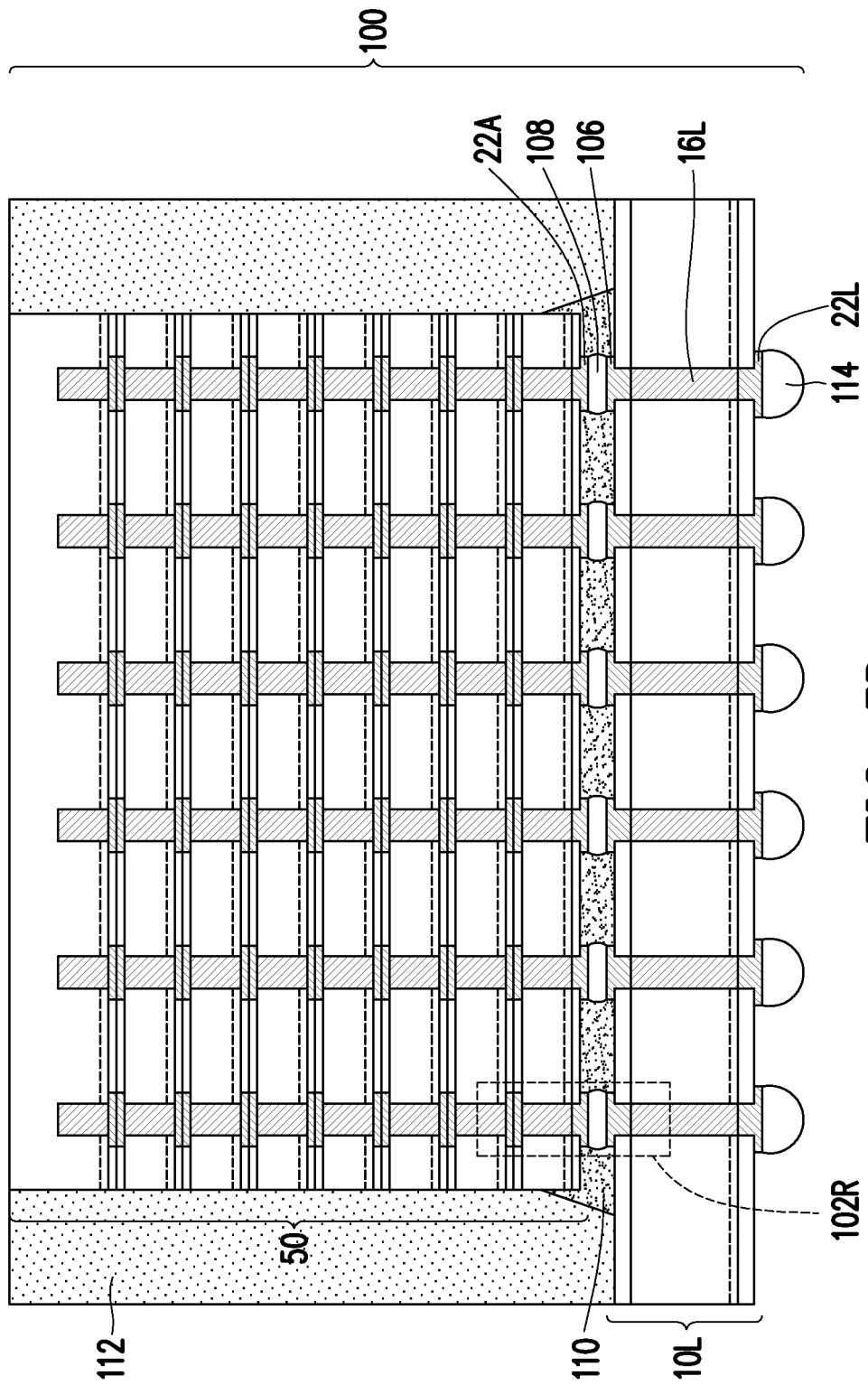

In FIG. 3D, an encapsulant 112 is formed on and around the various components. After formation, the encapsulant 112 encapsulates the memory cube 50 and contacts sidewalls of the underfill 110 and each memory device of the memory cube 50. The encapsulant 112 may be a molding compound, epoxy, or the like. The encapsulant 112 may be applied by compression molding, transfer molding, or the like, and may be formed over the wafer 102 such that the memory cube 50 is buried or covered. The encapsulant 112 may be applied in liquid or semi-liquid form and then subsequently cured. A planarization process is optionally performed on the encapsulant 112 to expose the memory cube 50. After the planarization process, top surfaces of the memory cube 50 and the encapsulant 112 are coplanar (within process variations). The planarization process may be, for example, a chemical-mechanical polish (CMP), a grinding process, or the like. In some embodiments, the planarization may be omitted, for example, if the memory cube 50 is already exposed.

A singulation process is then performed along scribe line regions, e.g., around the device region 102A. The singulation may be by sawing, laser cutting, or the like. The singulation process separates the device region 102A (comprising the logic device 10L) from adjacent device regions to form an HBM device 100 comprising the logic device 10L. The singulated logic device 10L has a greater width than each memory device of the memory cube 50. After singulation, the logic device 10L and the encapsulant 112 are laterally coterminous (within process variations).

Conductive connectors 114 are formed on the die connectors 22L. The conductive connectors 114 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 114 may include a conductive material such as solder, copper, aluminum, gold, nickel, silver, palladium, tin, the like, or a combination thereof. In some embodiments, the conductive connectors 114 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 114 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. The conductive connectors 114 may be formed before or after the singulation process. The conductive connectors 114 will be used for external connection (discussed further below).

Figure 3E:
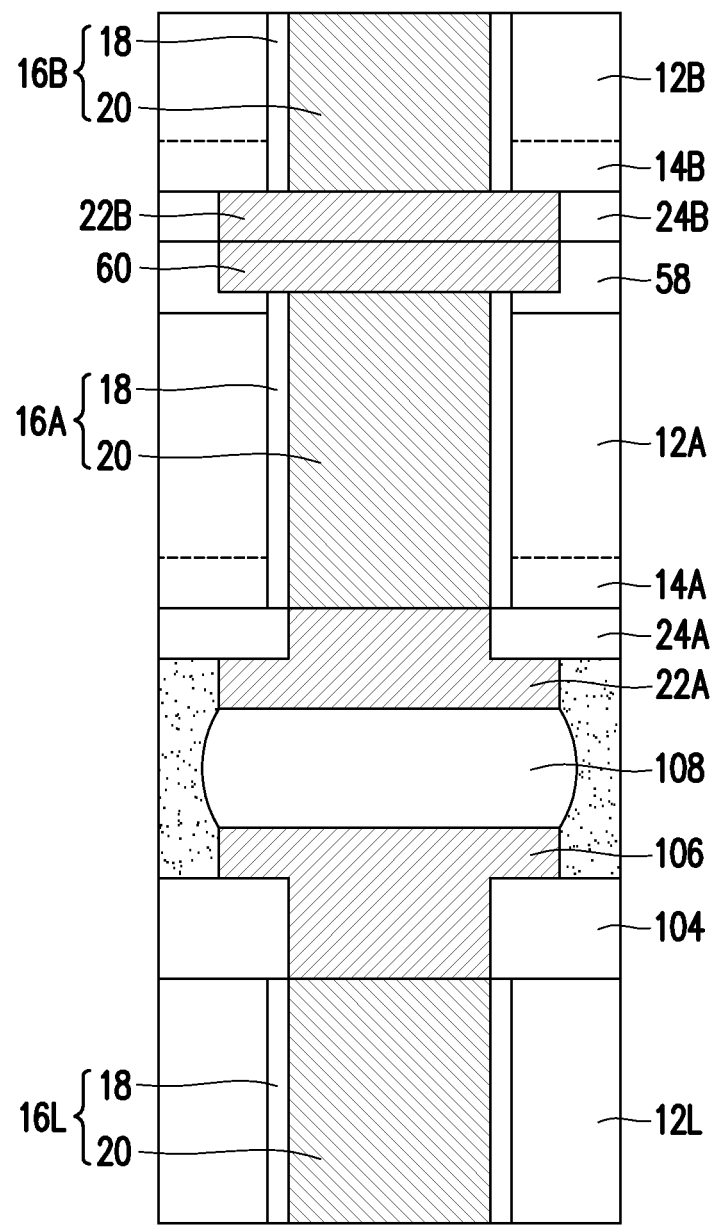

FIG. 3E is a detailed view of a region 102R from FIG. 3D, in accordance with some embodiments. In this embodiment, the dielectric layer 58 is formed around the conductive vias 16A, and the die connectors 60 are formed in the dielectric layer 58 to contact the conductive vias 16A. The die connectors 22B contact the die connectors 60. Further, FIG. 3E also more clearly illustrates how the die connectors 106 and the die connectors 22A are bumps (e.g., microbumps) that are raised from the majors surfaces of, respectively, the dielectric layer 104 and the dielectric layer 24A.

Figure 3F:
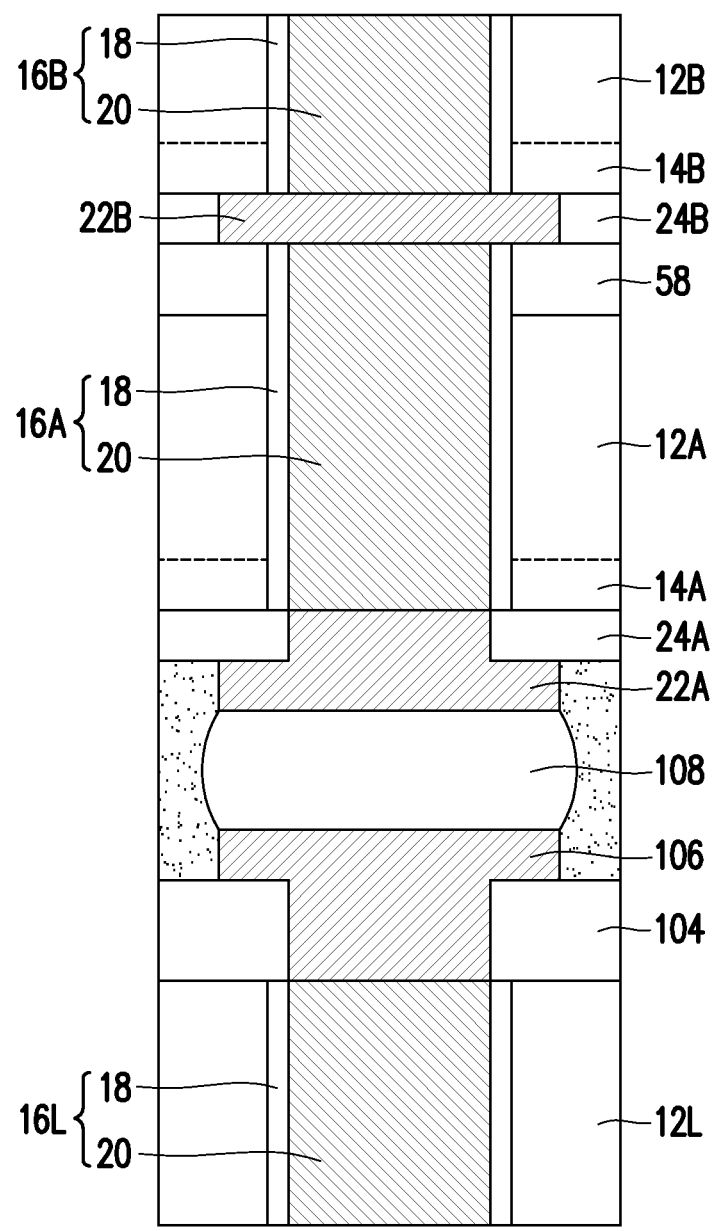

FIG. 3F is a detailed view of a region 102R from FIG. 3D, in accordance with some other embodiments. In this embodiment, the dielectric layer 58 is formed around the conductive vias 16A, but the die connectors 60 are omitted. Instead, the die connectors 22B contact the conductive vias 16A. Further, FIG. 3F also more clearly illustrates how the die connectors 106 and the die connectors 22A are bumps (e.g., microbumps) that are raised from the majors surfaces of, respectively, the dielectric layer 104 and the dielectric layer 24A.

FIGS. 4A through 4D are cross-sectional views of intermediate steps during a process for forming a HBM device 100, in accordance with some other embodiments. As will be discussed in greater detail below, FIGS. 4A through 4D illustrate a process in which a HBM device 100 is formed by stacking a memory cube 50 on a package component 200 (see FIG. 4D) instead of on a bare die. The package component 200 is formed on a carrier substrate 202 and includes a second integrated circuit device (e.g., a logic device 10L, see FIG. 4A). Formation of a HBM device boo in one device region 202A of the carrier substrate 202 is illustrated, but it should be appreciated that the carrier substrate 202 may have any number of device regions, and a HBM device 100 may be formed in each device region.

Figure 4A:
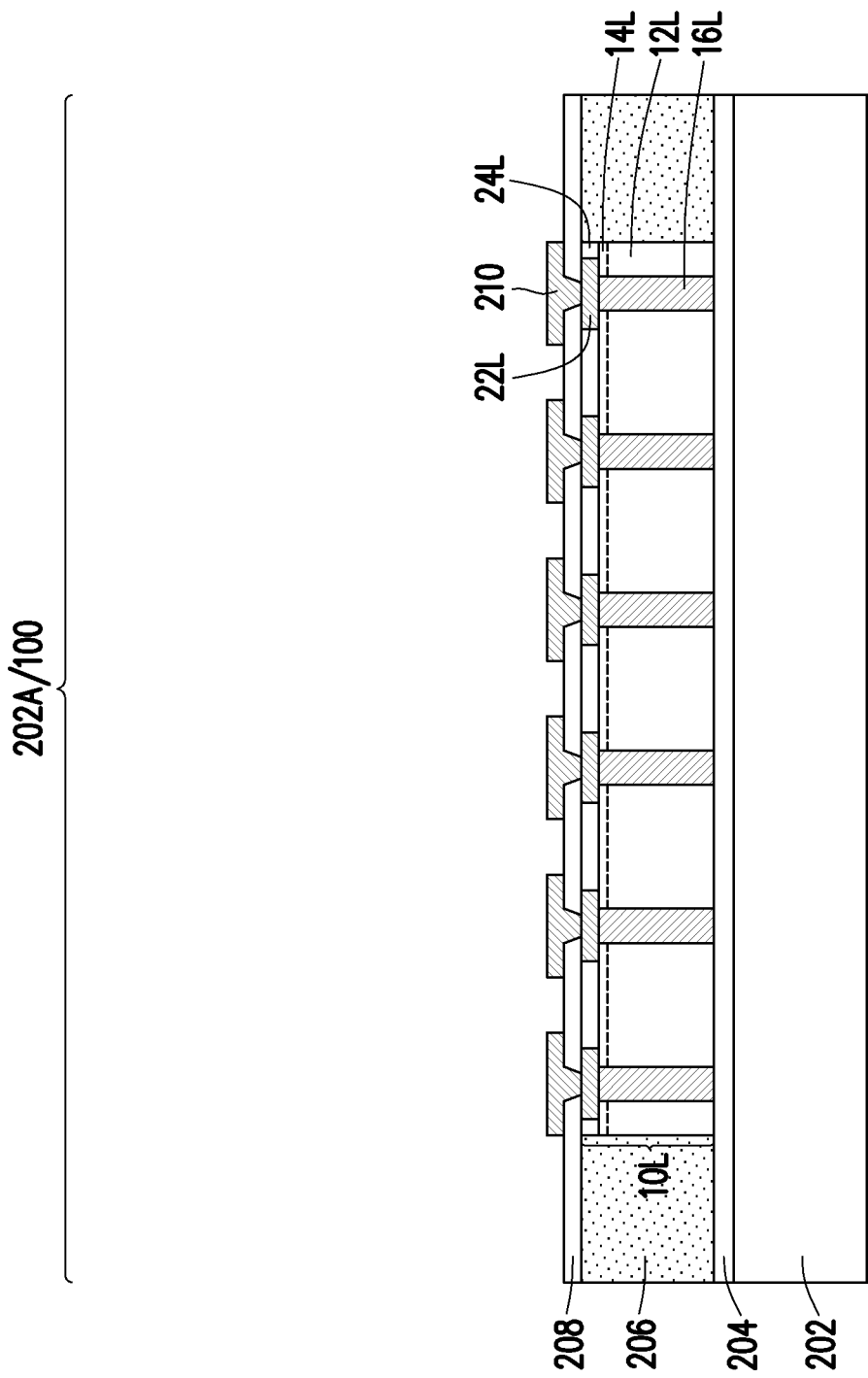
FIGS. 4A through 4D are cross-sectional views of intermediate steps during a process for forming a HBM device, in accordance with some other embodiments.

In FIG. 4A, a carrier substrate 202 is provided, and a release layer 204 is formed on the carrier substrate 202. The carrier substrate 202 can be formed of a similar material and by a similar method as the carrier substrate 52 described with respect to FIG. 2A. The release layer 204 can be formed of a similar material and by a similar method as the release layer 54 described with respect to FIG. 2A.

A singulated logic device 10L is placed on the release layer 204. The logic device 10L can be formed of a similar material and by a similar method as the logic device 10L described with respect to FIG. 3A, except the die connectors 22L may not be bumps, and the conductive vias 16L are exposed at a back side of the logic device 10L.

An encapsulant 206 is formed on and around the logic device 10L. The encapsulant 206 can be formed of a similar material and by a similar method as the encapsulant 112 described with respect to FIG. 3D. A planarization process can be performed on the encapsulant 206, if needed, to expose the die connectors 22L.

A dielectric layer 208 is formed on the encapsulant 206 and the front side of the logic device 10L. The dielectric layer 208 may be an oxide such as silicon oxide, PSG, BSG, BPSG, or the like; a nitride such as silicon nitride or the like; a polymer such as polybenzoxazole (PBO), polyimide, a benzocyclobutene (BCB) based polymer, or the like; the like; or a combination thereof. The dielectric layer 208 may be formed, for example, by spin coating, lamination, chemical vapor deposition (CVD), or the like.

Under-bump metallurgies (UBMs) 210 are formed connected to the logic device 10L. The UBMs 210 have bump portions on and extending along the major surface of the dielectric layer 208, and have via portions extending through the dielectric layer 208 to physically and electrically couple the die connectors 22L. As a result, the UBMs 210 are electrically coupled to the logic device 10L. As an example to form the UBMs 210, openings are formed through the dielectric layer 208, and a seed layer is formed over the dielectric layer 208 and in the openings extending through the dielectric layer 208. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 210. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the UBMs 210. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Figure 4B:
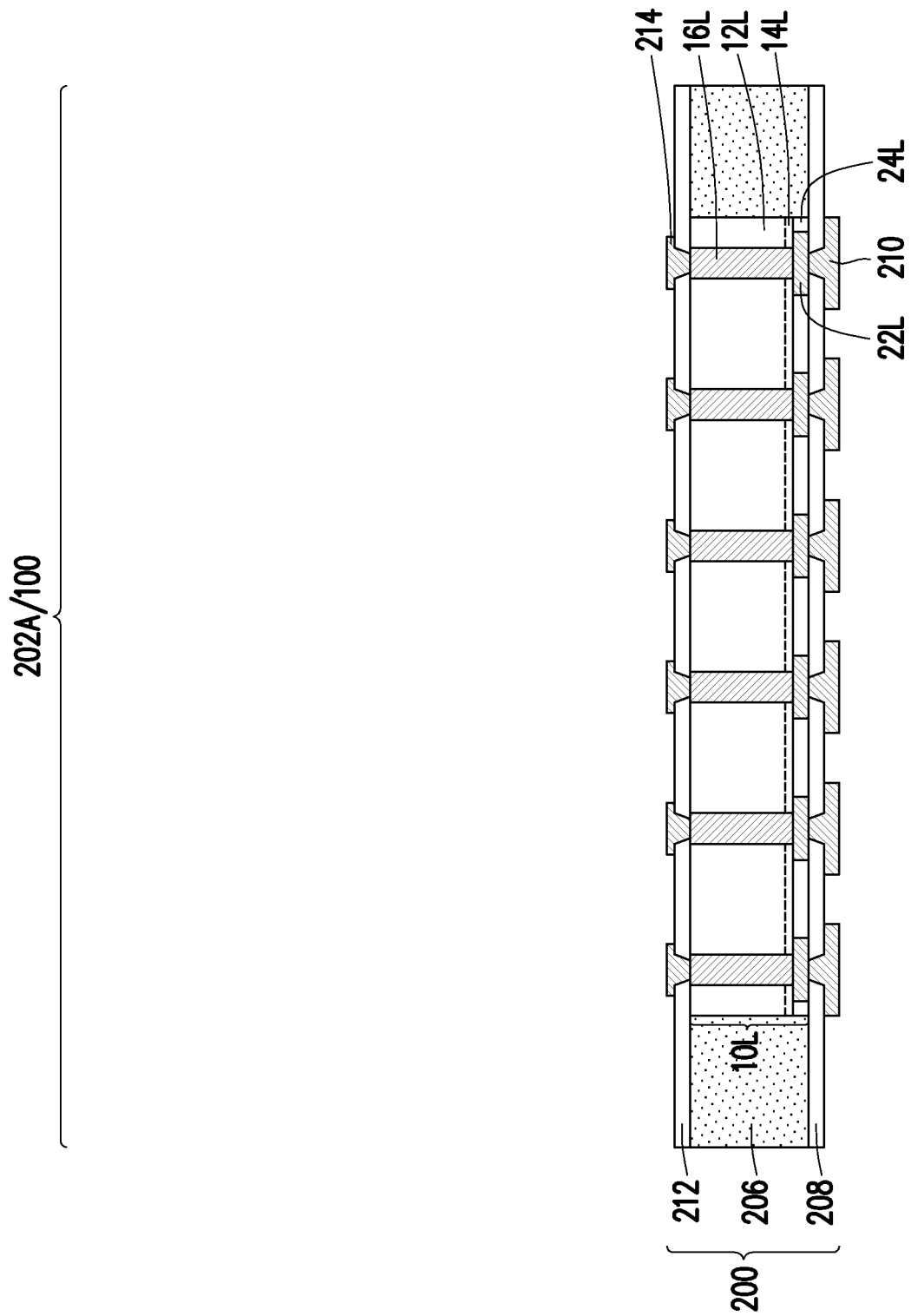

In FIG. 4B, a carrier substrate debonding is performed to detach (debond) the carrier substrate 202 from the logic device 10L. In accordance with some embodiments, the debonding includes projecting a light such as a laser light or an UV light on the release layer 204 so that the release layer 204 decomposes under the heat of the light and the carrier substrate 202 can be removed. The structure can then be flipped over and placed on, e.g., a tape.

A dielectric layer 212 is then formed on the encapsulant 206 and the back side of the logic device 10L. The dielectric layer 212 may be formed of a similar material and by a similar method as the dielectric layer 208.

UBMs 214 are then formed connected to the logic device 10L. The UBMs 214 have bump portions on and extending along the major surface of the dielectric layer 212, and have via portions extending through the dielectric layer 212 to physically and electrically couple the conductive vias 16L. The UBMs 214 may be formed of a similar material and by a similar method as the UBMs 210.

Figure 4C:
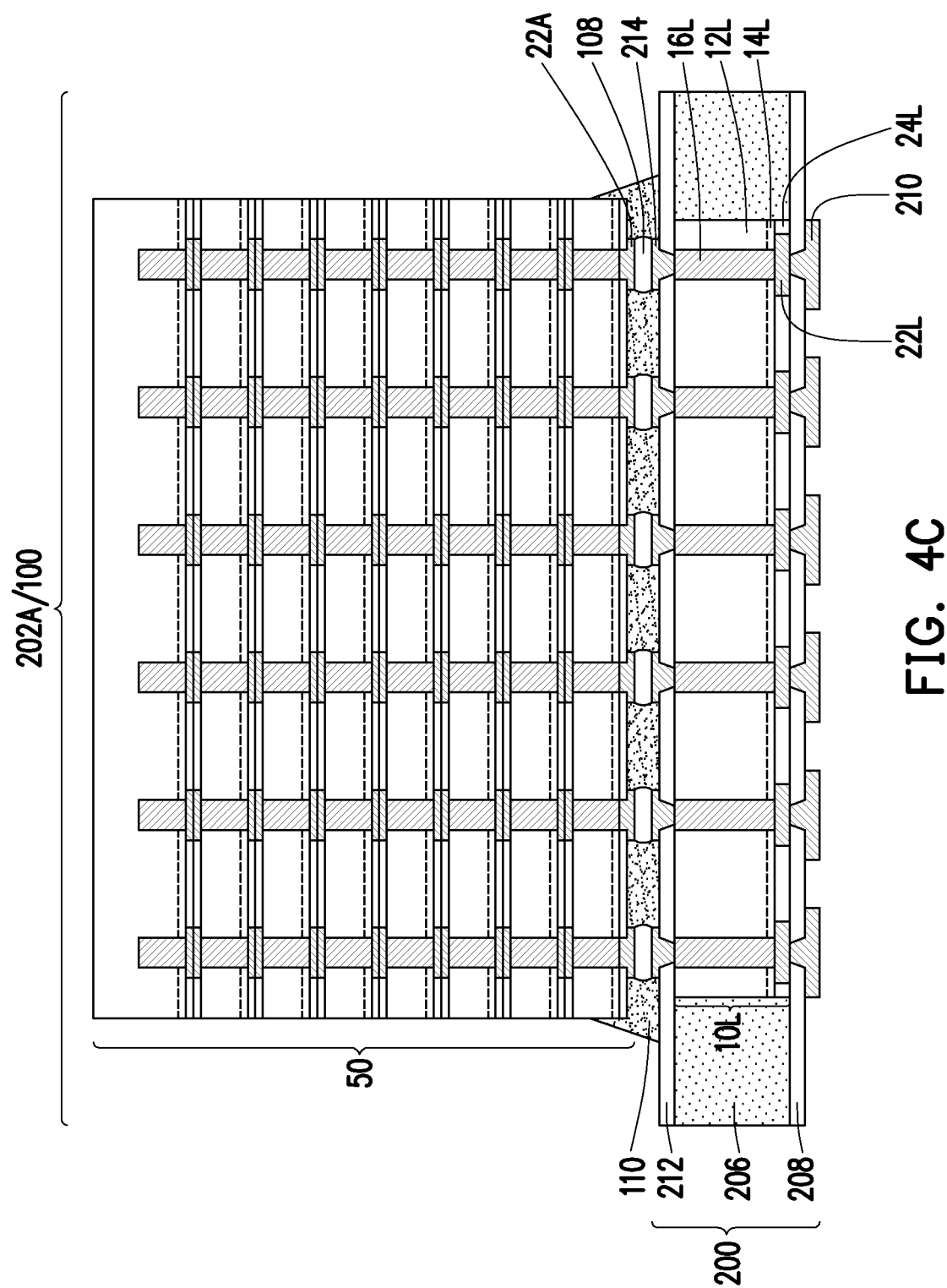

In FIG. 4C, a memory cube 50 is attached to the package component 200, e.g., to the UBMs 214. The memory cube 50 is a known good memory cube that has been tested. The die connectors 22A of the memory cube 50 are connected to the UBMs 214 of the package component 200 with reflowable connectors 108 in a similar manner as described with respect to FIG. 3C. In some embodiments, an underfill 110 is formed between the memory cube 50 and the package component 200 in a similar manner as described with respect to FIG. 3C.

Figure 4D:
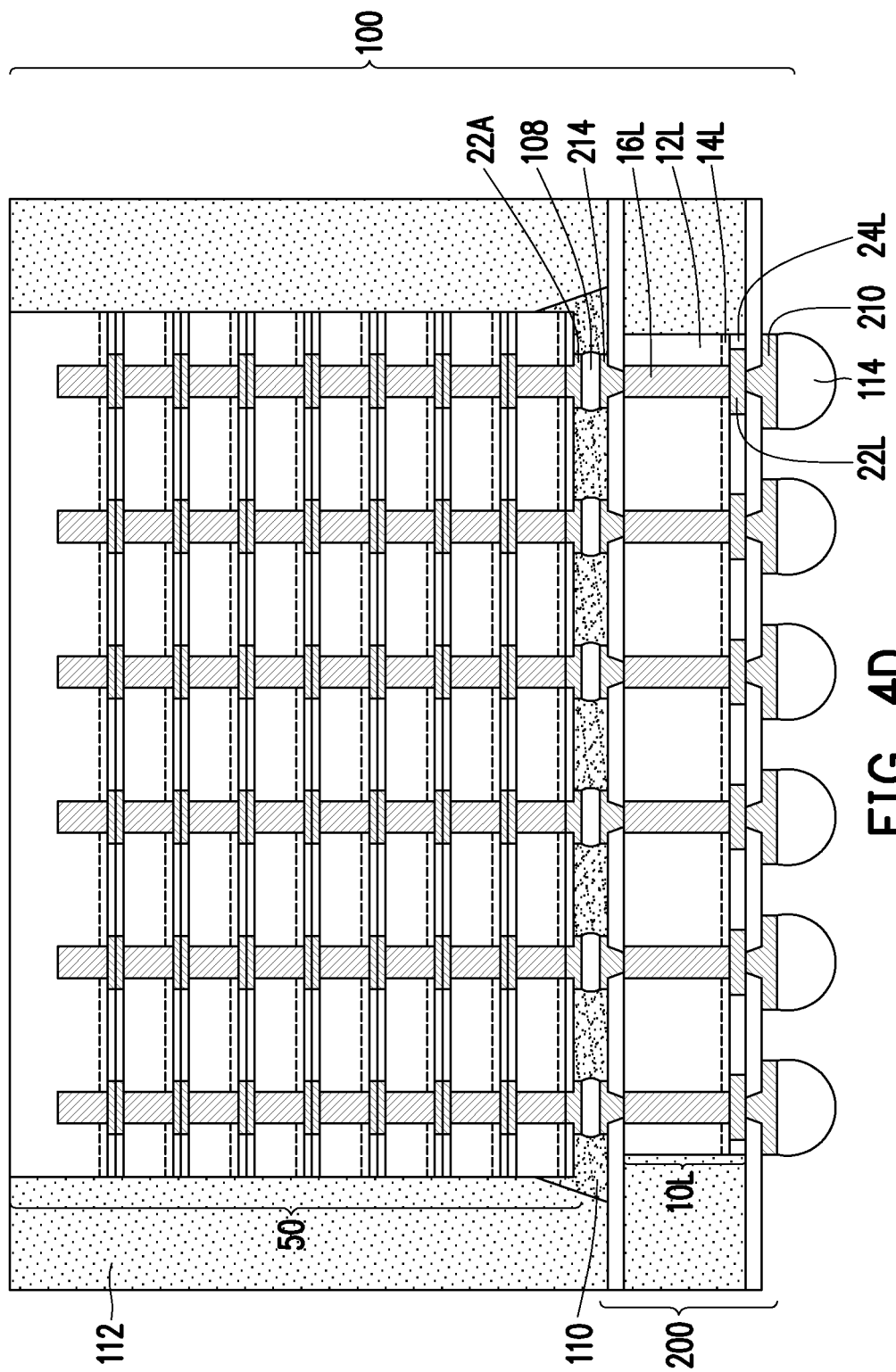

In FIG. 4D, an encapsulant 112 is formed on and around the various components in a similar manner as described with respect to FIG. 3D. A singulation process is then performed along scribe line regions, e.g., around the device region 202A. The singulation may be by sawing, laser cutting, or the like. The singulation process separates the device region 202A (comprising the package component 200) from adjacent device regions to form an HBM device too comprising the package component 200. After singulation, the package component 200 and the encapsulant 112 are laterally coterminous (within process variations).

Conductive connectors 114 are formed on the UBMs 210. The conductive connectors 114 may be formed of a similar material and by a similar method as the conductive connectors 114 described with respect to FIG. 3D. The conductive connectors 114 may be formed before or after the singulation process. The conductive connectors 114 will be used for external connection (discussed further below).

Attaching the memory cube 50 to the package component 200 instead of to a bare die advantageously allows the logic device 10L to be any desired size. When the HBM device 100 is formed by attaching the memory cube 50 directly to a bare die (such as in the embodiment described with respect to FIG. 3C), the bare die will have a greater width than each memory device of the memory cube 50. However, when the HBM device 100 is formed by attaching the memory cube 50 to a package component, the package component will have a greater width than each memory device of the memory cube 50, but the packaged logic device 10L may have a width that is greater than, less than, or similar to each memory device of the memory cube 50.

Figure 5A:
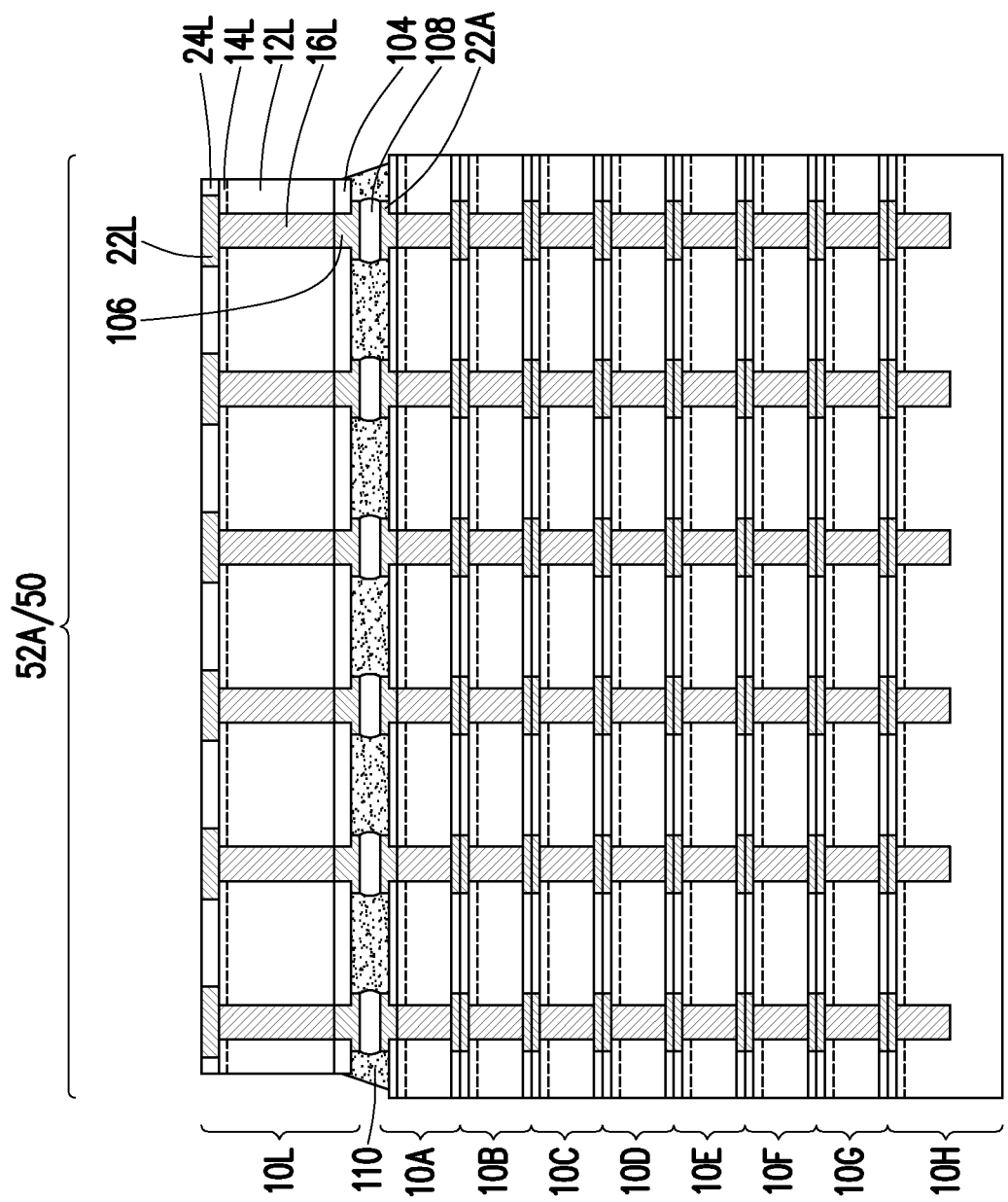
Figure 5B:
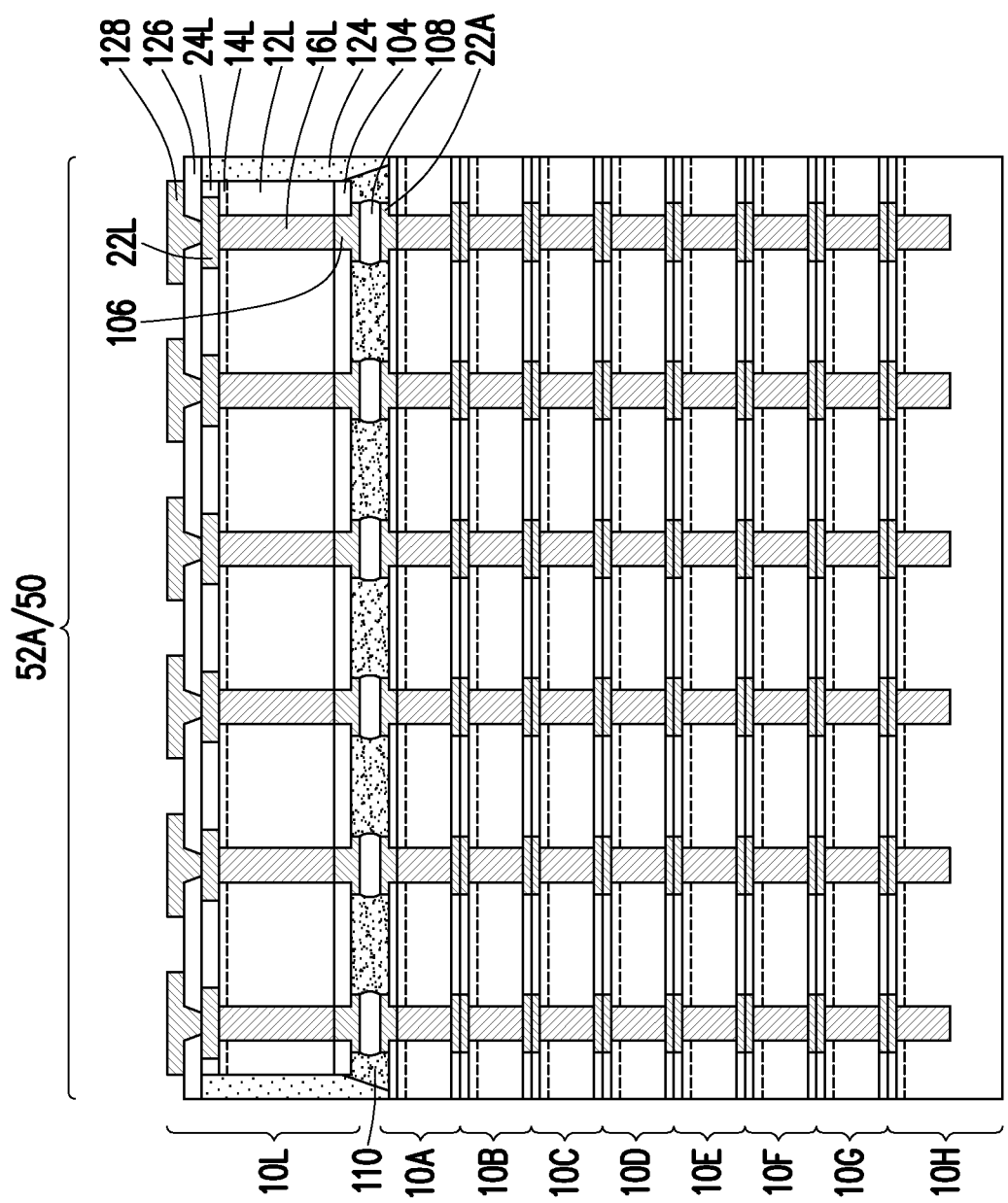

FIGS. 5A through 5C are cross-sectional views of intermediate steps during a process for forming a HBM device 100, in accordance with some other embodiments. As will be discussed in greater detail below, FIGS. 5A through 5C illustrate a process in which a HBM device 100 is formed by stacking a second integrated circuit device (e.g., a logic device 10L, see FIG. 5A) on a memory cube 50 before the memory cube 50 is singulated. Processing of a structure (e.g., an unsingulated wafer stack) similar to the embodiment described with respect to FIG. 2E is shown. Formation of a HBM device 100 in one device region 52A of the wafer stack is illustrated, but it should be appreciated that the wafer stack may have any number of device regions, and a HBM device 100 may be formed in each device region. In this embodiment, the memory cubes 50 are tested before singulation, and only known good memory cubes 50 (e.g., known good device regions of the unsingulated wafer stack) may be processed using the process illustrated in FIGS. 5A through 5C.

In FIG. 5A, a singulated logic device 10L is bonded to the wafer stack, e.g., to the memory cube 50. The logic device 10L can be formed of a similar material and by a similar method as the logic device 10L described with respect to FIG. 3A, except the die connectors 22L may not be bumps, and the conductive vias 16L are exposed at a back side of the logic device 10L. A dielectric layer 104 is formed at the back side of the logic device 10L. The dielectric layer 104 is formed of a similar material and by a similar method as the dielectric layer 58 described with respect to FIG. 2C. Die connectors 106 are formed extending through the dielectric layer 104. The die connectors 106 may be formed of a similar material and by a similar method as the die connectors 22A described with respect to FIG. 2E. For example, the die connectors 106 may be connectors that are suitable for use with reflowable connectors, such as microbumps. The die connectors 106 of the logic device 10L are connected to the die connectors 22A of the memory cube 50 with reflowable connectors 108 in a similar manner as described with respect to FIG. 3C. In some embodiments, an underfill 110 is formed between the logic device 10L and the memory cube 50 in a similar manner as described with respect to FIG. 3C.

In FIG. 5B, an encapsulant 124 is formed on and around the logic device 10L. The encapsulant 124 can be formed of a similar material and by a similar method as the encapsulant 112 described with respect to FIG. 3D. A planarization process can be performed on the encapsulant 124, if needed, to expose the die connectors 22L.

A dielectric layer 126 is formed on the encapsulant 124 and the front side of the logic device 10L. The dielectric layer 126 can be formed of a similar material and by a similar method as the dielectric layer 208 described with respect to FIG. 4A.

UBMs 128 are then formed connected to the logic device 10L. The UBMs 128 have bump portions on and extending along the major surface of the dielectric layer 126, and have via portions extending through the dielectric layer 126 to physically and electrically couple the die connectors 22L. The UBMs 128 may be formed of a similar material and by a similar method as the UBMs 210 described with respect to FIG. 4A.

In FIG. 5C, a singulation process is performed along scribe line regions, e.g., around the device region 52A. The singulation may be by sawing, laser cutting, or the like. The singulation process separates the device region 52A (comprising the memory cube 50) from adjacent device regions to form an HBM device 100 comprising the memory cube 50. After singulation, the memory cube 50 and the encapsulant 124 are laterally coterminous (within process variations).

Conductive connectors 114 are formed on the UBMs 128. The conductive connectors 114 may be formed of a similar material and by a similar method as the conductive connectors 114 described with respect to FIG. 3D. The conductive connectors 114 may be formed before or after the singulation process. The conductive connectors 114 will be used for external connection (discussed further below).

Attaching the logic device 10L to the memory cube 50 before singulation advantageously allows logic devices of a smaller size to be utilized. When the HBM device 100 is formed by attaching a logic device 10L to the memory cube 50, the logic device 10L will have a lesser width than the memory cube 50. The horizontal footprint of the HBM device 100 may thus be reduced.

FIGS. 2A through 5C illustrate embodiments where memory cubes 50 are formed by wafer-on-wafer (WoW) stacking, e.g., where a wafer stack is formed and then singulated to form multiple memory cubes 50. As will be discussed in greater detail below, in some embodiments, memory cubes 50 can be formed by chip-on-chip (CoC) stacking, e.g., where a wafer is singulated to form a plurality of integrated circuit devices, and integrated circuit devices are stacked to form a memory cube 50. Such memory cubes 50 may also be used in the formation of HBM devices, such as those described with respect to FIGS. 3A through 5C.

FIGS. 6A through 6F are cross-sectional views of intermediate steps during a process for forming a memory cube 50, in accordance with some other embodiments. As will be discussed in greater detail below, FIGS. 6A through 6F illustrate a process in which a memory cube 50 is formed by stacking multiple first integrated circuit devices on a carrier substrate 52. The first integrated circuit devices may each have a structure similar to the integrated circuit device 10 discussed above with reference to FIG. 1, and in an embodiment may be memory devices. Stacking of first integrated circuit devices to form a memory cube 50 in one device region 52A of the carrier substrate 52 is illustrated, but it should be appreciated that the carrier substrate 52 may have any number of device regions, and a memory cube 50 may be formed in each device region. The memory cube 50 is formed in a top-down (or reverse) manner by chip-on-chip (CoC) stacking, where a singulated integrated circuit device for the top layer of the memory cube 50 is provided, and singulated integrated circuit devices for underlying layers of the memory cube 50 are subsequently stacked on the top integrated circuit device. Each layer of the memory cube 50 is encapsulated. The memory cubes 50 are tested after formation to reduce or prevent subsequent processing of known bad memory cubes 50.

Figure 6A:
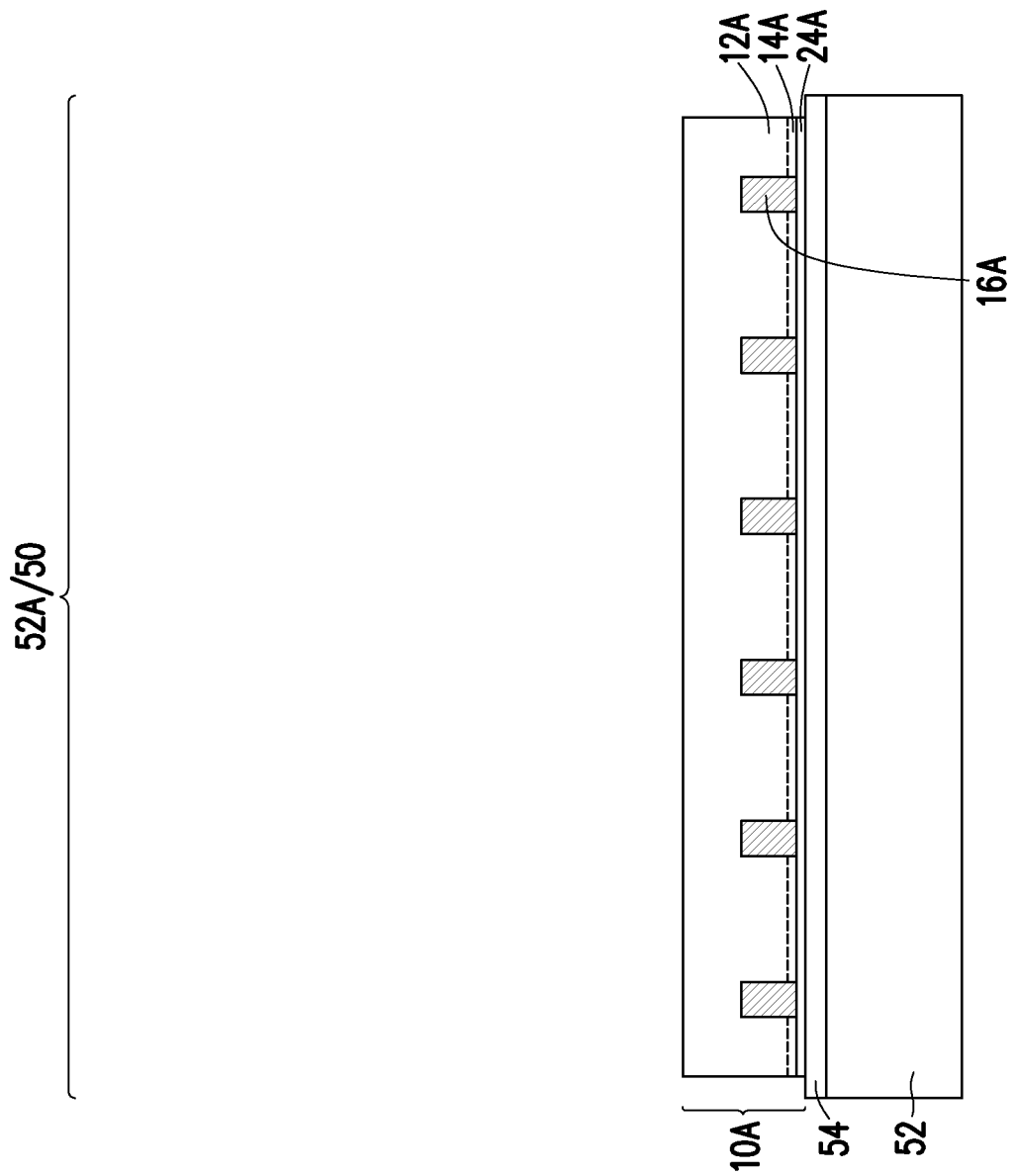

In FIG. 6A, a carrier substrate 52 is provided, and a release layer 54 is formed on the carrier substrate 52. The carrier substrate 52 may be similar to that described with respect to FIG. 2A. The release layer 54 may be similar to that described with respect to FIG. 2A.

A singulated memory device 10A is then stacked on the carrier substrate 52. The memory device 10A includes a semiconductor substrate 12A, an interconnect structure 14A, conductive vias 16A, and a dielectric layer 24A, but does not include die connectors in the dielectric layer 24A at this step of processing. Die connectors suitable for use with reflowable connectors, such as microbumps, may be formed in the dielectric layer 24A during subsequent processing steps.

In FIG. 6B, the singulated memory device 10A is thinned. The thinning may be by a CMP process, a grinding process, an etch back process, the like, or combinations thereof, and is performed on the inactive surface of the semiconductor substrate 12A. The thinning exposes the conductive vias 16A. After the thinning, surfaces of the conductive vias 16A and the inactive surface of the semiconductor substrate 12A are coplanar (within process variations). As such, the conductive vias 16A are exposed at the back side of the memory device 10A.

Figure 6C:
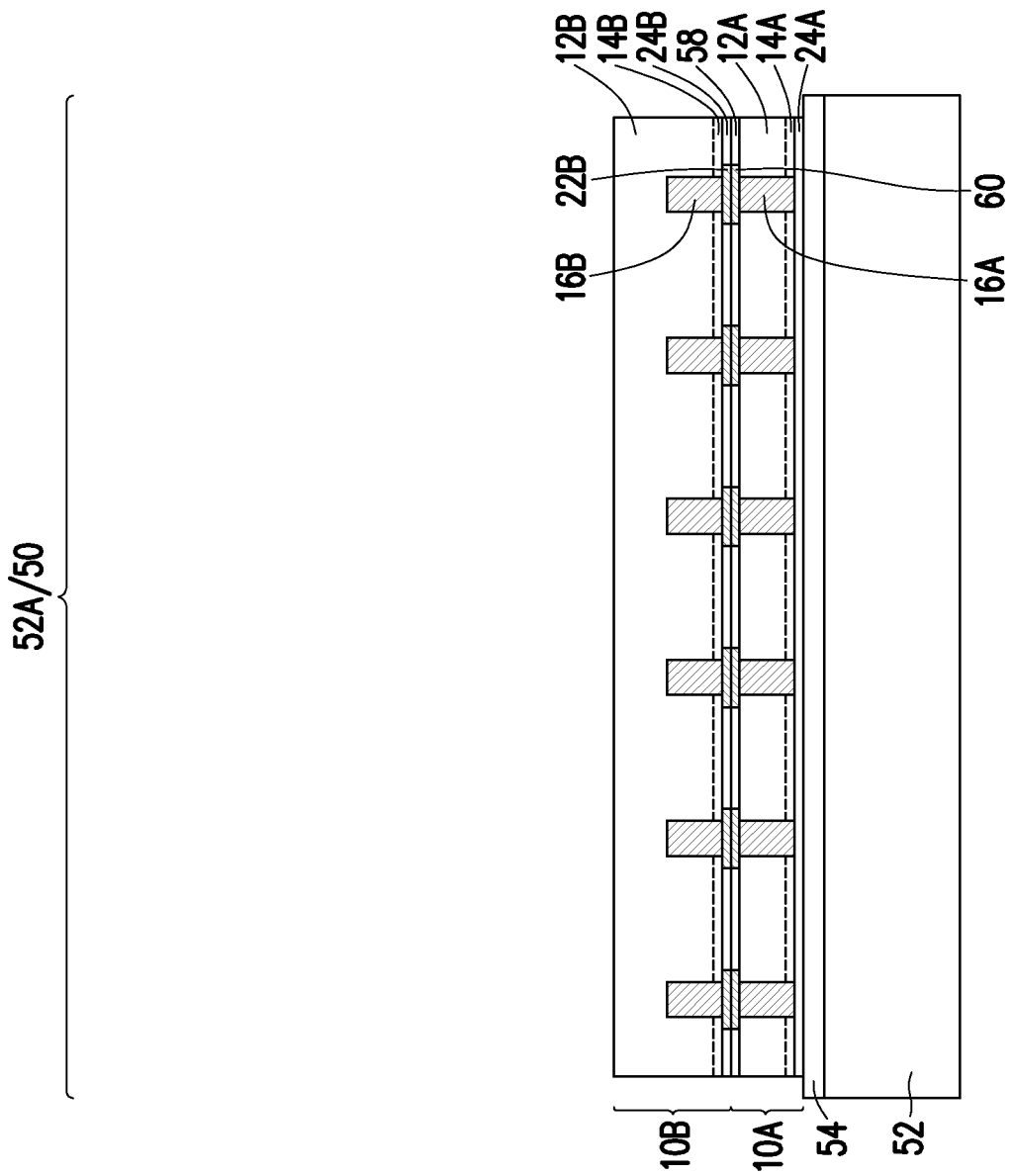

In FIG. 6C, a singulated memory device 10B is stacked over the memory device 10A. In particular, the front side of the memory device 10B is attached to the back side of the memory device 10A. The memory device 10B includes a semiconductor substrate 12B, an interconnect structure 14B, conductive vias 16B, die connectors 22B, and a dielectric layer 24B. The memory device 10A and the memory device 10B are directly bonded in a back-to-face manner by hybrid bonding, such that the back side of the memory device 10A is bonded to the front side of the memory device 10B. Hybrid bonding may be performed in a similar manner as described with respect to FIG. 2C. For example, die connectors 60 and a dielectric layer 58 may be formed at the back side of the memory device 10B. The dielectric layer 58 is bonded to the dielectric layer 24B through dielectric-to-dielectric bonding, without using any adhesive material (e.g., die attach film), and the die connectors 60 are bonded to the die connectors 22B through metal-to-metal bonding, without using any eutectic material (e.g., solder).

Figure 6D:
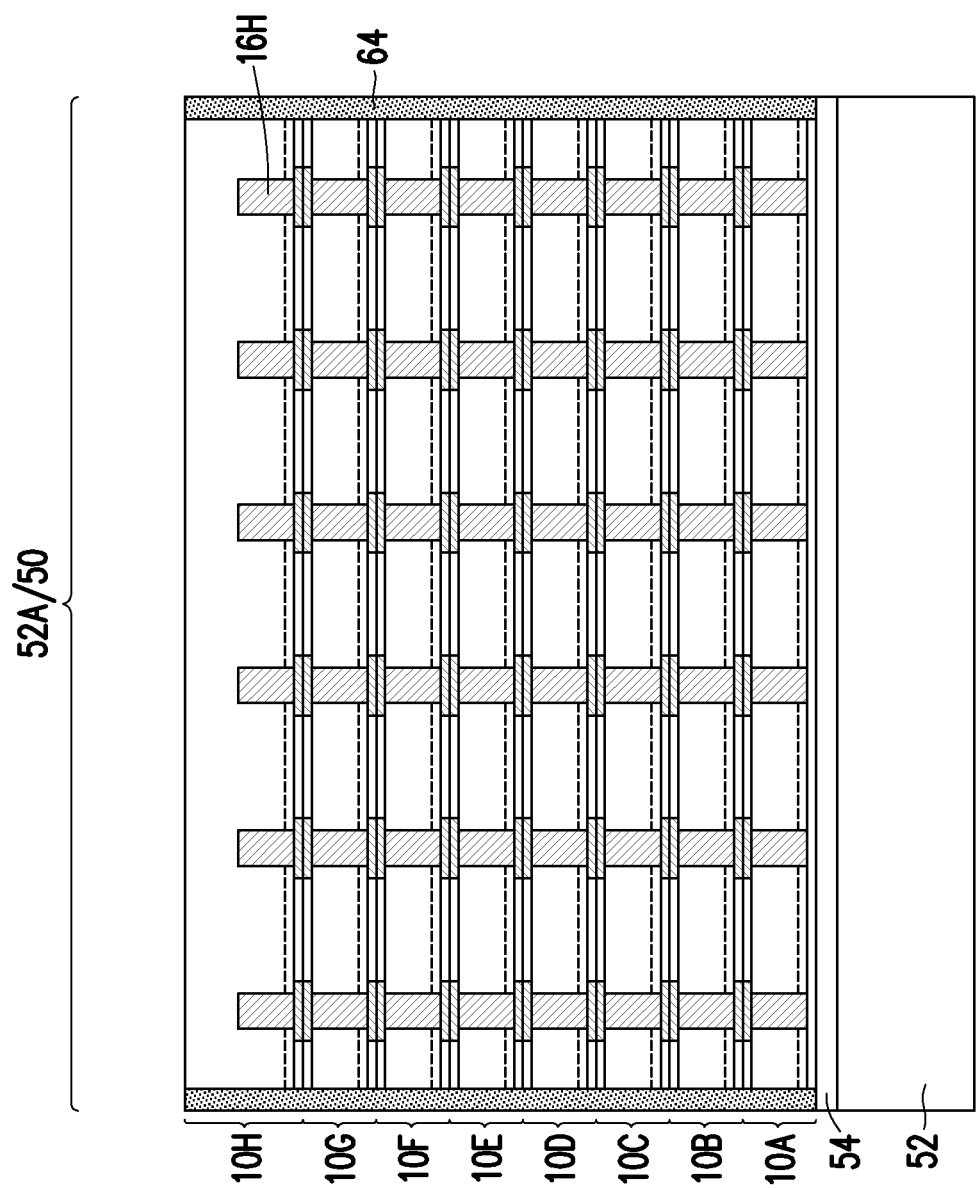

In FIG. 6D, the steps described above are repeated so that singulated memory devices 10C, 10D, 10E, 10F, 10G, 10H are stacked over the carrier substrate 52. Each of the memory devices 10C, 10D, 10E, 10F, 10G, 10H is directly bonded to, respectively, the memory devices 10B, 10C, 10D, 10E, 10F, 10G, in a back-to-face manner by hybrid bonding. The last memory device that is stacked, e.g., the memory device 10H, may not be thinned, such that the conductive vias 16H of the memory device 10H remain electrically insulated.

In some embodiments, a dielectric layer 64 is formed surrounding the memory devices 10A, 10B, 10C, 10D, 10E, 10F, 10G, 10H. The dielectric layer 64 fills gaps between the memory devices in the device region 52A and memory devices in adjacent device regions, thus protecting the memory devices. The dielectric layer 64 may be an oxide such as silicon oxide, PSG, BSG, BPSG, or the like; a nitride such as silicon nitride or the like; a polymer such as polybenzoxazole (PBO), polyimide, a benzocyclobuten (BCB) based polymer, or the like; an encapsulant such as a molding compound, epoxy, or the like; the like, or a combination thereof. In some embodiments, the dielectric layer 64 is an oxide such as silicon oxide.

In FIG. 6E, a carrier substrate debonding is performed to detach (or "debond") the carrier substrate 52 from the integrated circuit device stack, e.g., the memory device 10A. In accordance with some embodiments, the debonding includes projecting a light such as a laser light or an UV light on the release layer 54 so that the release layer 54 decomposes under the heat of the light and the carrier substrate 52 can be removed. The wafer stack is then flipped over and placed on a tape (not shown).

Die connectors 22A are then formed at a front side of the memory device 10A. The die connectors 22A may be formed of a similar material and by a similar method as those described with respect to FIG. 2E.

Figure 6F:
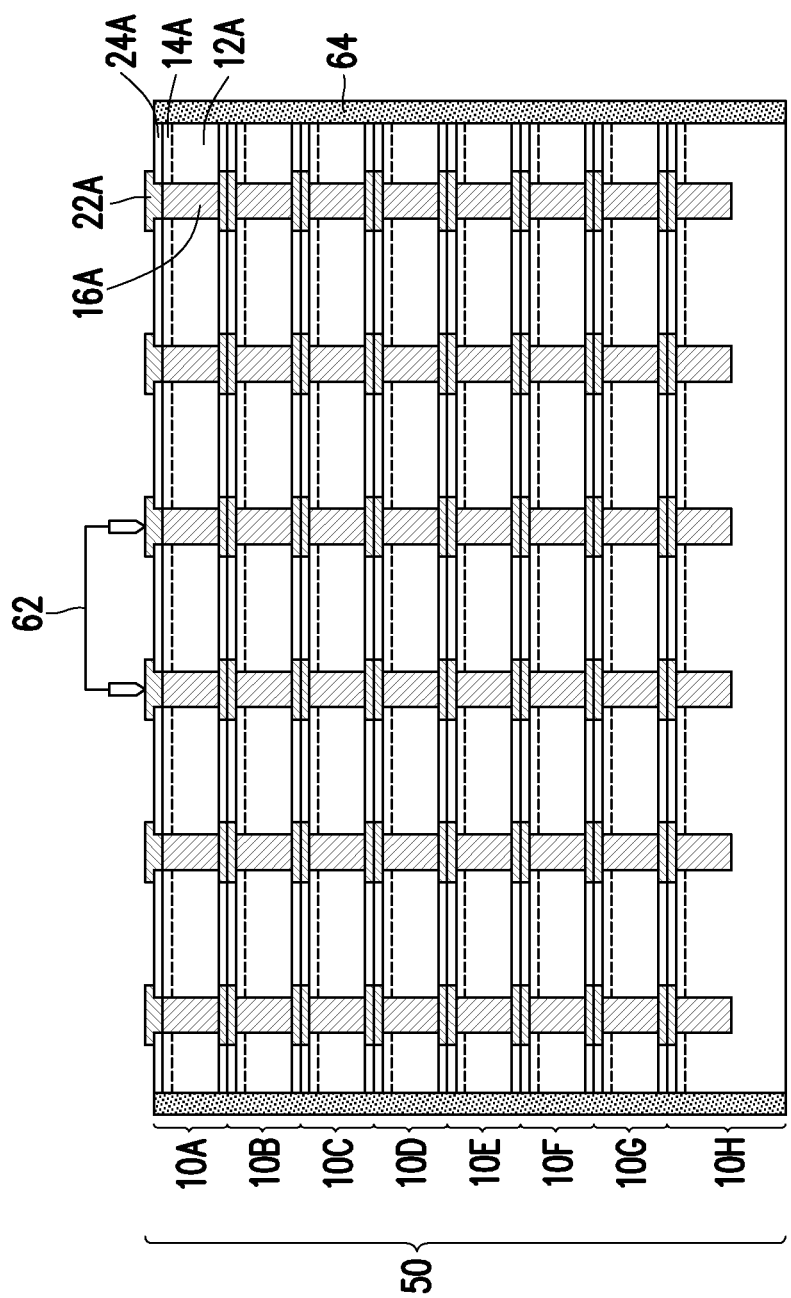

In FIG. 6F, a singulation process is performed along scribe line regions, e.g., between the device region 52A and adjacent device regions. The singulation may be by sawing, laser cutting, or the like. The singulation process can be performed before or after the die connectors 22A are formed. The singulation separates the device region 52A from adjacent device regions. The resulting, singulated memory cube 50 is from the device region 52A. After singulation, the dielectric layer 64 laterally encapsulates the memory devices, and the dielectric layer 64 is laterally coterminous (within process variations) with sidewalls of the memory cube 50.

It should be appreciated that the memory cube 50 may include any number of layers. In the embodiment shown, the memory cube 50 includes eight layers. In another embodiment, the memory cube 50 includes more or less than eight layers, such as two layers, four layers, sixteen layers, thirty two layers, or the like.

After formation of the memory cube 50 is complete (e.g., after formation of the die connectors 22A and singulation of the memory cube 50), the resulting memory cube 50 is tested by use of a probe 62. The probe 62 is physically and electrically connected to the die connectors 22A. The die connectors 22A are used to test the memory cube 50, such that only known good memory cubes are used for further processing. The testing may include testing of the functionality of the memory devices 10A, 10B, 10C, 10D, 10E, 10F, 10G, 10H, or may include testing for known open or short circuits that may be expected based on the design of the memory devices. During the testing, all of the memory devices of the memory cube 50 may be tested in a daisy-chain manner.

Figure 7:
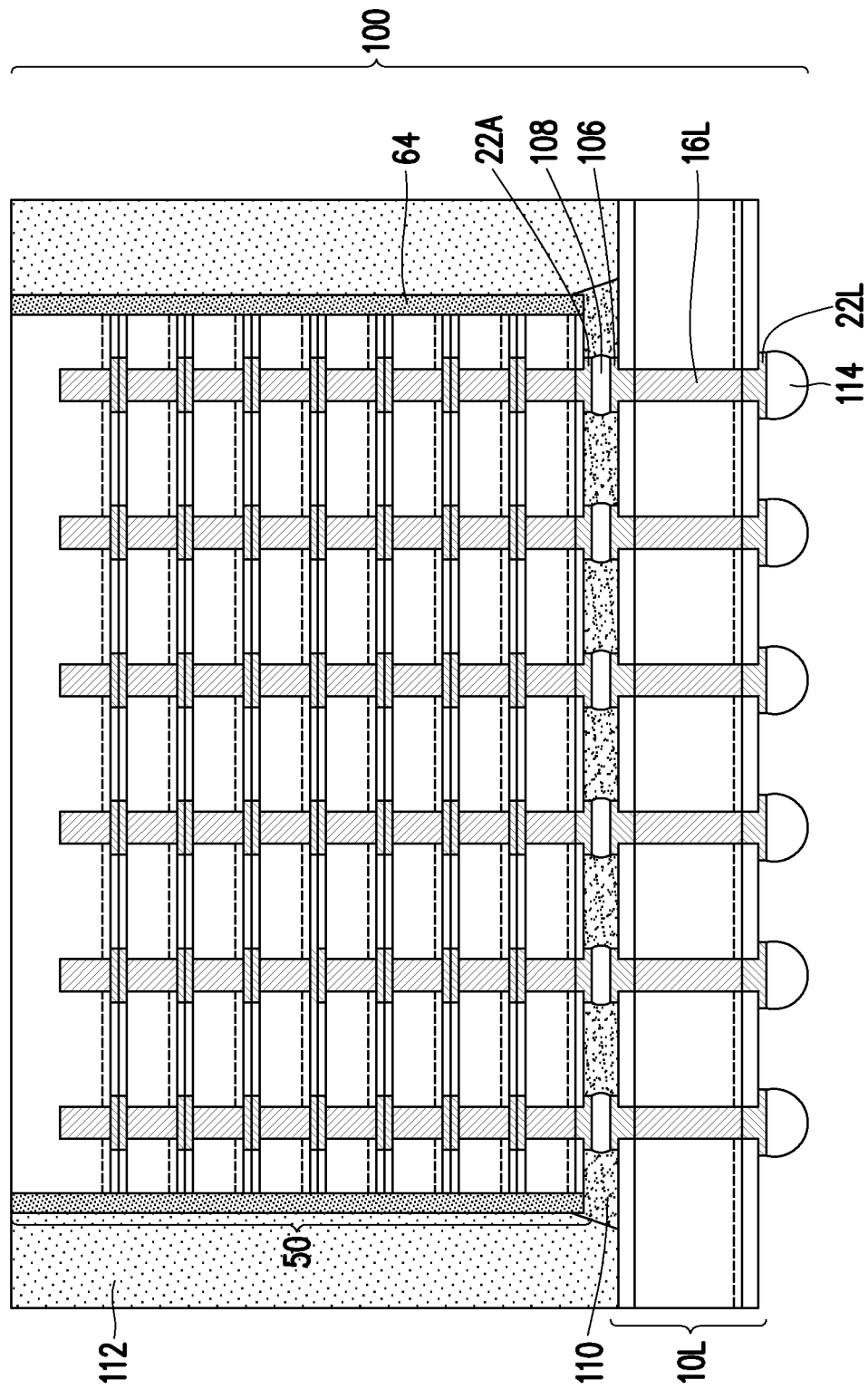
FIGS. 7 through 9 are cross-sectional views of HBM devices, in accordance with some other embodiments.
Figure 8:
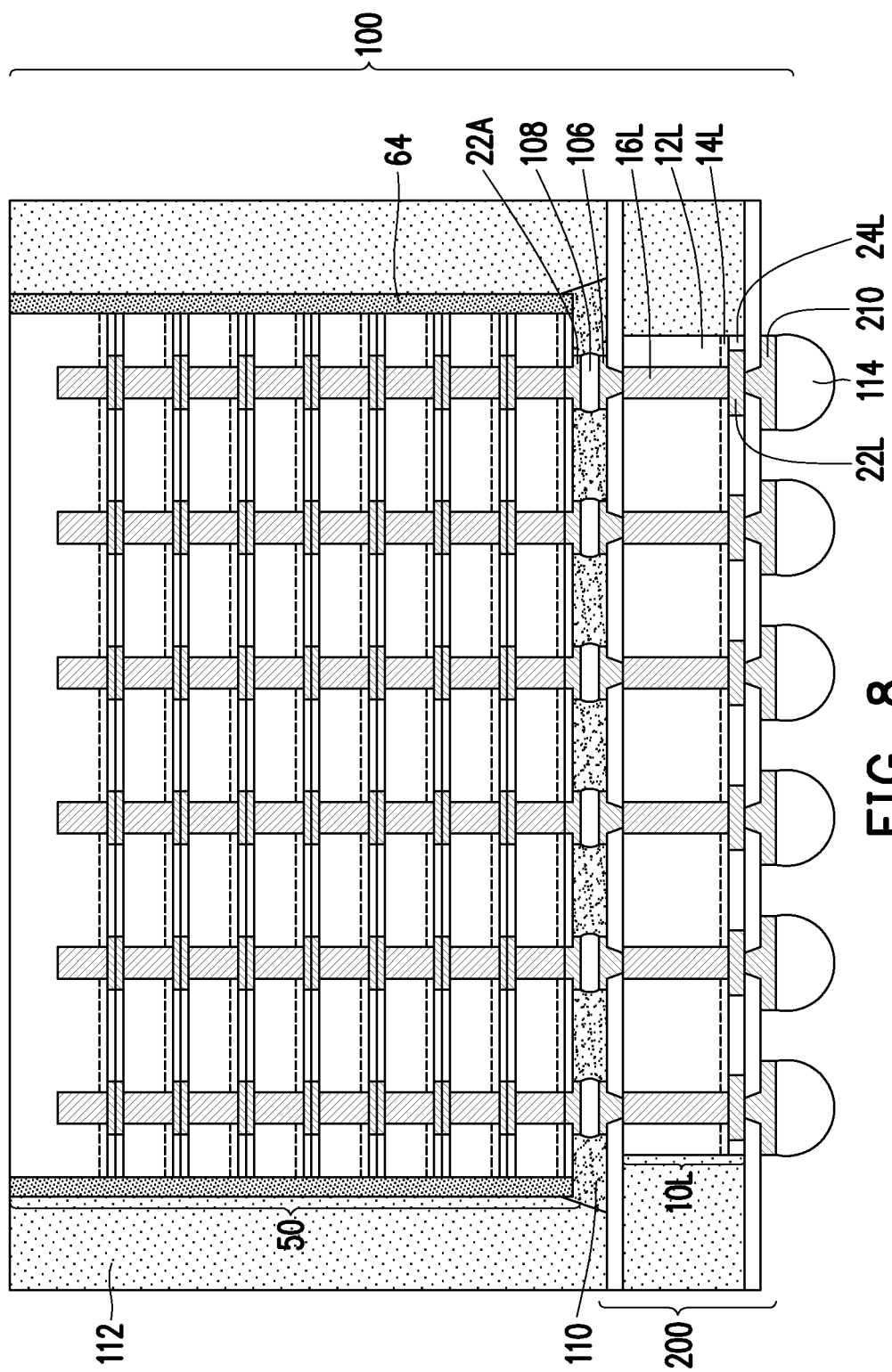
Figure 9:
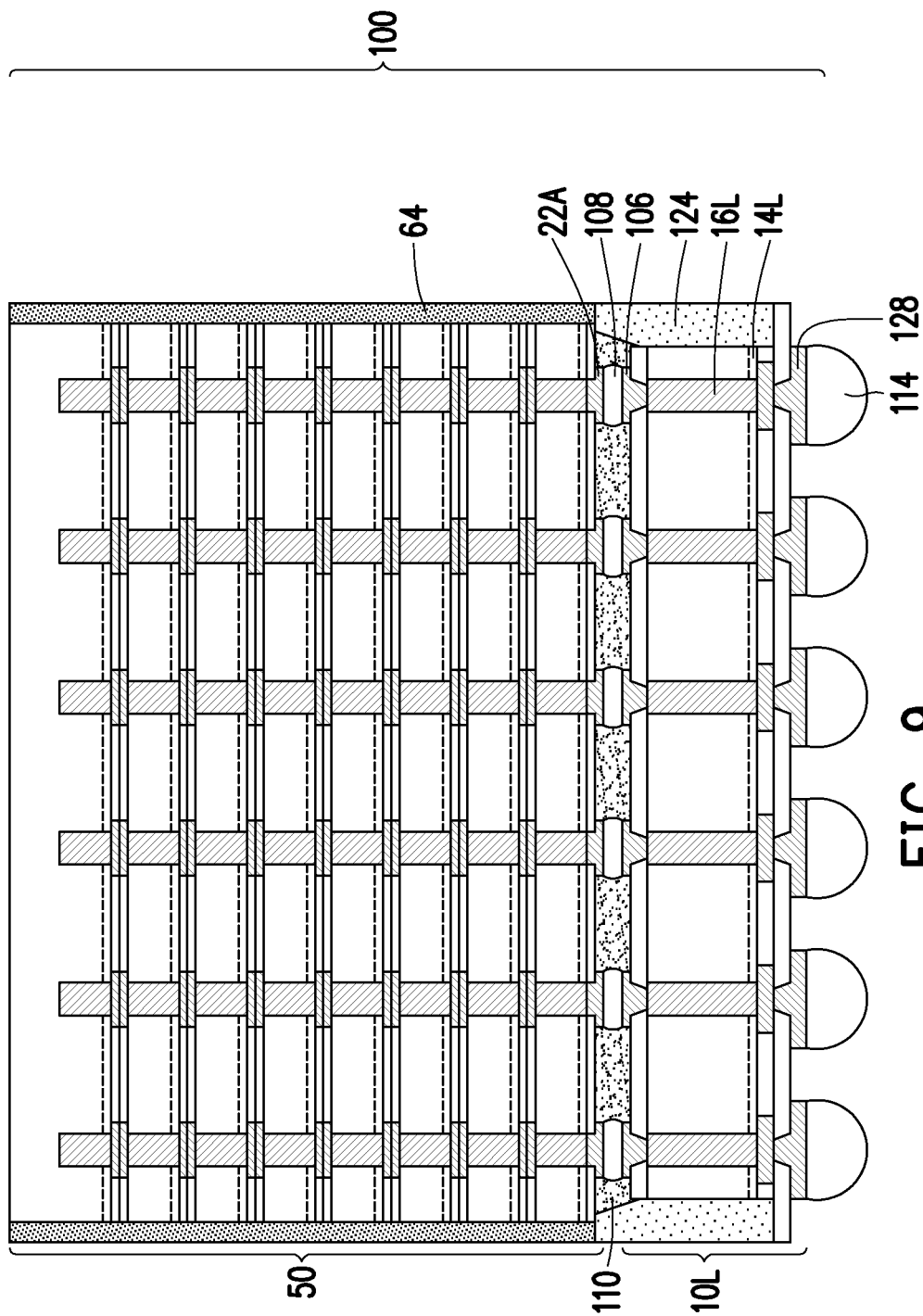

Subsequently, the memory cube 50 may be used in the formation of a high bandwidth memory (HBM) device. FIGS. 7 through 9 are cross-sectional views of HBM devices 100 implementing the memory cube 50, in accordance with some embodiments.

FIG. 7 shows an embodiment where a HBM device 100 is formed by stacking a memory cube 50 on a second integrated circuit device (e.g., a logic device 10L), such as a bare die. The HBM device 100 of FIG. 7 can be formed by a similar process as that described with respect to FIGS. 3A through 3D, except with a memory cube 50 formed by CoC stacking, such as a memory cube formed by the process described with respect to FIGS. 6A through 6F.

FIG. 8 shows an embodiment where a HBM device 100 is formed by stacking a memory cube 50 on a package component 200 that includes a second integrated circuit device (e.g., a logic device 10L). The HBM device 100 of FIG. 7 can be formed by a similar process as that described with respect to FIGS. 4A through 4D, except with a memory cube 50 formed by CoC stacking, such as a memory cube formed by the process described with respect to FIGS. 6A through 6F.

FIG. 9 shows an embodiment where a HBM device 100 is formed by stacking a second integrated circuit device (e.g., a logic device 10L) on a memory cube 50 before the memory cube 50 is singulated. The HBM device 100 of FIG. 7 can be formed by a similar process as that described with respect to FIGS. 5A through 5C, except with a memory cube 50 formed by CoC stacking, such as a memory cube formed by the process described with respect to FIGS. 6A through 6F.

FIGS. 2A through 9 illustrate embodiments where memory cubes 50 are formed to only include memory devices. As will be discussed in greater detail below, in some embodiments, memory cubes 50 can be formed to include other devices, such as passive devices, that are used by the memory devices of the memory cubes.

FIGS. 10A through 10E are cross-sectional views of intermediate steps during a process for forming a memory cube 50, in accordance with some embodiments. As will be discussed in greater detail below, FIGS. 10A through 10E illustrate a process in which a memory cube 50 is formed by stacking multiple wafers that include first integrated circuit devices on a carrier substrate 52. The first integrated circuit devices may each have a structure similar to the integrated circuit device 10 discussed above with reference to FIG. 1, and in an embodiment may be memory devices. In this embodiment, a passive device is included in the wafer stack, such as at an intermediate level of the wafer stack. The wafer stack is singulated to form multiple memory cubes 50. Stacking of wafers to form a memory cube 50 in one device region 52A of the carrier substrate 52 is illustrated, but it should be appreciated that the carrier substrate 52 may have any number of device regions, and a memory cube 50 may be formed in each device region. The memory cube 50 is formed in a top-down (or reverse) manner by wafer-on-wafer (WoW) stacking, where a wafer for the top layer of the memory cube 50 is provided, and wafers for underlying layers of the memory cube 50 are subsequently stacked on the top wafer. The passive device in this embodiment is included in an intermediate layer of the stack. The memory cubes 50 are tested after formation to reduce or prevent subsequent processing of known bad memory cubes 50.

Figure 10A:
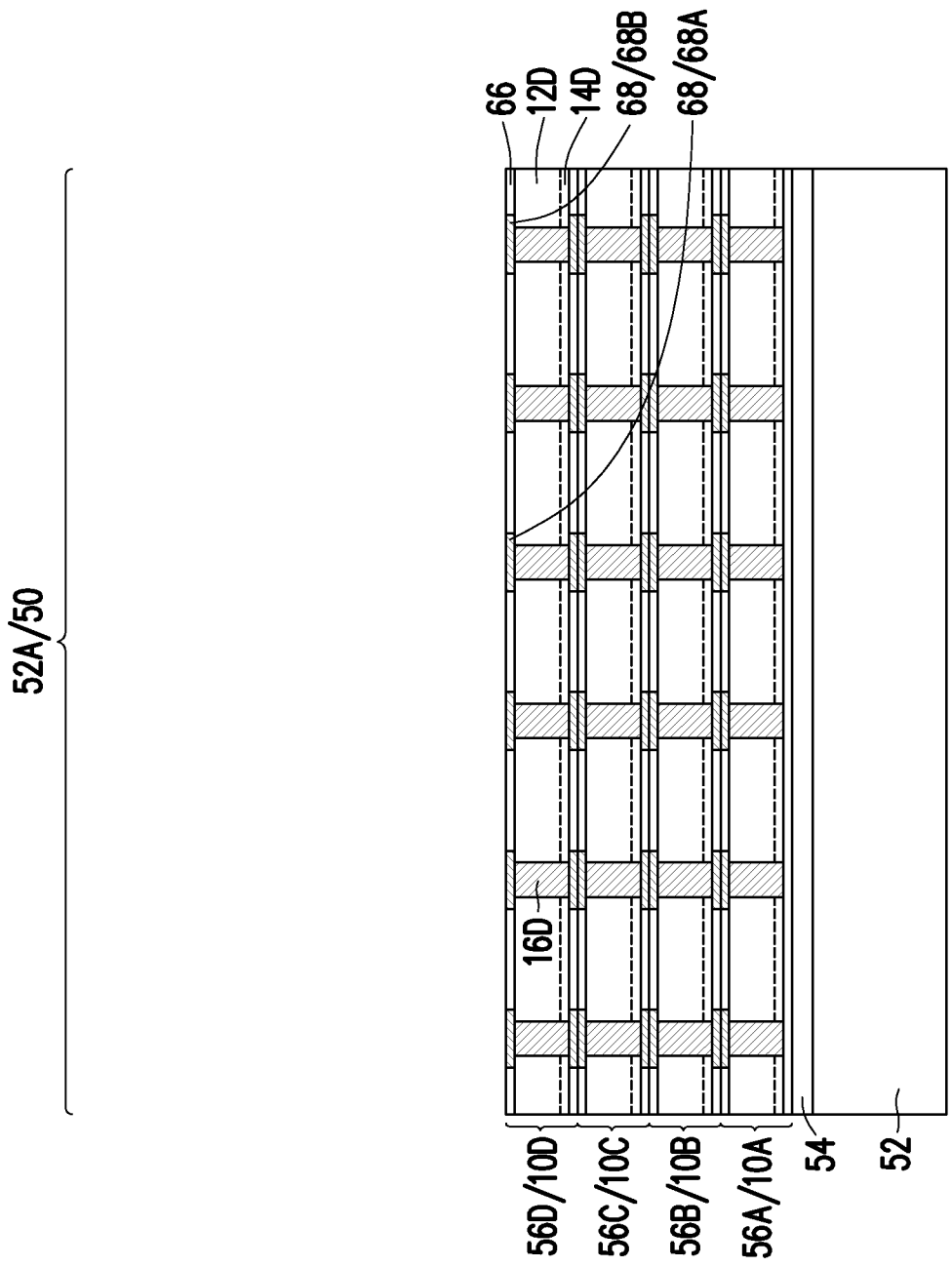
FIGS. 10A through 10E are cross-sectional views of intermediate steps during a process for forming a memory cube, in accordance with some embodiments.

In FIG. 10A, a carrier substrate 52 is provided, and a release layer 54 is formed on the carrier substrate 52. The carrier substrate 52 may be similar to that described with respect to FIG. 2A. The release layer 54 may be similar to that described with respect to FIG. 2A.

Wafers 56A, 56B, 56C, 56D are then stacked over the carrier substrate 52 by performing/repeating the steps described with respect to FIGS. 2A through 2C. The wafers 56A, 56B, 56C, 56D each comprise multiple integrated circuit devices, such as, respectively, memory devices 10A, 10B, 10C, 10D in the device region 52A. The memory devices 10A, 10B, 10C, 10D will be singulated in subsequent processing to be included in the memory cube 50. The wafer 56A is stacked on the carrier substrate 52. Each of the wafers 56B, 56C, 56D is directly bonded to, respectively, the wafers 56A, 56B, 56C in a back-to-face manner by hybrid bonding.

A dielectric layer 66 and die connectors 68 are formed at the back side of the wafer 56D. The dielectric layer 66 may be formed of a similar material and by a similar method as the dielectric layer 58 described with respect to FIG. 2C. The die connectors 68 may be formed of a similar material and by a similar method as the die connectors 60 described with respect to FIG. 2C. The die connectors 68 are physically connected to the conductive vias 16D, and are electrically connected to integrated circuits of the memory device 10D by the conductive vias 16D.

Figure 10B:
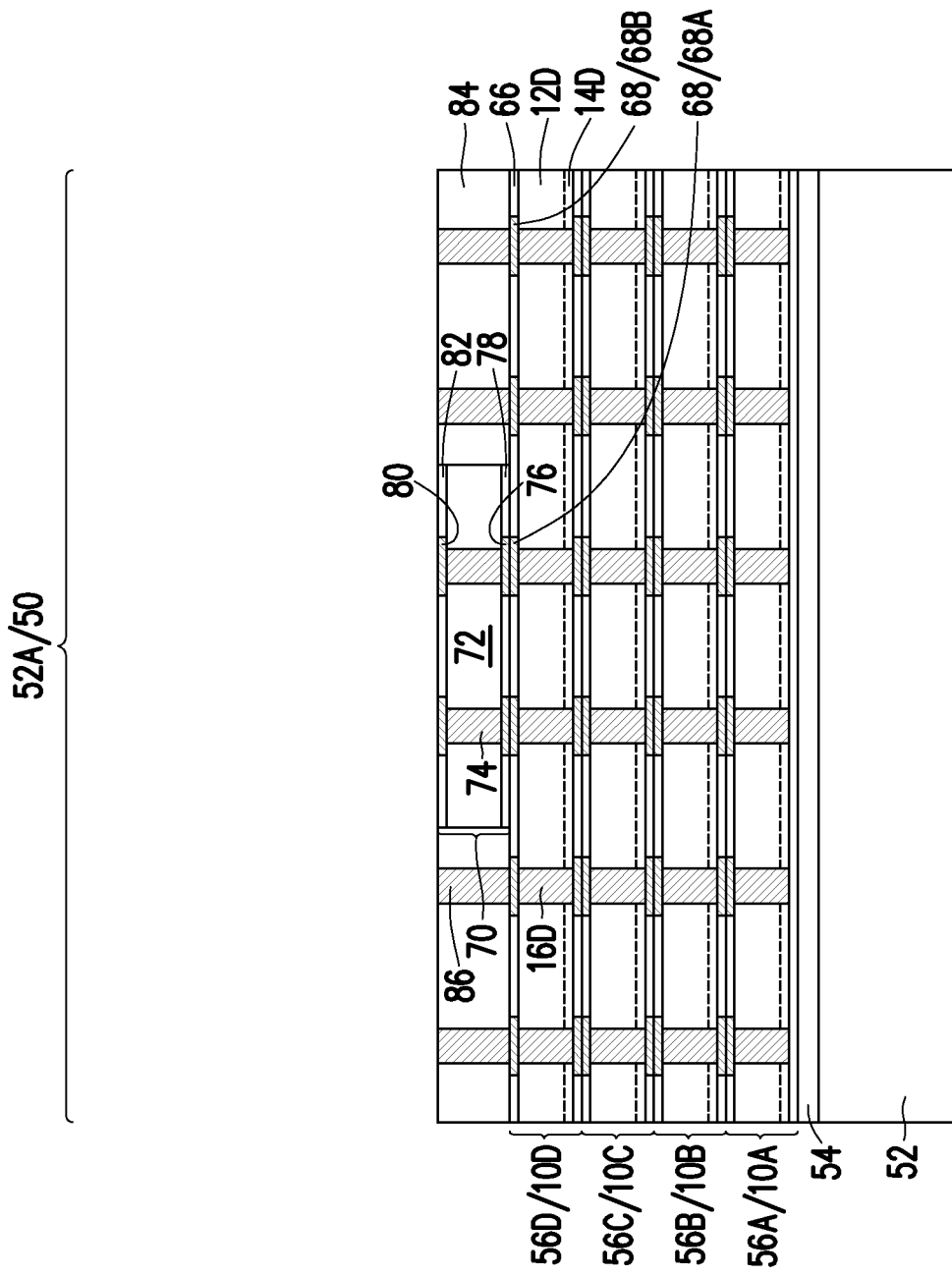

In FIGS. 10B, a passive device 70 is bonded to the memory device 10D, e.g., to the wafer 56D. The passive device 70 can be an integrated passive device (IPD), a power management integrated circuit (PMIC), an integrated voltage regulator (WR), or the like. In some embodiments, the passive device 70 is an WR for the memory devices in the memory cube 50. The passive device 70 includes a substrate 72, which can be similar to the semiconductor substrate 12 described with respect to FIG. 1, but further includes passive devices (e.g., resistors, capacitors, inductors, etc.) and may be free of active devices (e.g., transistors, diodes, etc.). The passive device 70 further includes conductive vias 74, die connectors 76 and a dielectric layer 78 at the front side of the passive device 70, and die connectors 80 and a dielectric layer 82 at the back side of the passive device 70. The conductive vias 74 connect the die connectors 76 to the die connectors 80. The passive device 70 is a singulated device that is bonded to the memory device 10D by hybrid bonding, such that the back side of the memory device 10D is bonded to the front side of the passive device 70. For example, the dielectric layer 66 is bonded to the dielectric layer 78 through dielectric-to-dielectric bonding, without using any adhesive material (e.g., die attach film), and a first subset of the die connectors 68A are bonded to the die connectors 76 through metal-to-metal bonding, without using any eutectic material (e.g., solder).

A dielectric layer 84 is then formed surrounding the passive device 70. The dielectric layer 84 can be formed after placement of the passive device 70 but before annealing to complete the hybrid bonding, or can be formed after annealing. The dielectric layer 84 fills gaps between the passive device 70 in the device region 52A and passive devices in adjacent device regions, thus protecting the passive devices. The dielectric layer 84 may be formed of a similar material and by a similar method as the dielectric layer 64 described with respect to FIG. 6D. In some embodiments, the dielectric layer 84 is an oxide such as silicon oxide.

Conductive vias 86 are then formed to extend through the dielectric layer 84. As an example to form the conductive vias 86, openings are patterned in the dielectric layer 84. The patterning may be by an acceptable process, such as by exposing the dielectric layer 84 to light when the dielectric layer 84 is a photo-sensitive material, or by etching the dielectric layer 84 using, for example, an anisotropic etch. The openings expose a second subset of the die connectors 68B. A seed layer is formed on the dielectric layer 84 and on portions of the die connectors 68B exposed by the openings. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A conductive material is formed on the seed layer. The conductive material may be formed by plating, such as electroplating or electroless plating, or the like. The conductive material may comprise a metal, such as copper, titanium, tungsten, aluminum, or the like. Excess portions of the seed layer and conductive material are then removed, with the excess portions being portions overlying the dielectric layer 84. The removal may be by a planarization process. The planarization process is performed on the seed layer, conductive material, dielectric layer 84, and passive device 70. The removal simultaneously removes excess portions of the seed layer and conductive material and exposes the die connectors 80 and the dielectric layer 82. The planarization process may be, for example, a CMP process, a grinding process, an etch back process, the like, or combinations thereof. The remaining portions of the seed layer and conductive material in the openings form the conductive vias 86. Top surfaces of the conductive vias 86, the dielectric layer 84, the dielectric layer 82, and the die connectors 80 are coplanar (within process variations) after the planarization process.

Figure 10C:
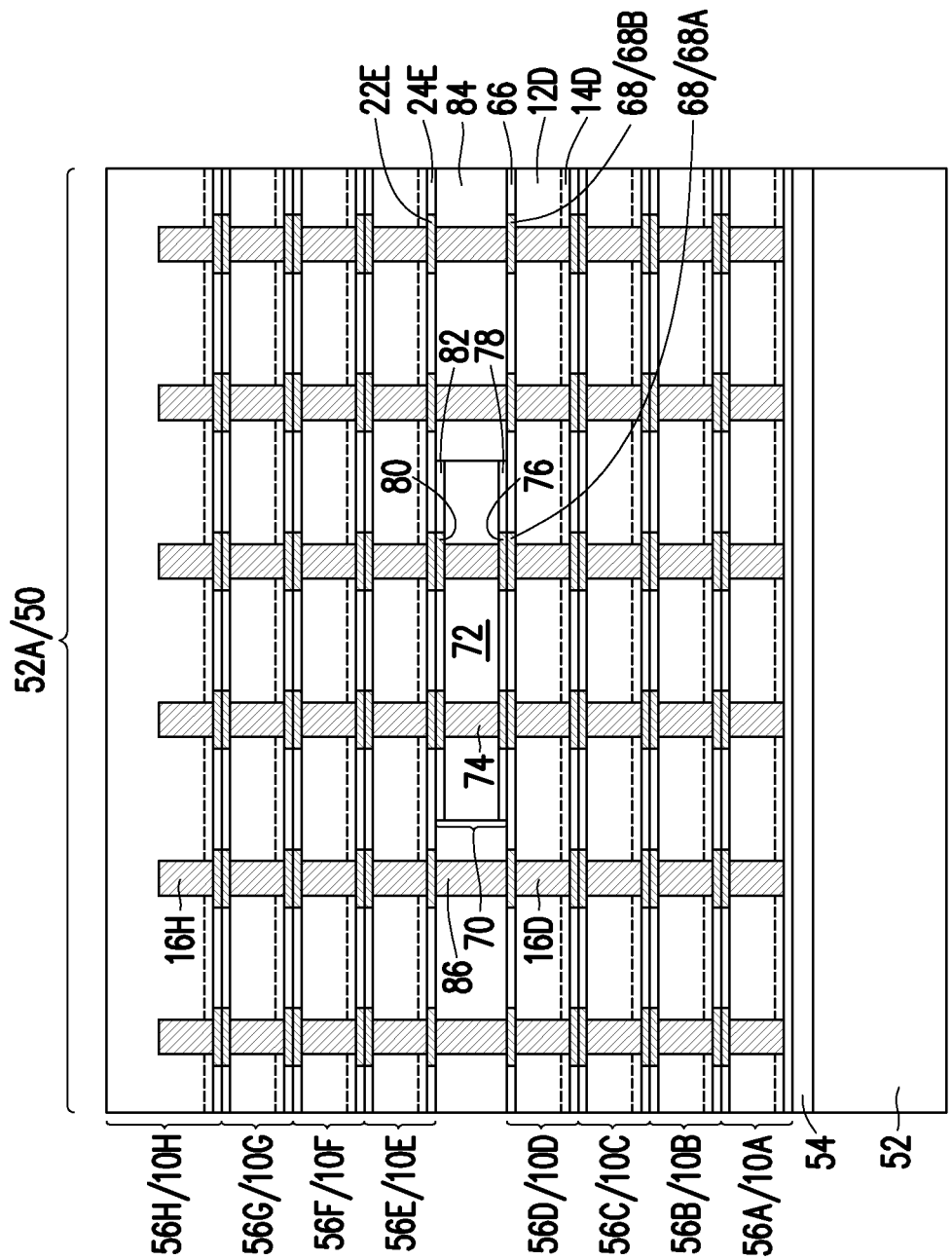

In FIG. 10C, wafers 56E, 56F, 56G, 56H are stacked over the carrier substrate 52 by performing/repeating the steps described with respect to FIGS. 2A through 2C. The wafers 56E, 56F, 56G, 56H each comprise multiple integrated circuit devices, such as, respectively, memory devices 10E, 10F, 10G, 10H in the device region 52A. The memory devices 10E, 10F, 10G, 10H will be singulated in subsequent processing to be included in the memory cube 50. The wafer 56E is bonded to the passive device 70, with some portions of the dielectric layer 84 and the conductive vias 86 participating in the hybrid bonding. For example, the dielectric layer 24E is bonded to the dielectric layer 82 and the dielectric layer 84 through dielectric-to-dielectric bonding, without using any adhesive material (e.g., die attach film), and the die connectors 22E are bonded to the die connectors 80 and the conductive vias 86 through metal-to-metal bonding, without using any eutectic material (e.g., solder). Each of the wafers 56F, 56G, 56H is directly bonded to, respectively, the wafers 56E, 56F, 56G in a back-to-face manner by hybrid bonding. The last wafer that is stacked, e.g., the wafer 56H, may not be thinned, such that the conductive vias 16H of the wafer 56H remain electrically insulated.

Figure 10D:
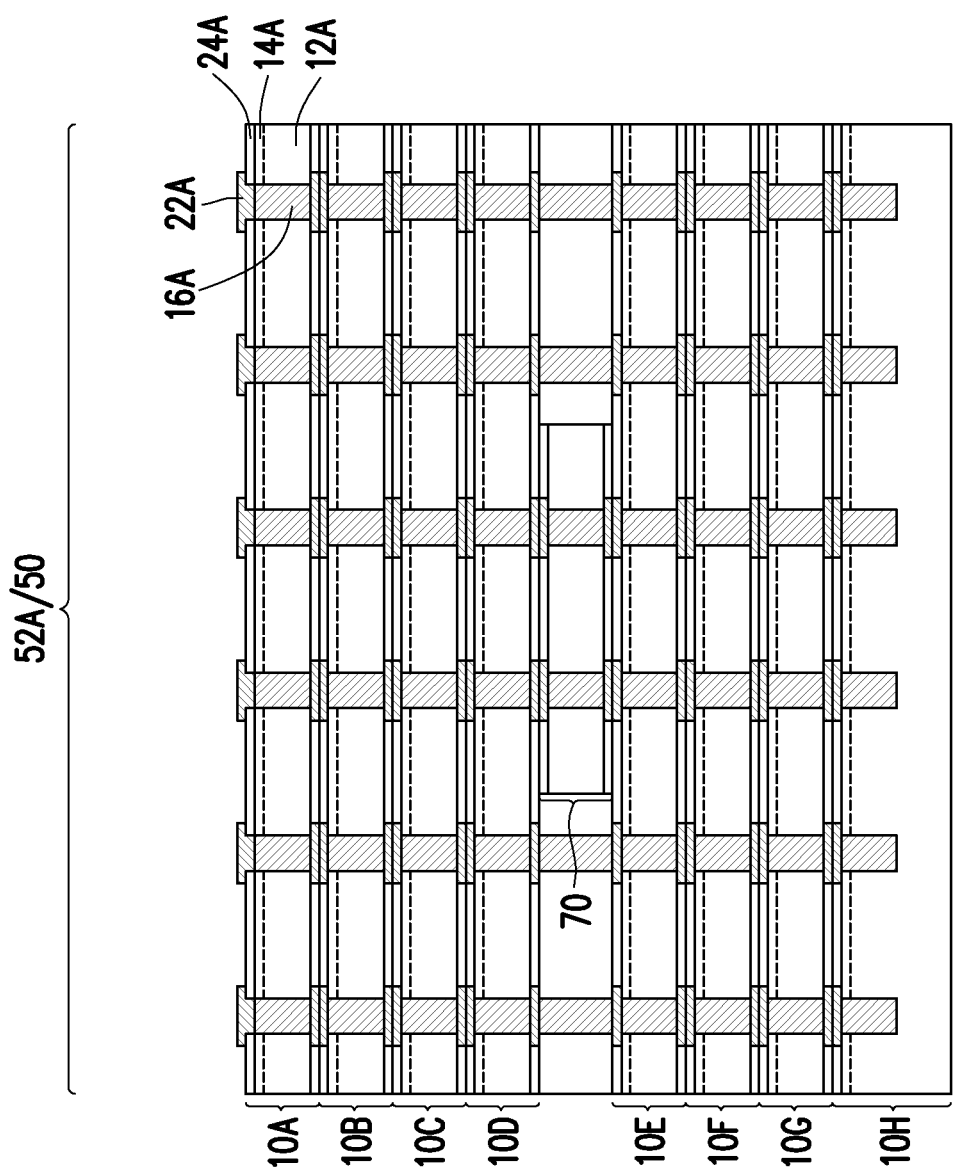

In FIG. 10D, a carrier substrate debonding is performed to detach (or "debond") the carrier substrate 52 from the integrated circuit device stack, e.g., the memory device 10A. In accordance with some embodiments, the debonding includes projecting a light such as a laser light or an UV light on the release layer 54 so that the release layer 54 decomposes under the heat of the light and the carrier substrate 52 can be removed. The wafer stack is then flipped over and placed on a tape (not shown).

Die connectors 22A are then formed at a front side of the memory device 10A. The die connectors 22A may be formed of a similar material and by a similar method as those described with respect to FIG. 2E.

Figure 10E:
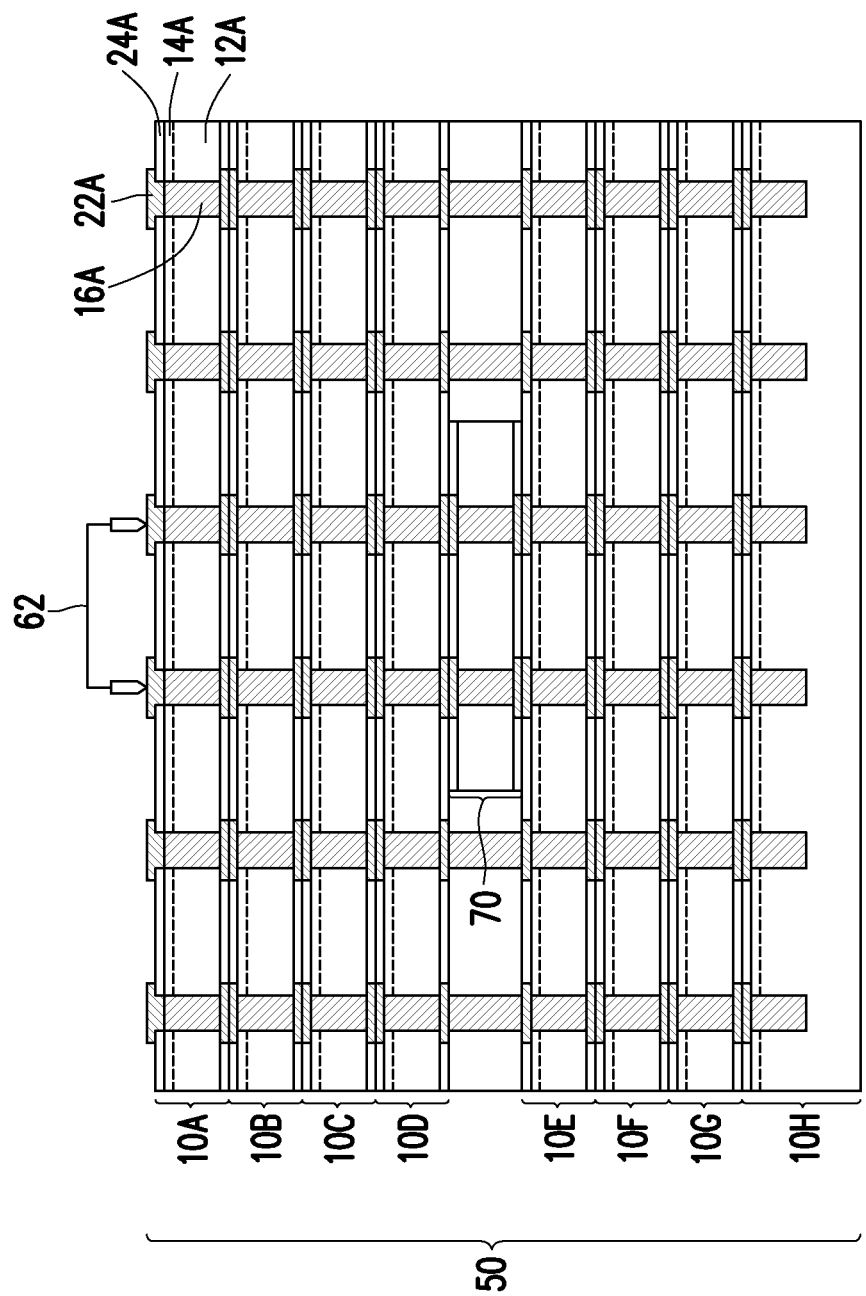

In FIG. 10E, a singulation process is performed along scribe line regions, e.g., between the device region 52A and adjacent device regions. The singulation may be by sawing, laser cutting, or the like. The singulation process can be performed before or after the die connectors 22A are formed. The singulation separates the device region 52A from adjacent device regions. The resulting, singulated memory cube 50 is from the device region 52A.

It should be appreciated that the memory cube 50 may include any number of layers. In the embodiment shown, the memory cube 50 includes eight layers of memory devices and one layer of a passive device. In another embodiment, the memory cube 50 includes more or less than eight layers of memory devices, such as two layers, four layers, sixteen layers, thirty two layers, or the like. The memory cube 50 can also include more than one layer of passive devices.

After formation of the memory cube 50 is complete (e.g., after formation of the die connectors 22A and singulation of the memory cube 50), the resulting memory cube 50 is tested by use of a probe 62. The probe 62 is physically and electrically connected to the die connectors 22A. The die connectors 22A are used to test the memory cube 50, such that only known good memory cubes are used for further processing. The testing may include testing of the functionality of the memory devices 10A, 10B, 10C, 10D, 10E, 10F, 10G, 10H and the passive device 70, or may include testing for known open or short circuits that may be expected based on the design of the memory devices. During the testing, all of the devices of the memory cube 50 may be tested in a daisy-chain manner.

Figure 11:
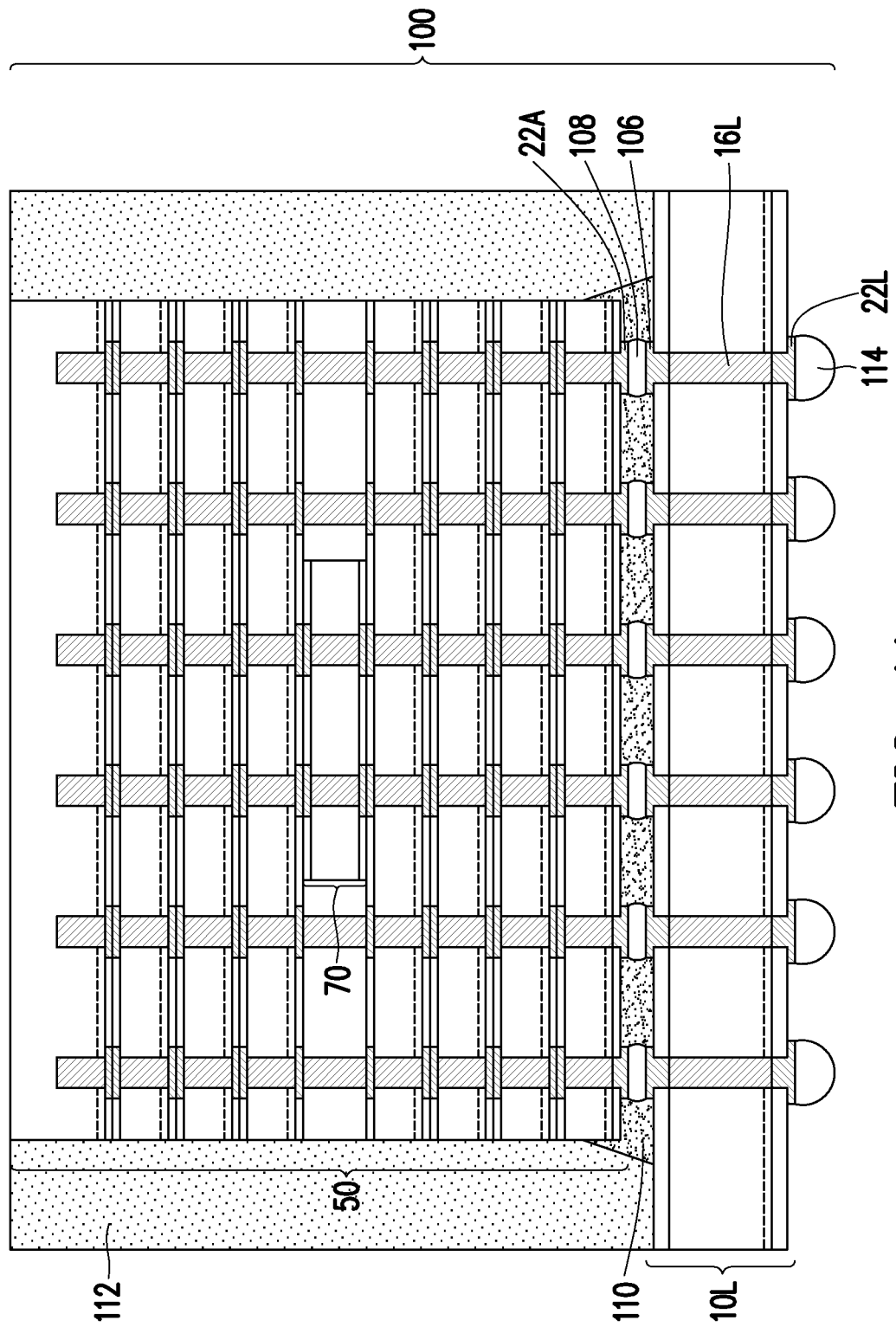
FIGS. 11, 12, and 13 are cross-sectional views of HBM devices, in accordance with some other embodiments.

Subsequently, the memory cube 50 may be used in the formation of a high bandwidth memory (HBM) device. FIG. 11 is a cross-sectional views of a HBM device 100 implementing the memory cube 50, in accordance with some other embodiments. FIG. 11 shows an embodiment where a HBM device 100 is formed by stacking a memory cube 50 on a second integrated circuit device (e.g., a logic device 10L), such as a bare die. The HBM device too of FIG. 11 can be formed by a similar process as that described with respect to FIGS. 3A through 3D, except with a memory cube 50 that includes a passive device 70, such as a memory cube formed by the process described with respect to FIGS. 10A through 10E.

Figure 12:
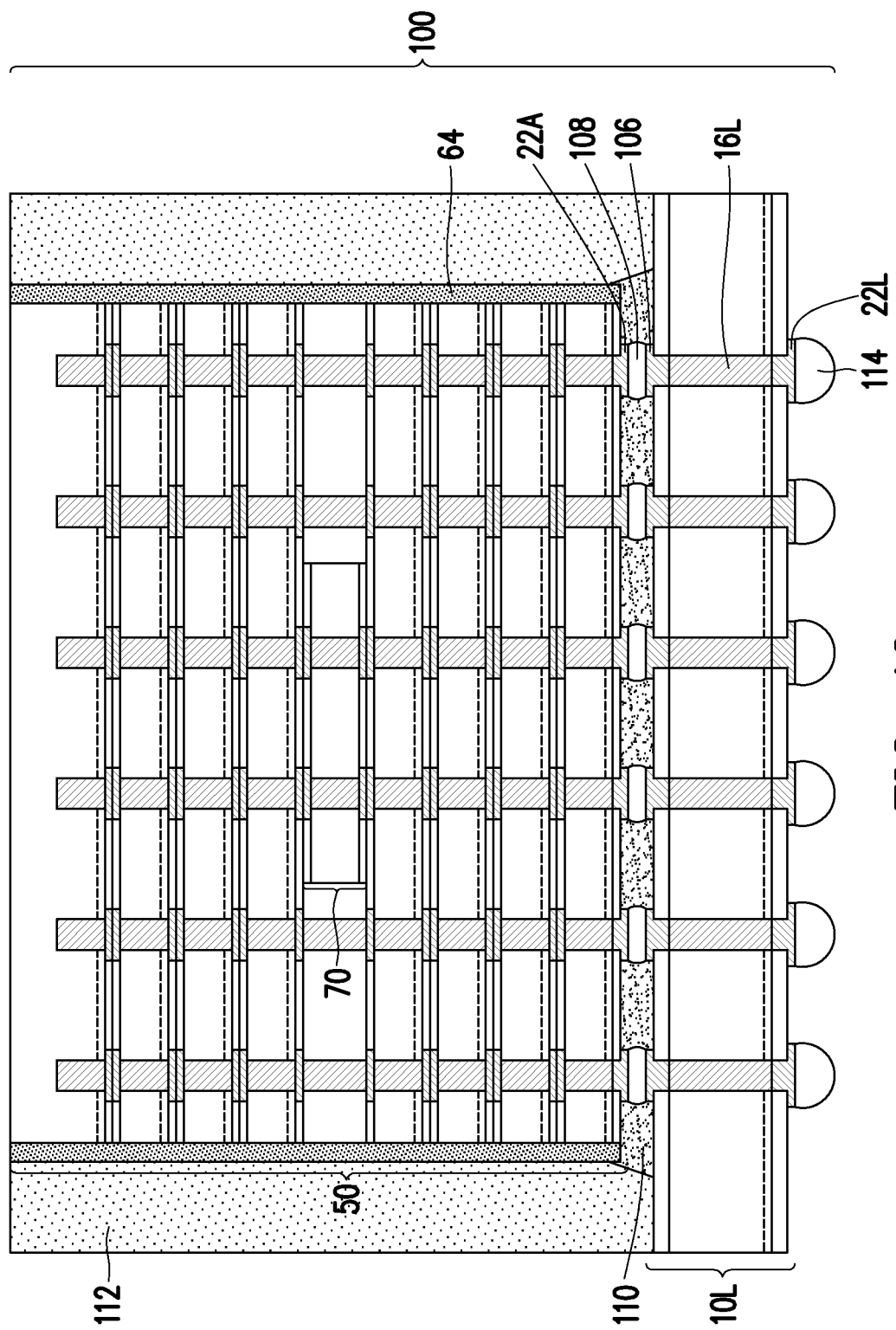

Although FIGS. 10A through 10E show an embodiment where a memory cube 50 with a passive device 70 is formed by wafer-on-wafer (WoW) stacking, it should be appreciated that a memory cube 50 with a passive device 70 may also be formed by chip-on-chip (CoC) stacking, such as by the process shown in FIGS. 6A through 6F. FIG. 12 is a cross-sectional views of a HBM device 100 implementing such a memory cube 50, in accordance with some embodiments. FIG. 12 shows an embodiment where a HBM device 100 is formed by stacking a memory cube 50 on a second integrated circuit device (e.g., a logic device 10L), such as a bare die.

The HBM devices too of FIGS. 11 and 12 are formed by a similar process as that described with respect to FIGS. 3A through 3D, except with a memory cube 50 that includes a passive device 70. It should further be appreciated that HBM devices may also be formed by similar processes as those described with respect to FIGS. 4A through 4D and FIGS. 5A through 5C, except with a memory cube 50 that includes a passive device 70.

Figure 13:
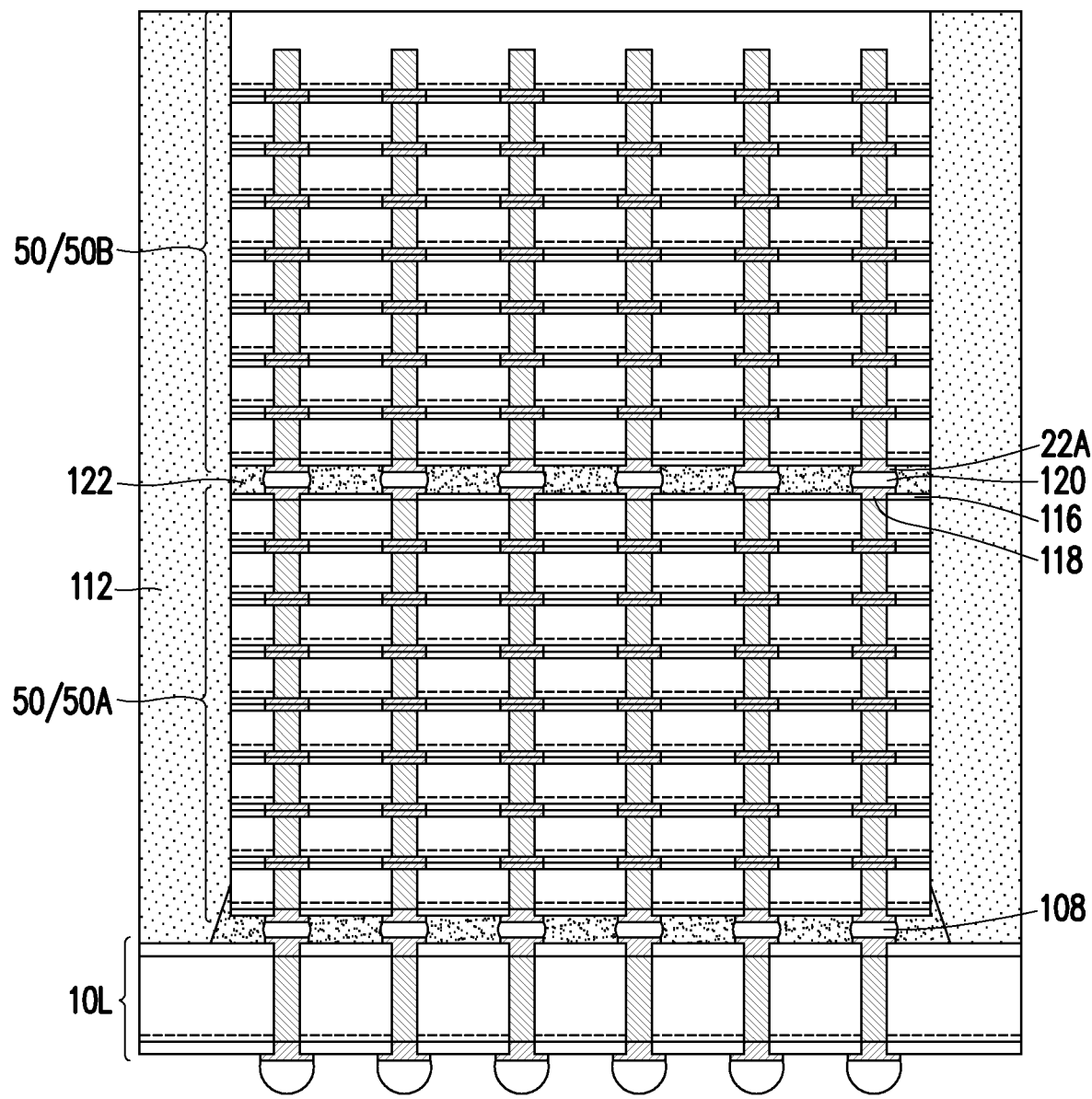

FIG. 13 illustrates a HBM device 100, in accordance with some other embodiments. As will be discussed in greater detail below, FIG. 13 illustrates a device in which multiple memory cubes, such as a memory cube 50A and a memory cube 50B, are stacked on a second integrated circuit device (e.g., a logic device 10L). The encapsulant 112 thus surrounds both of the memory cubes 50A, 50B. The memory cubes 50A, 50B are known good memory cubes that have been tested. The memory cube 50A can be attached to the wafer 102 in a similar manner as described with respect to FIG. 3C. In the illustrated embodiment, die connectors 116 and a dielectric layer 118 are formed at the back side of the bottom device of the memory cube 50A. The die connectors 116 may be formed of a similar material and by a similar method as the die connectors 22A described with respect to FIG. 2E. The dielectric layer 118 may be formed of a similar material and by a similar method as the dielectric layer 58 described with respect to FIG. 2C.

The memory cube 50B can be attached to the memory cube 50A with reflowable connectors 120. The reflowable connectors 120 may be formed of a similar material and by a similar method as the reflowable connectors 108 described with respect to FIG. 3C. The reflowable connectors 120 are used to connect the die connectors 116 of the memory cube 50A to the die connectors 22A of the memory cube 50B.

In some embodiments, an underfill 122 is formed between the memory cube 50A and the memory cube 50B, surrounding the reflowable connectors 120. The underfill 122 may reduce stress and protect the joints resulting from the reflowing of the reflowable connectors 120. The underfill 122 may be formed by a capillary flow process after the memory cubes 50A, 50B are attached, or may be formed by a suitable deposition method before the memory cubes 50A, 503 are attached.

The HBM device 100 of FIG. 13 is formed by a similar process as that described with respect to FIGS. 3A through 3D, except with multiple memory cubes 50A, 503. It should further be appreciated that HBM devices may also be formed by similar processes as those described with respect to FIGS. 4A through 4D and FIGS. 5A through 5C, except with multiple memory cubes 50A, 503.

The memory cube 50 in FIG. 13 is similar to that described with respect to FIG. 2F. It should further be appreciated that a HBM device similar to that of FIG. 13 may be formed using the memory cubes 50 described with respect to FIGS. 6F, 11, and 12.

Figure 14A:
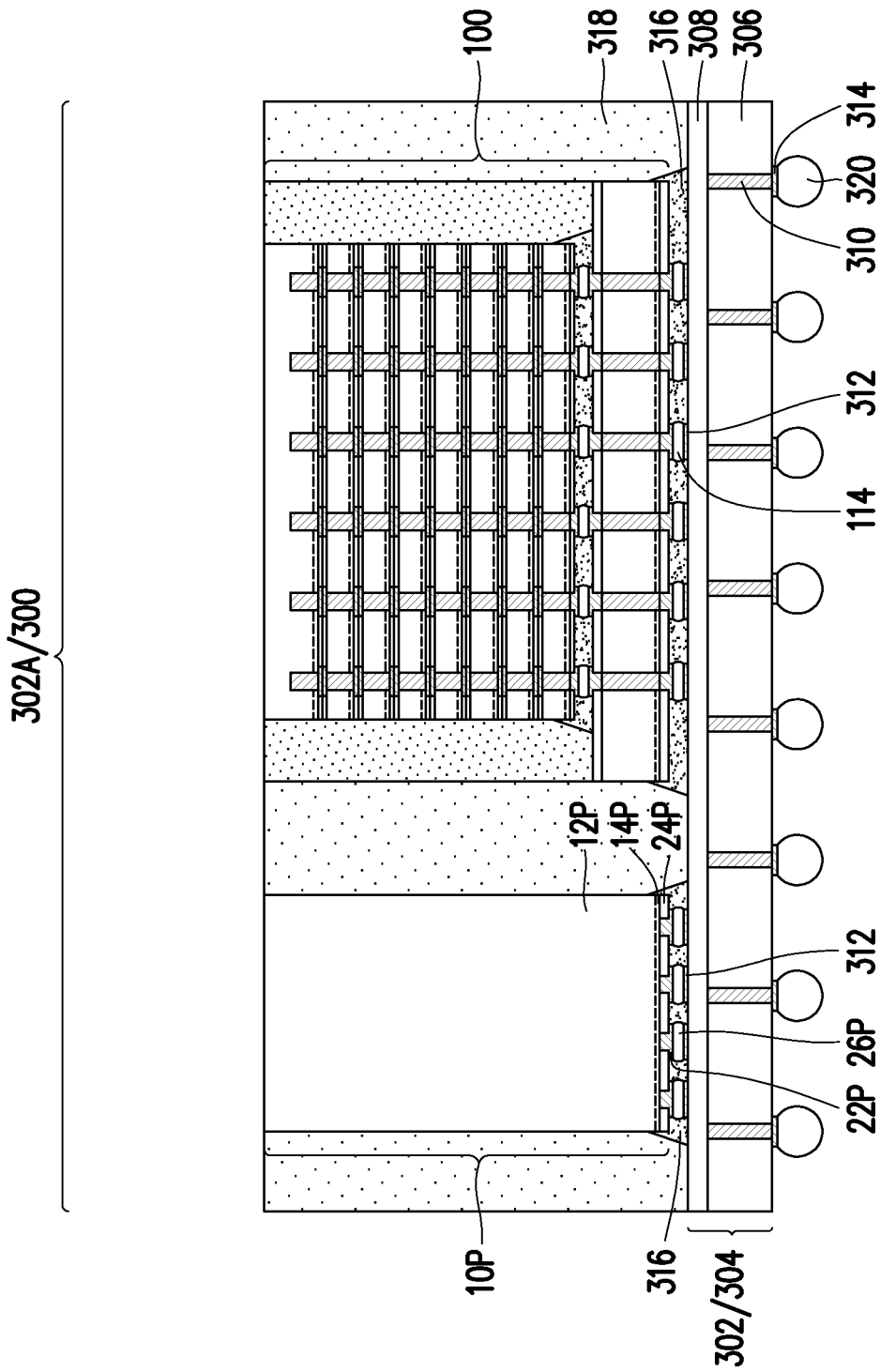
FIGS. 14A and 14B are cross-sectional views of intermediate steps during a process for forming integrated circuit packages, in accordance with some embodiments.
Figure 14B:
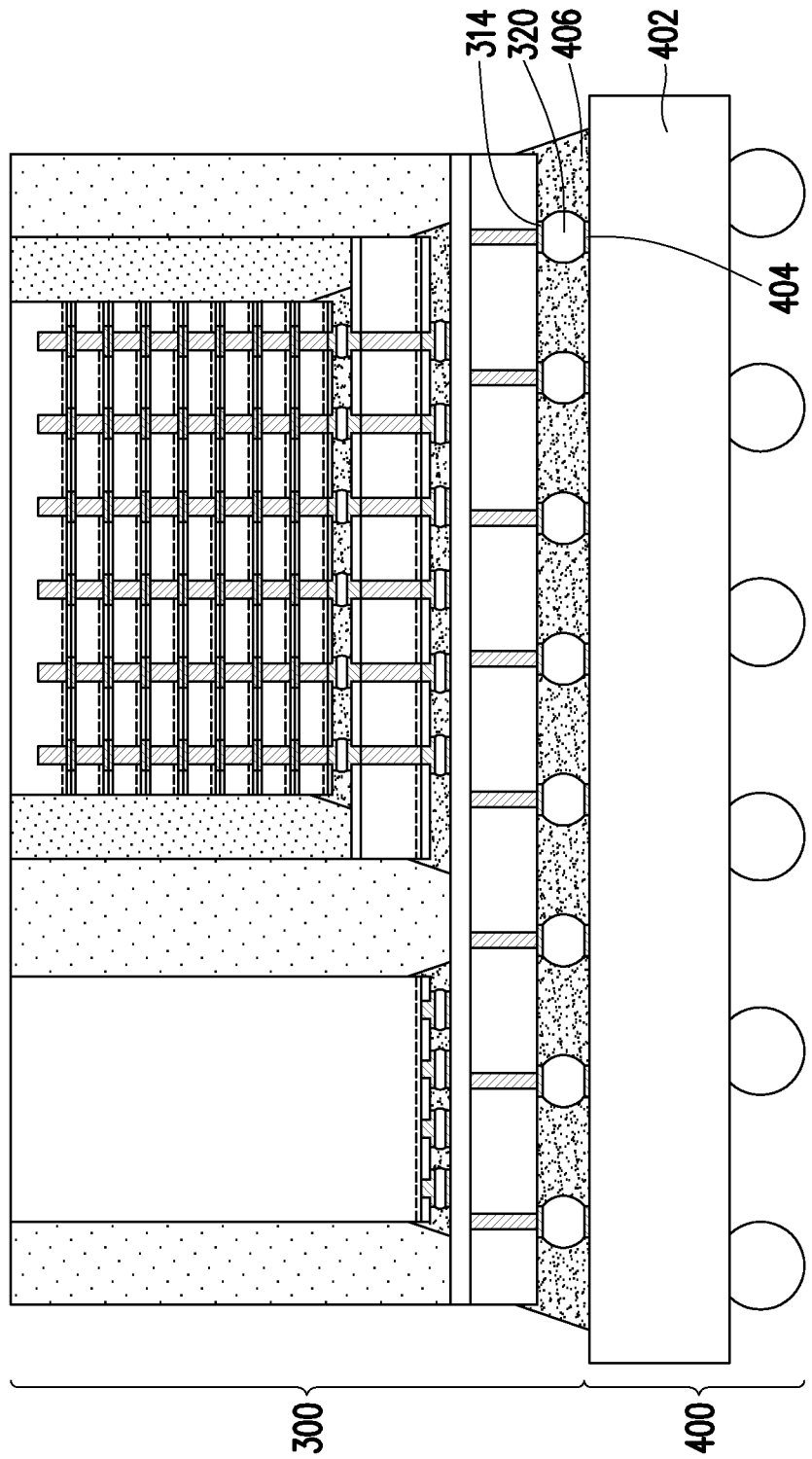

FIGS. 14A and 14B are cross-sectional views of intermediate steps during a process for forming integrated circuit packages, in accordance with some embodiments. As will be discussed in greater detail below, FIGS. 14A and 14B illustrate a process in which a HBM device 100 is packaged into an integrated circuit package 300 (see FIG. 14A), such as a CoW package. The integrated circuit package 300 is then mounted to a package substrate 400 (see FIG. 14B) to form another package, such as a CoWoS package. The integrated circuit package 300 is formed by stacking the HBM device 100 and a third integrated circuit device on a wafer 302. The third integrated circuit device may have a structure similar to the integrated circuit device 10 discussed above with reference to FIG. 1, and in an embodiment may be a processor device. Formation of integrated circuit packages in one package region 302A of the wafer 302 is illustrated, but it should be appreciated that the wafer 302 may have any number of device regions, and a HBM device 100 may be stacked in each device region.

In FIG. 14A the wafer 302 is obtained. The wafer 302 comprises an interposer 304 in the package region 302A. The interposer 304 will be singulated in subsequent processing to be included in the integrated circuit package 300. The interposer 304 includes a semiconductor substrate 306, an interconnect structure 308, conductive vias 310, and die connectors 312, which can be similar to, respectively, the semiconductor substrate 12, the interconnect structure 14, the conductive vias 16, and the die connectors 22 of the integrated circuit device 10 discussed above with reference to FIG. 1, except the semiconductor substrate 306 may be free of active/passive devices, and the die connectors 312 may be connectors that are suitable for use with reflowable connectors, such as microbumps. The interposer 304 further includes external connectors 314, which may be similar to the die connectors 312, and are connected to the conductive vias 310.

A HBM device 100 and a processor device 10P are attached to the wafer 302, e.g., to the interconnect structure 308 of the interposer 304. The processor device 10P can be a processing unit, such as a CPU, a GPU, a SoC, or the like. The processor device 10P includes a semiconductor substrate 12P, an interconnect structure 14P, die connectors 22P, a dielectric layer 24P, and conductive connectors 26P. The processor device 10P is free of TSVs, and the die connectors 22P may be connectors that are suitable for use with reflowable connectors, such as microbumps. The conductive connectors 26P may be formed of a similar material and by a similar method as the conductive connectors 114 described with respect to FIG. 3D. The HBM device 100 may be attached to the die connectors 312 of the wafer 302 by reflowing the conductive connectors 114, and the processor device 10P may be attached to the die connectors 312 of the wafer 302 by reflowing the conductive connectors 26P.

In some embodiments, an underfill 316 is formed between the wafer 302 and each of the HBM device 100 and the processor device 10P, surrounding the conductive connectors 26P and the conductive connectors 114. The underfill 316 may be formed of a similar material and by a similar method as the underfill 110 described with respect to FIG. 3C.

An encapsulant 318 is then formed on and around the various components. After formation, the encapsulant 318 encapsulates the HBM device 100 and the processor device 10P, and contacts the underfill 316. The encapsulant 318 may be formed of a similar material and by a similar method as the encapsulant 112 described with respect to FIG. 3D. A planarization process is optionally performed on the encapsulant 318 to expose the HBM device 100 and/or the processor device 10P.

Conductive connectors 320 are formed on the external connectors 314. The conductive connectors 320 may be formed of a similar material and by a similar method as the conductive connectors 114 described with respect to FIG. 3D.

In FIG. 14B, a singulation process is performed by sawing along scribe line regions, e.g., between the package region 302A and adjacent package regions. The sawing singulates the package region 302A. The resulting, singulated integrated circuit package 300 is from the package region 302A.

The integrated circuit package 300 may then be mounted to a package substrate 400 using the conductive connectors 320. The package substrate 400 includes a substrate core 402 and bond pads 404 over the substrate core 402. The substrate core 402 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate core 402 may be a SOI substrate. Generally, an SOI substrate includes a layer of a semiconductor material such as epitaxial silicon, germanium, silicon germanium, SOI, SGOI, or combinations thereof. The substrate core 402 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for substrate core 402.

The substrate core 402 may include active and passive devices (not shown). A wide variety of devices such as transistors, capacitors, resistors, combinations of these, and the like may be used to generate the structural and functional requirements of the design for the device stack. The devices may be formed using any suitable methods.

The substrate core 402 may also include metallization layers and vias (not shown), with the bond pads 404 being physically and/or electrically coupled to the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate core 402 is substantially free of active and passive devices.

In some embodiments, the conductive connectors 320 are reflowed to attach the external connectors 314 to the bond pads 404. The conductive connectors 320 electrically and/or physically couple the package substrate 400, including metallization layers in the substrate core 402, to the integrated circuit package 300. In some embodiments, a solder resist is formed on the substrate core 402. The conductive connectors 320 may be disposed in openings in the solder resist to be electrically and mechanically coupled to the bond pads 404. The solder resist may be used to protect areas of the substrate core 402 from external damage.

In some embodiments, an underfill 406 may be formed between the integrated circuit package 300 and the package substrate 400 and surrounding the conductive connectors 320, to reduce stress and protect the joints resulting from the reflowing of the conductive connectors 320. The underfill 406 may be formed by a capillary flow process after the integrated circuit package 300 is attached or may be formed by a suitable deposition method before the integrated circuit package 300 is attached. The conductive connectors 320 may have an epoxy flux (not shown) formed thereon before they are reflowed with at least some of the epoxy portion of the epoxy flux remaining after the integrated circuit package 300 is attached to the package substrate 400. This remaining epoxy portion may act as the underfill 406.

In some embodiments, passive devices (e.g., surface mount devices (SMDs), not shown) may also be attached to the integrated circuit package 300 (e.g., to the external connectors 314) or to the package substrate 400 (e.g., to the bond pads 404). For example, the passive devices may be bonded to a same surface of the integrated circuit package 300 or the package substrate 400 as the conductive connectors 320. The passive devices may be attached to the integrated circuit package 300 prior to mounting the integrated circuit package 300 on the package substrate 400, or may be attached to the package substrate 400 before or after mounting the integrated circuit package 300 on the package substrate 400.

Figure 15A:
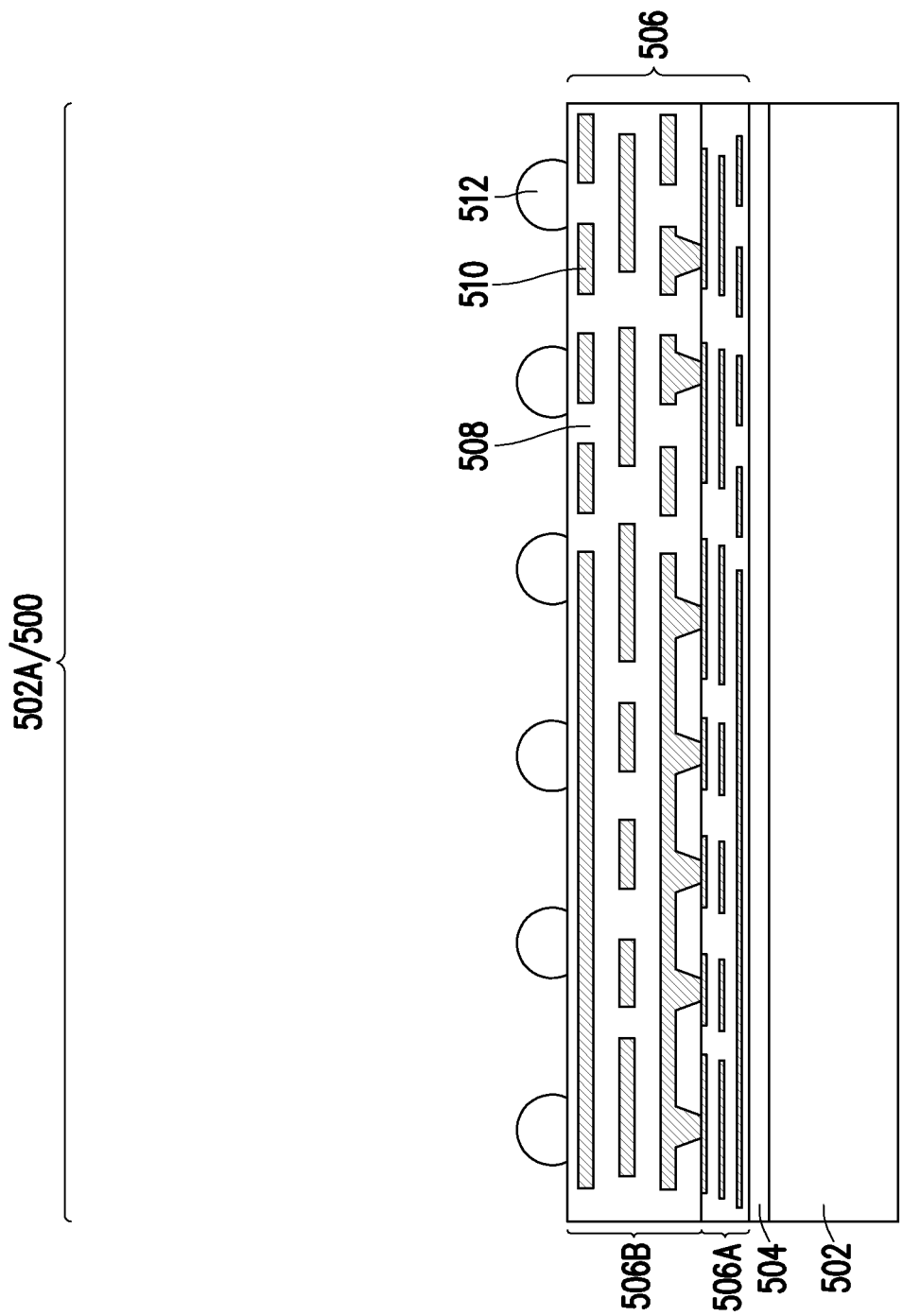
FIGS. 15A through 15C are cross-sectional views of intermediate steps during a process for forming integrated circuit packages, in accordance with some other embodiments.
Figure 15B:
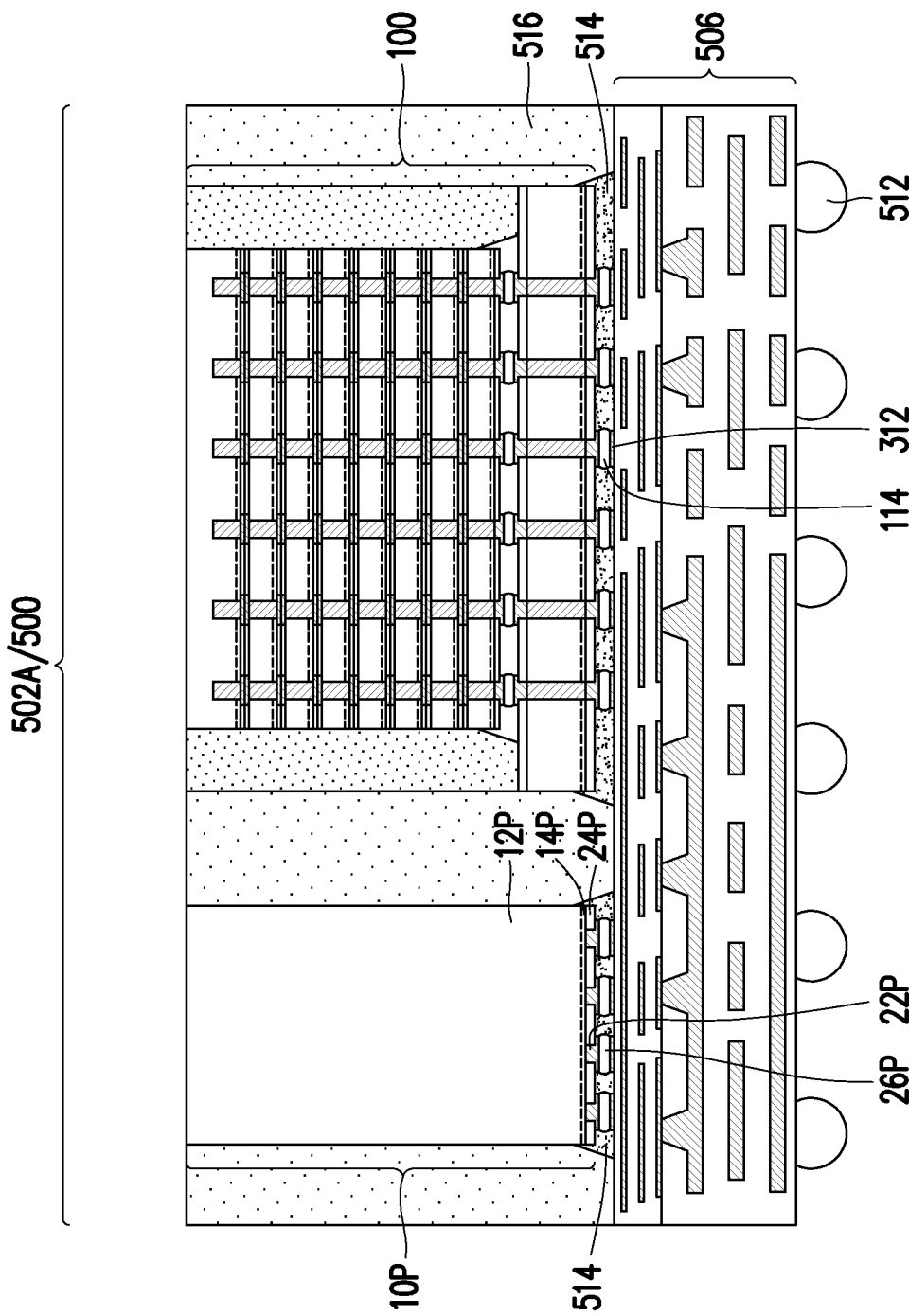
Figure 15C:
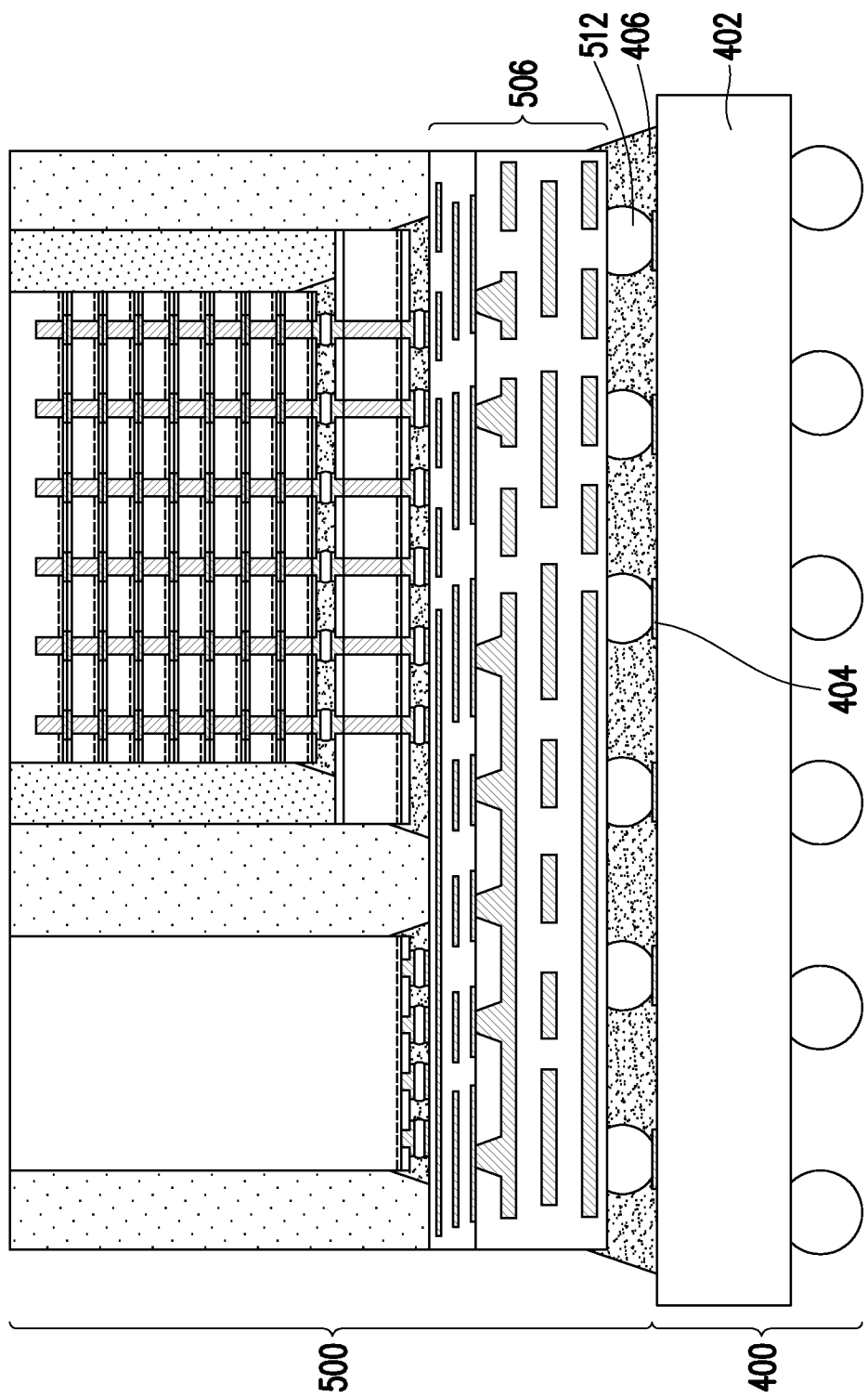

FIGS. 15A through 15C are cross-sectional views of intermediate steps during a process for forming integrated circuit packages, in accordance with some embodiments. As will be discussed in greater detail below, FIGS. 15A through 15C illustrate a process in which a HBM device 100 is packaged in an integrated circuit package 500 (see FIG. 15B). The integrated circuit package 500 is then mounted to a package substrate 400 (see FIG. 15C) to form another package. The integrated circuit package 500 is formed on a carrier substrate 502 (see FIG. 15A). Formation of an integrated circuit package 500 in one package region 502A of the carrier substrate 502 is illustrated, but it should be appreciated that the carrier substrate 502 may have any number of package regions, and an integrated circuit package may be formed in each package region.

In FIG. 15A, a carrier substrate 502 is provided, and a release layer 504 is formed on the carrier substrate 502. The carrier substrate 502 may be similar to the carrier substrate 52 described with respect to FIG. 2A. The release layer 504 may be similar to the release layer 54 described with respect to FIG. 2A.

A redistribution structure 506 is formed on the release layer 504. The redistribution structure 506 includes dielectric layers 508 and metallization patterns 510 (sometimes referred to as redistribution layers or redistribution lines) among the dielectric layers 508. For example, the redistribution structure 506 may include a plurality of metallization patterns 510 separated from each other by respective dielectric layers 508.

In some embodiments, the dielectric layers 508 are formed of a polymer, which may be a photo-sensitive material such as PBO, polyimide, a BCB-based polymer, or the like, and which may be patterned using a lithography mask. In other embodiments, the dielectric layers 508 are formed of a nitride such as silicon nitride; an oxide such as silicon oxide, PSG, BSG, BPSG; or the like. The dielectric layers 508 may be formed by spin coating, lamination, CVD, the like, or a combination thereof. After each dielectric layer 508 is formed, it is then patterned to expose underlying conductive features, such as portions of the underlying metallization patterns 510. The patterning may be by an acceptable process, such as by exposing the dielectrics layers to light when the dielectric layers 508 are a photo-sensitive material, or by etching using, for example, an anisotropic etch. If the dielectric layers 508 are photo-sensitive materials, the dielectric layers 508 can be developed after the exposure.

The metallization patterns 510 each include conductive vias and/or conductive lines. The conductive vias extend through the dielectric layers 508, and the conductive lines extend along the dielectric layers 508. As an example to form a metallization pattern, a seed layer (not illustrated) is formed over the underlying conductive features. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using a deposition process, such as PVD or the like. A photoresist is then formed and patterned on the seed layer. The photoresist may be formed by spin coating or the like and may be exposed to light for patterning. The pattern of the photoresist corresponds to the metallization pattern. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal or a metal alloy, such as copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern for one level of the redistribution structure 506.

More or fewer dielectric layers 508 and metallization patterns 510 than illustrated may be formed in the redistribution structure 506. In some embodiments, the redistribution structure 506 is a wafer-level redistribution structure that includes a first portion 506A and a second portion 506B, with the first portion 506A including thin dielectric layers 508 and thin metallization patterns 510, and the second portion 506B including thick dielectric layers 508 and thick metallization patterns 510.

Conductive connectors 512 are formed connected to the metallization patterns 510 of the redistribution structure 506. The top dielectric layer 508 of the redistribution structure 506 may be patterned to expose portions of the underlying metallization patterns 510. In some embodiments, under bump metallurgies (UBMs) may be formed in the openings. The conductive connectors 512 are formed on the UBMs. The conductive connectors 512 may be formed of a similar material and by a similar method as the conductive connectors 114 described with respect to FIG. 3D.

In FIG. 15B, a carrier substrate debonding is performed to detach (debond) the carrier substrate 502 from the redistribution structure 506, e.g., the bottom dielectric layer 508. In accordance with some embodiments, the debonding includes projecting a light such as a laser light or an UV light on the release layer 504 so that the release layer 504 decomposes under the heat of the light and the carrier substrate 502 can be removed. The structure can then be flipped over and placed on, e.g., a tape.

A HBM device 100 and a processor device 10P are the attached to the redistribution structure 506. The processor device 10P can be a processing unit, such as a CPU, a GPU, a SoC, or the like. The processor device 10P may be similar to that described with respect to FIG. 14A.

In the embodiment shown, the HBM device 100 is attached to the redistribution structure 506 using the conductive connectors 114, and the processor device 10P is attached to the redistribution structure 506 using the conductive connectors 26P. For example, UBMs can be formed extending through the bottom dielectric layer 508 of the redistribution structure 506 to be connected to the metallization patterns 510 of the redistribution structure 506. The conductive connectors 26P, 114 can be contacted to the UBMs and reflowed to attach the HBM device 100 and the processor device 10P to the redistribution structure 506.

In some embodiments, an underfill 514 is formed between the redistribution structure 506 and each of the HBM device 100 and the processor device 10P, surrounding the conductive connectors 26P and the conductive connectors 114. The underfill 514 may be formed of a similar material and by a similar method as the underfill 110 described with respect to FIG. 3C.

An encapsulant 516 is then formed on and around the various components. After formation, the encapsulant 516 encapsulates the HBM device 100 and the processor device 10P, and contacts the underfill 514. The encapsulant 516 may be formed of a similar material and by a similar method as the encapsulant 112 described with respect to FIG. 3D. A planarization process is optionally performed on the encapsulant 516 to expose the HBM device 100 and the processor device 10P.

In FIG. 15C, a singulation process is performed by sawing along scribe line regions, e.g., between the package region 502A and adjacent package regions. The sawing singulates the package region 502A. The resulting, singulated integrated circuit package 500 is from the package region 502A. After singulation, the redistribution structure 506 and the encapsulant 516 are laterally coterminous (within process variations).

The integrated circuit package 500 is then attached to a package substrate 400 using the conductive connectors 512. The package substrate 400 may be similar to that described with respect to FIG. 14B. For example, the package substrate 400 can include bond pads 404, which are connected to the conductive connectors 512. In some embodiments, an underfill 406 may be formed between the integrated circuit package 500 and the package substrate 400 and surrounding the conductive connectors 512.

FIGS. 16A through 16F are cross-sectional views of intermediate steps during a process for forming integrated circuit packages, in accordance with some embodiments. As will be discussed in greater detail below, FIGS. 16A through 16F illustrate a process in which a HBM device 100 is packaged in an integrated circuit package 600 (see FIG. 16E). The integrated circuit package 500 is then mounted to a package substrate 400 (see FIG. 16F) to form another package. The integrated circuit package 600 is formed on a carrier substrate 602 (see FIG. 16A). Formation of an integrated circuit package 600 in one package region 602A of the carrier substrate 602 is illustrated, but it should be appreciated that the carrier substrate 602 may have any number of package regions, and an integrated circuit package may be formed in each package region.

Figure 16A:
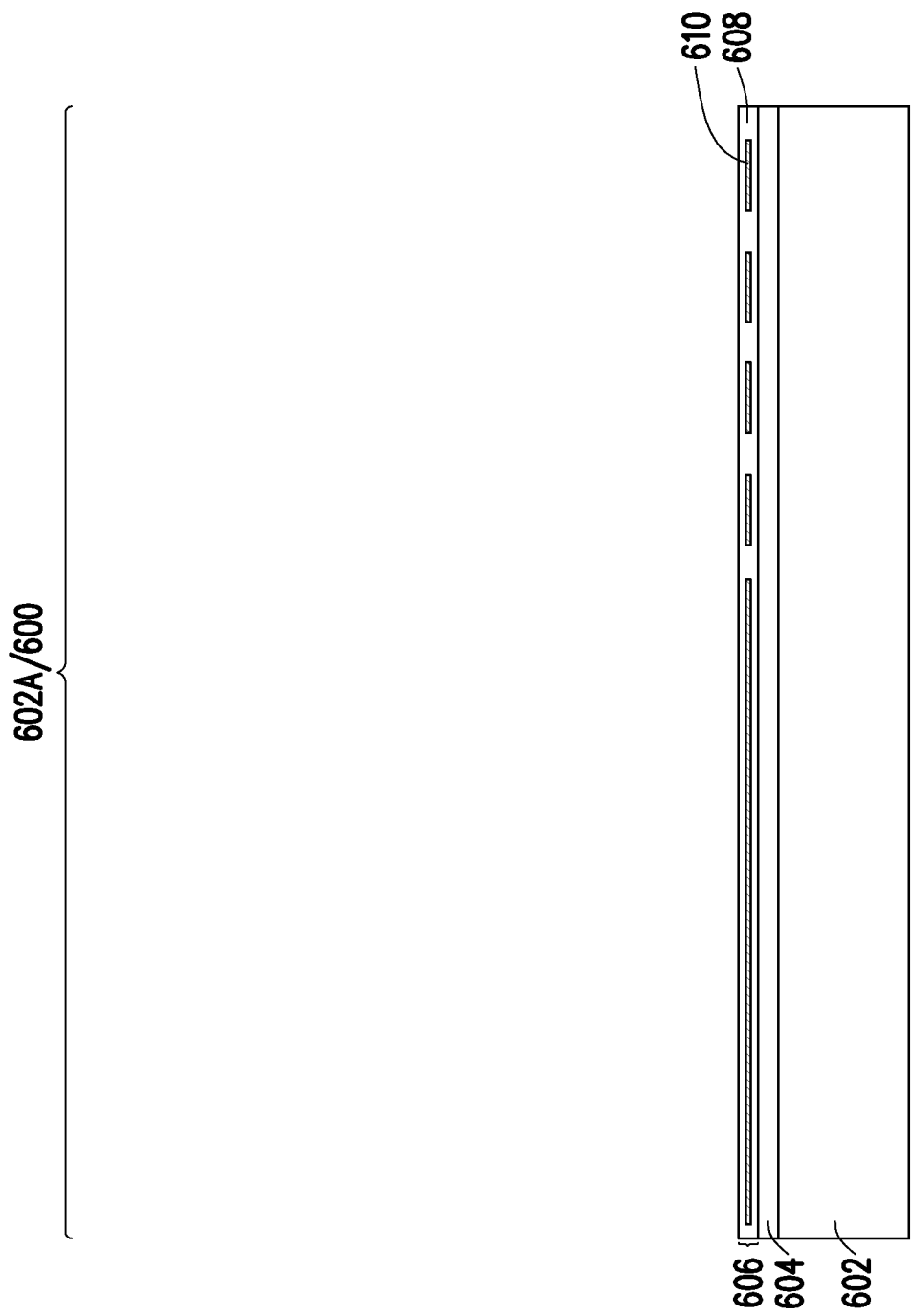
FIGS. 16A through 16F are cross-sectional views of intermediate steps during a process for forming integrated circuit packages, in accordance with some other embodiments.

In FIG. 16A, a carrier substrate 602 is provided, and a release layer 604 is formed on the carrier substrate 602. The carrier substrate 602 may be similar to the carrier substrate 52 described with respect to FIG. 2A. The release layer 604 may be similar to the release layer 54 described with respect to FIG. 2A.

A redistribution structure 606 is then formed on the release layer 604. The redistribution structure 606 can be formed in a similar manner and of similar materials as the redistribution structure 506 described with respect to FIG. 15A. The redistribution structure 606 includes dielectric layers 608 and metallization patterns 610 (sometimes referred to as redistribution layers or redistribution lines) among the dielectric layers 608.

Figure 16B:
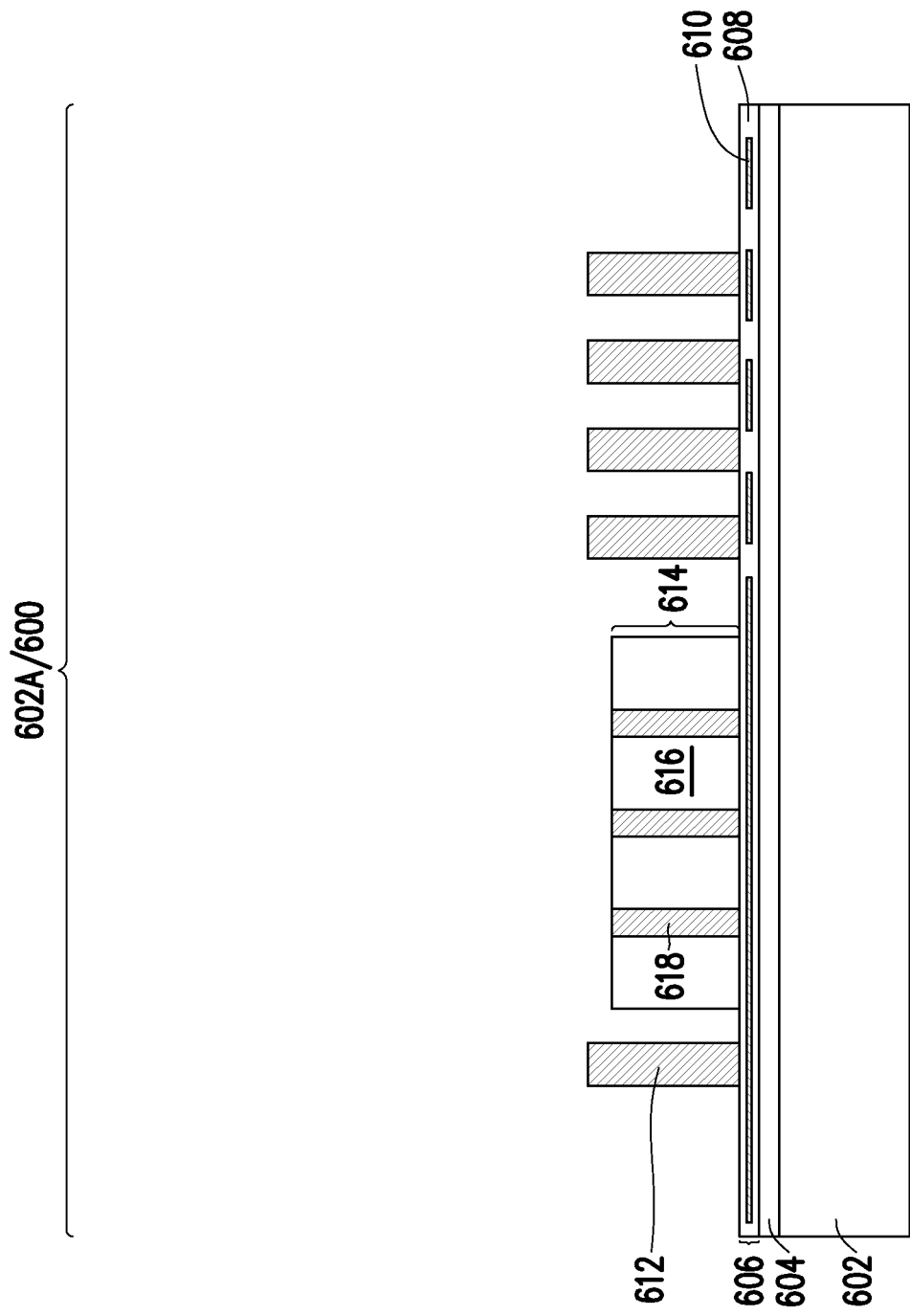

In FIG. 16B, conductive vias 612 are formed connected to the metallization patterns 610 of the redistribution structure 606. As an example to form the conductive vias 612, openings can be formed in the top dielectric layer 608 of the redistribution structure 606. A seed layer is then formed over the redistribution structure 606, e.g., on the top dielectric layer 608 and portions of the metallization pattern 610 exposed by the openings in the top dielectric layer 608. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive vias 612.

A bridge die 614 is then placed on the redistribution structure 506 (e.g., the top dielectric layer 508). The bridge die 614 can be an interposer, a TSV die, or the like. In some embodiments, the bridge die 614 includes a semiconductor substrate 616 and TSVs 618 extending through the semiconductor substrate 616. The semiconductor substrate 616 may be a bulk substrate, or may be a substrate comprising active and/or passive devices.

Figure 16C:
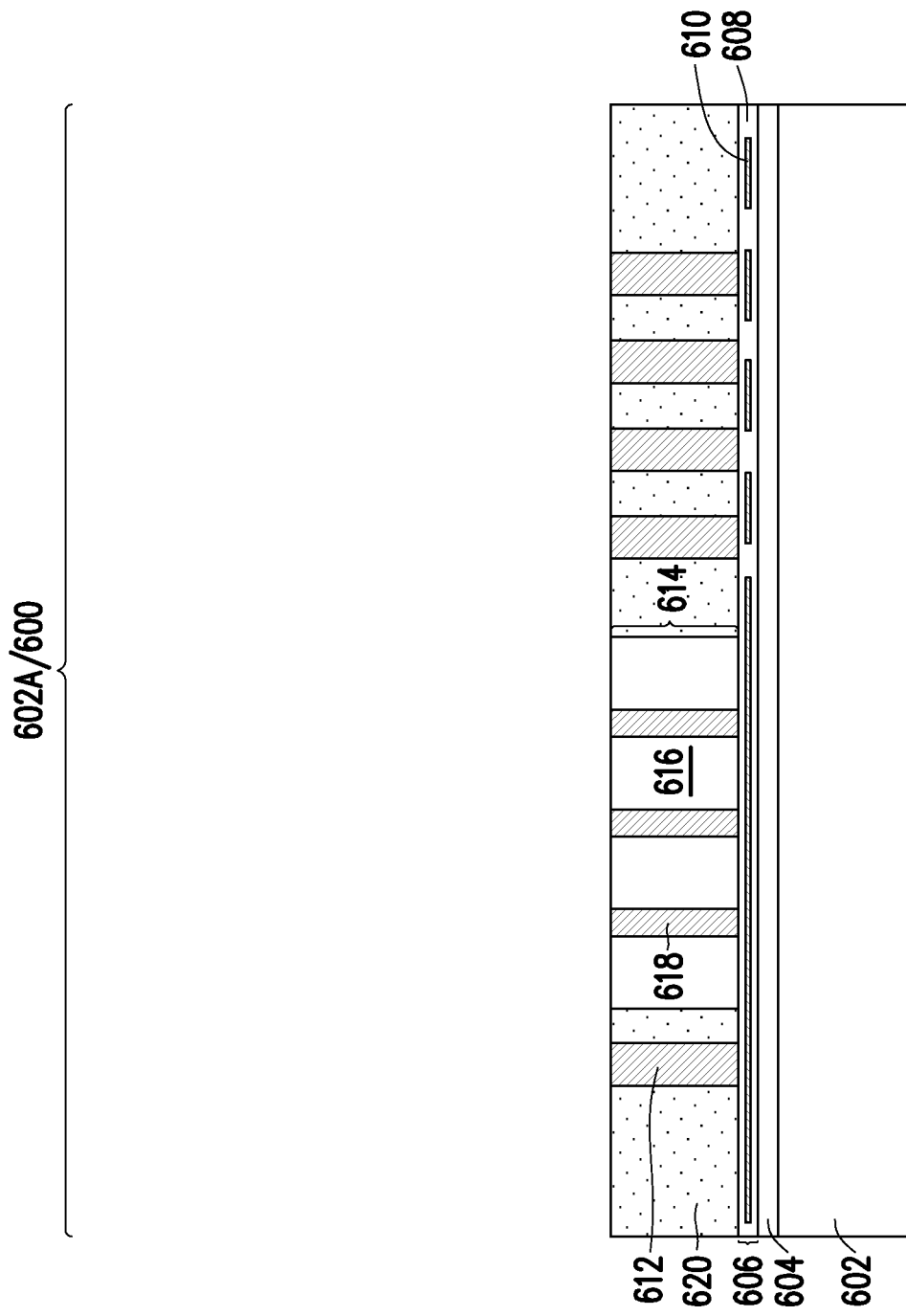

In FIG. 16C, an encapsulant 620 is formed on and around the conductive vias 612 and the bridge die 614. After formation, the encapsulant 620 encapsulates the conductive vias 612 and the bridge die 614. The encapsulant 620 may be a molding compound, epoxy, or the like. The encapsulant 620 may be applied by compression molding, transfer molding, or the like, and may be formed over the carrier substrate 602 such that the bridge die 614 and/or the conductive vias 612 are buried or covered. The encapsulant 620 may be applied in liquid or semi-liquid form and then subsequently cured. A planarization process can then be performed on the encapsulant 620 to expose the conductive vias 612 and the bridge die 614. The planarization process may remove material of the encapsulant 620 until the conductive vias 612 and the TSVs 618 are exposed. Top surfaces of the planarized components are coplanar (within process variations) after the planarization process. The planarization process may be, for example, a chemical-mechanical polish (CMP), a grinding process, an etch-back, or the like. In some embodiments, the planarization may be omitted, for example, if the conductive vias 612 and the TSVs 618 are already exposed.

Figure 16D:
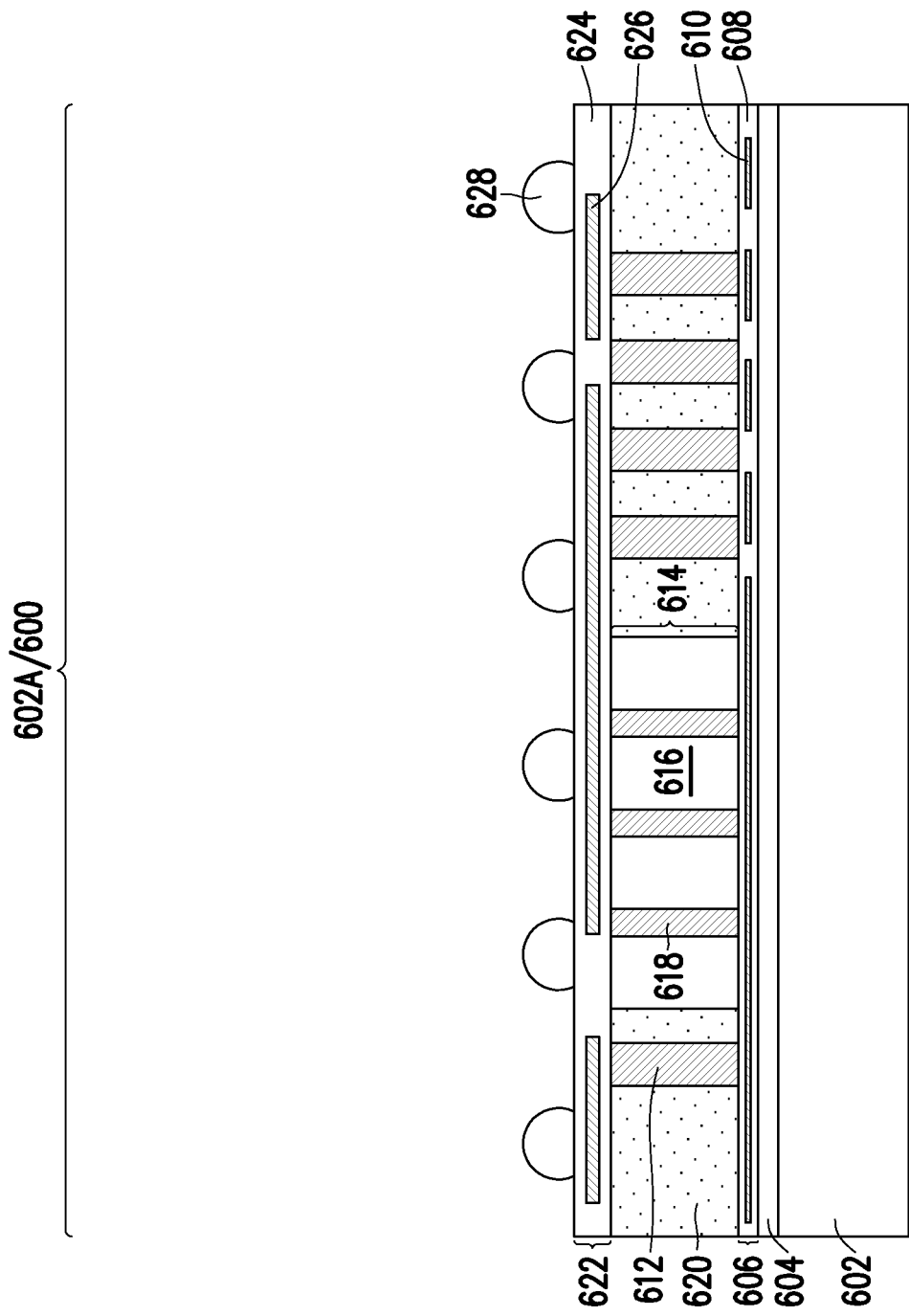

In FIG. 16D, a redistribution structure 622 is formed on the encapsulant 620, the bridge die 614, and the conductive vias 612. The redistribution structure 622 can be formed in a similar manner and of similar materials as the redistribution structure 506 described with respect to FIG. 15A. The redistribution structure 622 includes dielectric layers 624 and metallization patterns 626 (sometimes referred to as redistribution layers or redistribution lines) among the dielectric layers 624.

Conductive connectors 628 are formed connected to the metallization patterns 626 of the redistribution structure 622. The top dielectric layer 624 of the redistribution structure 622 may be patterned to expose portions of the underlying metallization patterns 626. In some embodiments, under bump metallurgies (UBMs) may be formed in the openings. The conductive connectors 628 are formed on the UBMs. The conductive connectors 628 can be formed in a similar manner and of similar materials as the conductive connectors 114 described with respect to FIG. 3D.

Figure 16E:
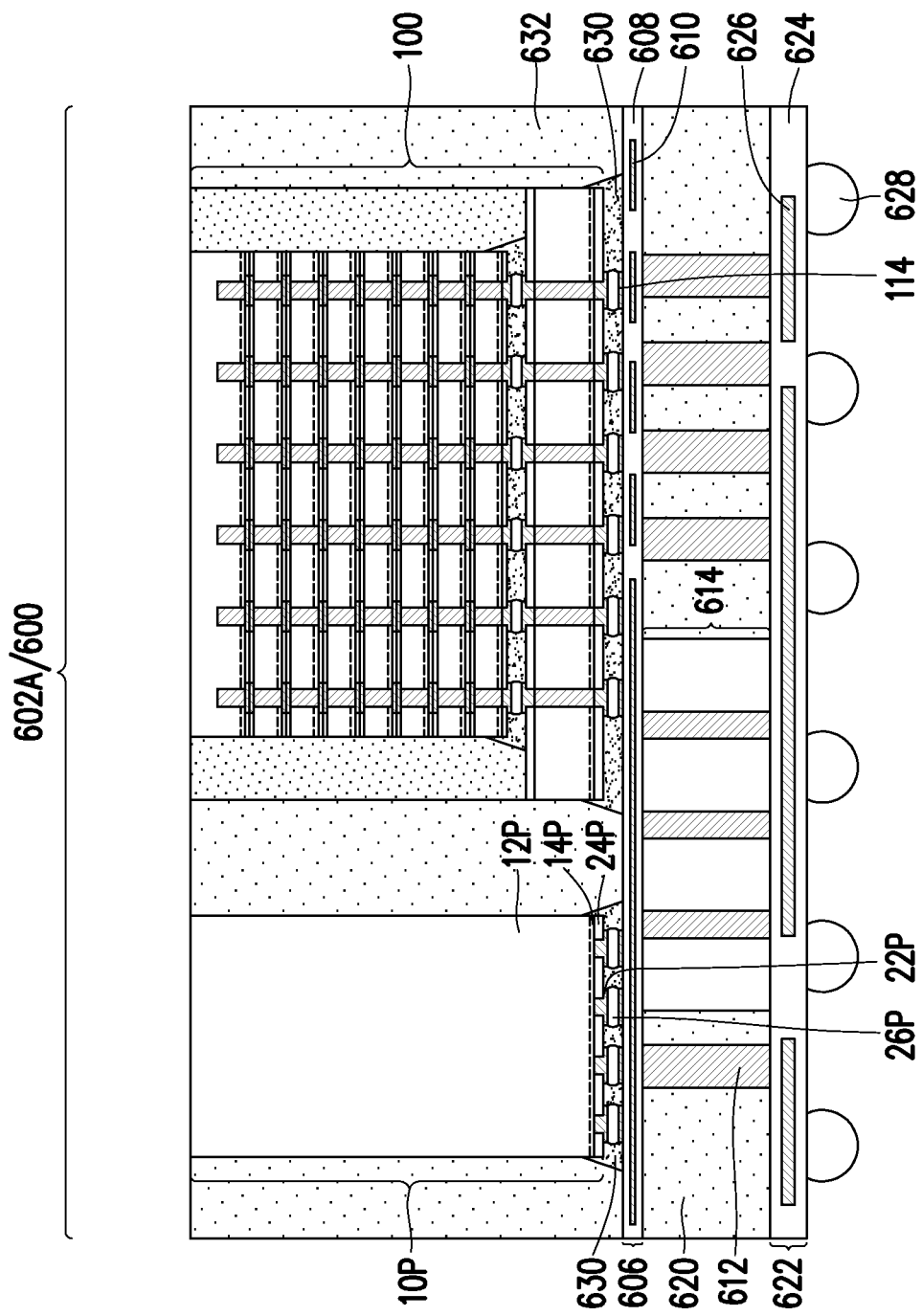

In FIG. 16E, a carrier substrate debonding is performed to detach (debond) the carrier substrate 602 from the redistribution structure 606, e.g., the bottom dielectric layer 608. In accordance with some embodiments, the debonding includes projecting a light such as a laser light or an UV light on the release layer 604 so that the release layer 604 decomposes under the heat of the light and the carrier substrate 602 can be removed. The structure can then be flipped over and placed on, e.g., a tape.

A HBM device 100 and a processor device 10P are then attached to the redistribution structure 606. The processor device 10P can be a processing unit, such as a CPU, a GPU, a SoC, or the like. The processor device 10P may be similar to that described with respect to FIG. 14A.

In the embodiment shown, the HBM device 100 is attached to the redistribution structure 606 using the conductive connectors 114, and the processor device 10P is attached to the redistribution structure 606 using the conductive connectors 26P. For example, UBMs can be formed extending through the bottom dielectric layer 608 of the redistribution structure 606 to be connected to the metallization patterns 610 of the redistribution structure 606. The conductive connectors 26P, 114 can be contacted to the UBMs and reflowed to attach the HBM device 100 and the processor device 10P to the redistribution structure 606.

In some embodiments, an underfill 630 is formed between the redistribution structure 606 and each of the HBM device 100 and the processor device 10P, surrounding the conductive connectors 26P and the conductive connectors 114. The underfill 630 may be formed of a similar material and by a similar method as the underfill 110 described with respect to FIG. 3C.

An encapsulant 632 is then formed on and around the various components. After formation, the encapsulant 632 encapsulates the HBM device 100 and the processor device 10P, and contacts the underfill 630. The encapsulant 632 may be formed of a similar material and by a similar method as the encapsulant 112 described with respect to FIG. 3D. A planarization process is optionally performed on the encapsulant 632 to expose the HBM device 100 and the processor device 10P.

Figure 16F:
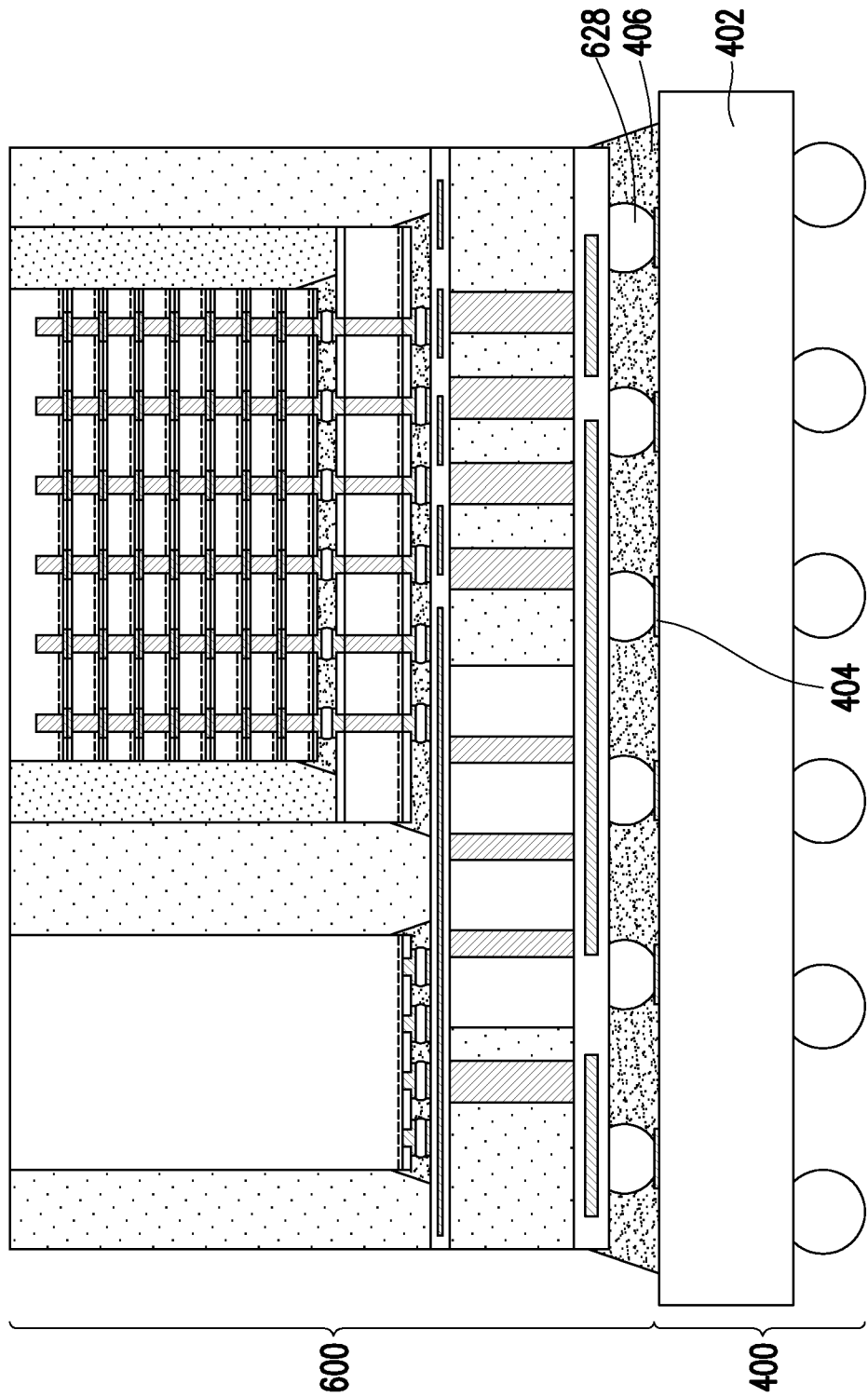

In FIG. 16F, a singulation process is performed by sawing along scribe line regions, e.g., between the package region 602A and adjacent package regions. The sawing singulates the package region 602A. The resulting, singulated integrated circuit package 600 is from the package region 602A. After singulation, the redistribution structure 606, the encapsulant 620, the redistribution structure 622, and the encapsulant 632 (see FIG. 16E) are laterally coterminous (within process variations).

The integrated circuit package 600 is then attached to a package substrate 400 using the conductive connectors 628. The package substrate 400 may be similar to that described with respect to FIG. 14B. For example, the package substrate 400 can include bond pads 404, which are connected to the conductive connectors 628. In some embodiments, an underfill 406 may be formed between the integrated circuit package 600 and the package substrate 400 and surrounding the conductive connectors 628.

Embodiments may achieve advantages. Forming the memory cubes by stacking memory devices with hybrid bonding allows the electrical and thermal performance of the memory cube to be improved over bonding the memory devices by other means, e.g., solder bonds. Testing the memory cubes after formation allows the processing of bad memory cubes to be avoided, reducing manufacturing costs. Further, forming die connectors, such as conductive bumps, in the top memory device of the memory cube allows the memory cube to be attached to a logic device in a lower cost manner with reflowable connectors.

In an embodiment, a method includes: bonding a back side of a first memory device to a front side of a second memory device with dielectric-to-dielectric bonds and with metal-to-metal bonds; after the bonding, forming first conductive bumps through a first dielectric layer at a front side of the first memory device, the first conductive bumps raised from a major surface of the first dielectric layer; testing the first memory device and the second memory device using the first conductive bumps; and after the testing, attaching a logic device to the first conductive bumps with reflowable connectors.

In some embodiments of the method, the bonding the back side of the first memory device to the front side of the second memory device includes bonding a back side of a first wafer to a front side of a second wafer with dielectric-to-dielectric bonds and with metal-to-metal bonds, the first wafer including the first memory device, the second wafer including the second memory device, the method further including: after the bonding, singulating the first memory device and the second memory device. In some embodiments of the method, the bonding the back side of the first memory device to the front side of the second memory device includes bonding a back side of a first integrated circuit die to a front side of a second integrated circuit die with dielectric-to-dielectric bonds and with metal-to-metal bonds, the method further including: after the bonding, forming a second dielectric layer around the first integrated circuit die and the second integrated circuit die. In some embodiments of the method, the bonding the back side of the first memory device to the front side of the second memory device includes: pressing the second memory device against the first memory device; and annealing the first memory device and the second memory device. In some embodiments, the method further includes: bonding a front side of a passive device to a back side of the second memory device with dielectric-to-dielectric bonds and with metal-to-metal bonds; forming a second dielectric layer around the passive device; forming conductive vias extending through the second dielectric layer; and bonding a front side of a third memory device to the conductive vias and a back side of the passive device with metal-to-metal bonds, and to the second dielectric layer and the back side of the passive device with dielectric-to-dielectric bonds. In some embodiments of the method, the attaching the logic device to the first conductive bumps with the reflowable connectors includes: obtaining a wafer including the logic device and second conductive bumps, the second conductive bumps disposed at a back side of the wafer; and soldering the first conductive bumps to the second conductive bumps with the reflowable connectors. In some embodiments of the method, the attaching the logic device to the first conductive bumps with the reflowable connectors includes: forming a package component including the logic device, an encapsulant, and second conductive bumps, the encapsulant surrounding the logic device, the second conductive bumps connected to the logic device; and soldering the first conductive bumps to the second conductive bumps with the reflowable connectors. In some embodiments of the method, the attaching the logic device to the first conductive bumps with the reflowable connectors includes: obtaining an integrated circuit die, the integrated circuit die including second conductive bumps at a back side of the integrated circuit die; and soldering the first conductive bumps to the second conductive bumps with the reflowable connectors. In some embodiments of the method, the logic device is an interface device for the first memory device and the second memory device, the method further including: attaching the interface device and a processor device to an interposer; and attaching the interposer to a carrier substrate. In some embodiments of the method, the logic device is an interface device for the first memory device and the second memory device, the method further including: attaching the interface device and a processor device to a wafer-level redistribution structure; and attaching the wafer-level redistribution structure to a carrier substrate. In some embodiments of the method, the logic device is an interface device for the first memory device and the second memory device, the method further including: forming a first redistribution structure; forming a conductive via extending from the first redistribution structure; placing a bridge die adjacent the conductive via; encapsulating the bridge die and the conductive via with an encapsulant; forming a second redistribution structure on the encapsulant, the bridge die, and the conductive via; attaching the interface device and a processor device to the first redistribution structure; and attaching the second redistribution structure to a carrier substrate.

In an embodiment, a method includes: stacking a plurality of memory devices over a carrier substrate; removing the carrier substrate to reveal a major surface of a dielectric layer at a front side of an upper memory device of the memory devices; after the removing, forming conductive bumps through the dielectric layer, the conductive bumps raised from the major surface of the dielectric layer; testing each of the memory devices using the conductive bumps; and after the testing, attaching a logic device to the conductive bumps with reflowable connectors.

In an embodiment, a structure includes: a first memory cube including a plurality of first memory devices back-to-face bonded with dielectric-to-dielectric bonds and with metal-to-metal bonds, a top memory device of the first memory cube including first conductive bumps at a front side of the top memory device, each respective lower memory device of the first memory cube including bond pads at a front side of the respective lower memory device; a logic device including second conductive bumps; first reflowable connectors physically and electrically coupling the first conductive bumps to the second conductive bumps; and a first underfill between the logic device and the first memory cube, the first underfill surrounding each of the first reflowable connectors.

In some embodiments, the structure further includes: an encapsulant contacting the first underfill and each of the first memory devices. In some embodiments, the structure further includes: a dielectric layer surrounding each of the first memory devices; and an encapsulant contacting the first underfill and the dielectric layer. In some embodiments of the structure, the first memory cube further includes a passive device at an intermediate layer of the first memory cube. In some embodiments of the structure, a width of the logic device is greater than a width of the first memory cube. In some embodiments of the structure, a width of the logic device is less than a width of the first memory cube. In some embodiments of the structure, the logic device is part of a package component. In some embodiments, the structure further includes: a second memory cube including a plurality of second memory devices back-to-face bonded with dielectric-to-dielectric bonds and with metal-to-metal bonds; second reflowable connectors physically and electrically coupling the second memory cube to the first memory cube; and a second underfill between the first memory cube and the second memory cube, the second underfill surrounding each of the second reflowable connectors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
a first memory cube comprising a stack of first memory devices and a passive device, the first memory devices being directly bonded together with dielectric-to-dielectric bonds and with metal-to-metal bonds, a top memory device of the first memory cube comprising first conductive bumps at a front side of the top memory device, the passive device being disposed at an intermediate level of the first memory cube;
a logic device comprising second conductive bumps;
first reflowable connectors physically and electrically coupling the first conductive bumps to the second conductive bumps; and
a first underfill between the logic device and the first memory cube, the first underfill surrounding each of the first reflowable connectors.

2. The structure of claim 1, wherein a width of the logic device is greater than a width of the first memory cube.

3. The structure of claim 1, wherein a width of the logic device is less than a width of the first memory cube.

4. The structure of claim 1, further comprising:
a second memory cube comprising a stack of second memory devices, the second memory devices being directly bonded together with dielectric-to-dielectric bonds and with metal-to-metal bonds; and
second reflowable connectors physically and electrically coupling the second memory cube to the first memory cube; and
a second underfill between the first memory cube and the second memory cube, the second underfill surrounding each of the second reflowable connectors.

5. The structure of claim 4, further comprising:
an encapsulant around the first memory devices, the second memory devices, the first underfill, and the second underfill.

6. The structure of claim 1, further comprising:
a second memory cube comprising a stack of second memory devices, the second memory devices being directly bonded together with dielectric-to-dielectric bonds and with metal-to-metal bonds; and
second reflowable connectors physically and electrically coupling the second memory cube to the first memory cube.

7. A structure comprising:
an interposer;
a processor device attached to the interposer;
a memory device adjacent the processor device, the memory device comprising:
an interface die attached to the interposer, the interface die comprising first conductive bumps;
a first memory cube comprising a stack of first memory devices, the first memory devices being back-to-face bonded with dielectric-to-dielectric bonds and with metal-to-metal bonds, a top memory device of the first memory cube comprising second conductive bumps at a front side of the top memory device;
first reflowable connectors physically and electrically coupling the second conductive bumps to the first conductive bumps;
a second memory cube comprising a stack of second memory devices, the second memory devices being back-to-face bonded with dielectric-to-dielectric bonds and with metal-to-metal bonds; and
second reflowable connectors physically and electrically coupling the second memory cube to the first memory cube.

8. The structure of claim 7, further comprising:
a package substrate attached to the interposer.

9. The structure of claim 7, wherein the memory device further comprises:
an encapsulant encapsulating the memory device and the processor device, a surface of the encapsulant being coplanar with a surface of the memory device.

10. The structure of claim 7, wherein the memory device further comprises:
a first underfill between the interface die and the first memory cube, the first underfill surrounding each of the first reflowable connectors.

11. The structure of claim 10, wherein the memory device further comprises:
an encapsulant contacting the first underfill and each of the first memory devices.

12. The structure of claim 10, wherein the memory device further comprises:
a dielectric layer surrounding each of the first memory devices; and
an encapsulant contacting the first underfill and the dielectric layer.

13. The structure of claim 7, wherein the memory device further comprises:
a second underfill between the first memory cube and the second memory cube, the second underfill surrounding each of the second reflowable connectors.

14. The structure of claim 7, wherein the first memory cube further comprises a passive device, the passive device having a lesser width than each of the first memory devices.

15. A structure comprising:
a first memory device comprising a first dielectric layer and a first bond pad;
a second memory device comprising a second dielectric layer, a second bond pad, and a first conductive bump, the second dielectric layer directly bonded to the first dielectric layer, the second bond pad directly bonded to the first bond pad;

a third memory device comprising a third dielectric layer and a third bond pad;

a passive device comprising a fourth dielectric layer and a fourth bond pad, the fourth dielectric layer directly bonded to the third dielectric layer, the fourth bond pad directly bonded to the third bond pad, a width of the passive device being less than a width of the third memory device;

a logic device comprising a second conductive bump, a width of the logic device being different than a width of each of the first memory device and the second memory device; and a first solder connector physically and electrically coupling the first conductive bump to the second conductive bump.

16. The structure of claim 15, wherein the first dielectric layer and the second dielectric layer each comprise silicon oxide bonded together by covalent bonds.

17. The structure of claim 15, wherein the second memory device further comprises a through-substrate via connecting the first conductive bump to the second bond pad.

18. The structure of claim 15, wherein the first dielectric layer and the first bond pad are disposed at a front side of the first memory device, and the second dielectric layer and the second bond pad are disposed at a back side of the second memory device.

19. The structure of claim 15, further comprising:
a first underfill between the logic device and the second memory device, the first underfill surrounding the first solder connector.

20. The structure of claim 15, further comprising:
an interposer; and
a second solder connector coupling the interposer to the logic device.

* * * * *